United States Patent
Johnsen et al.

(10) Patent No.: US 11,824,749 B2
(45) Date of Patent: *Nov. 21, 2023

(54) SYSTEM AND METHOD FOR ALLOWING MULTIPLE GLOBAL IDENTIFIER (GID) SUBNET PREFIX VALUES CONCURRENTLY FOR INCOMING PACKET PROCESSING IN A HIGH PERFORMANCE COMPUTING ENVIRONMENT

(71) Applicant: Oracle International Corporation, Redwood Shores, CA (US)

(72) Inventors: Bjørn Dag Johnsen, Oslo (NO); Arvind Srinivasan, San Jose, CA (US); Brian Manula, Oslo (NO)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 44 days.

This patent is subject to a terminal disclaimer.

(21) Appl. No.: 17/520,273

(22) Filed: Nov. 5, 2021

(65) Prior Publication Data
US 2022/0060401 A1 Feb. 24, 2022

Related U.S. Application Data

(63) Continuation of application No. 16/778,674, filed on Jan. 31, 2020, now Pat. No. 11,190,429, which is a (Continued)

(51) Int. Cl.
*H04L 43/0876* (2022.01)
*G06F 9/451* (2018.01)
(Continued)

(52) U.S. Cl.
CPC .......... *H04L 43/0876* (2013.01); *G06F 9/451* (2018.02); *G06F 11/3006* (2013.01);
(Continued)

(58) Field of Classification Search
CPC .......... H04L 43/0876; H04L 45/74591; H04L 47/20; H04L 47/70; H04L 49/25;
(Continued)

(56) References Cited

U.S. PATENT DOCUMENTS

| | | | |
|---|---|---|---|
| 6,766,467 | B1 | 7/2004 | Neal et al. |
| 6,922,749 | B1 | 7/2005 | Gil et al. |

(Continued)

FOREIGN PATENT DOCUMENTS

| | | |
|---|---|---|
| CN | 1849783 | 10/2006 |
| CN | 104836755 | 8/2015 |

(Continued)

OTHER PUBLICATIONS

Subedi, Kul Prasad, Dipankar Dasgupta, and Bo Chen. "Security analysis on InfiniBand protocol implementations." 2016 IEEE Symposium Series on Computational Intelligence (SSCI). IEEE, 2016. (Year: 2016).*

(Continued)

*Primary Examiner* — Sharad Rampuria
(74) *Attorney, Agent, or Firm* — TUCKER ELLIS LLP

(57) ABSTRACT

System and method for using multiple global identification subnet prefix values in a network switch environment in a high performance computing environment. A packet is received from a network fabric by a first Host Channel Adapter (HCA). The packet has a header portion including a destination subnet prefix identifying a destination subnet of the network fabric. The network HCA is allowed to receive the first packet from a port of the network HCA by selectively determining a logical state of a flag and, selectively in accordance with a predetermined logical state of the flag, ignoring the destination subnet prefix identifying the destination subnet of the network fabric.

20 Claims, 19 Drawing Sheets

Related U.S. Application Data continuation of application No. 16/259,901, filed on Jan. 28, 2019, now Pat. No. 10,581,713, which is a continuation of application No. 15/416,696, filed on Jan. 26, 2017, now Pat. No. 10,205,646.

(60) Provisional application No. 62/288,101, filed on Jan. 28, 2016.

(51) Int. Cl.

| | | |
|---|---|---|
| *H04L 45/745* | (2022.01) | |
| *G06F 11/30* | (2006.01) | |
| *G11C 15/00* | (2006.01) | |
| *H04L 47/20* | (2022.01) | |
| *H04L 67/1097* | (2022.01) | |
| *H04L 49/25* | (2022.01) | |
| *H04L 49/356* | (2022.01) | |
| *H04L 69/22* | (2022.01) | |
| *H04L 47/70* | (2022.01) | |

(52) U.S. Cl.
CPC ........ *G11C 15/00* (2013.01); *H04L 45/74591* (2022.05); *H04L 47/20* (2013.01); *H04L 47/70* (2013.01); *H04L 49/25* (2013.01); *H04L 49/358* (2013.01); *H04L 67/1097* (2013.01); *H04L 69/22* (2013.01); *G06F 2201/88* (2013.01)

(58) Field of Classification Search
CPC ... H04L 49/358; H04L 67/1097; H04L 69/22; G06F 9/451; G06F 11/3006; G06F 2201/88; G11C 15/00
See application file for complete search history.

(56) References Cited

U.S. PATENT DOCUMENTS

| | | | |
|---|---|---|---|
| 6,954,459 B1 | 10/2005 | Vaidhyanathan et al. | |
| 7,010,607 B1* | 3/2006 | Bunton | H04L 1/18 709/228 |
| 7,103,626 B1 | 9/2006 | Recio et al. | |
| 7,149,221 B2 | 12/2006 | Gil | |
| 7,400,590 B1 | 7/2008 | Rygh et al. | |
| 7,639,616 B1 | 12/2009 | Manula et al. | |
| 8,949,389 B1 | 2/2015 | Rimmer | |
| 9,069,633 B2 | 6/2015 | Manula | |
| 9,219,718 B2 | 12/2015 | Johnsen | |
| 9,237,111 B2 | 1/2016 | Banavalikar | |
| 9,438,479 B1 | 9/2016 | Friedman et al. | |
| 9,548,960 B2 | 1/2017 | Haramaty | |
| 9,614,746 B2 | 4/2017 | Johnsen et al. | |
| 9,807,003 B2 | 10/2017 | Zahid | |
| 9,888,010 B2 | 2/2018 | Makhervaks et al. | |
| 10,581,713 B2 | 3/2020 | Johnsen | |
| 11,190,429 B2* | 11/2021 | Johnsen | G11C 15/00 |
| 2002/0156918 A1 | 10/2002 | Valdevit | |
| 2003/0033426 A1 | 2/2003 | Beukema et al. | |
| 2003/0223435 A1 | 12/2003 | Gil | |
| 2004/0019876 A1 | 1/2004 | Dravida et al. | |
| 2004/0022245 A1 | 2/2004 | Forbes | |
| 2004/0024903 A1 | 2/2004 | Costatino | |
| 2004/0030763 A1 | 2/2004 | Manter et al. | |
| 2004/0100950 A1 | 5/2004 | Basu | |
| 2006/0002385 A1 | 1/2006 | Johnsen | |
| 2006/0268869 A1 | 11/2006 | Boers et al. | |
| 2009/0031017 A1 | 1/2009 | Elko | |
| 2009/0141728 A1 | 6/2009 | Brown | |
| 2010/0287548 A1 | 11/2010 | Zhou et al. | |
| 2011/0292830 A1 | 12/2011 | Yanggratoke | |
| 2012/0106354 A1 | 5/2012 | Pleshek et al. | |
| 2012/0170582 A1 | 7/2012 | Abts | |
| 2012/0287933 A1 | 11/2012 | Li et al. | |
| 2012/0314706 A1 | 12/2012 | Liss et al. | |
| 2013/0054947 A1 | 2/2013 | Gavrilov | |
| 2013/0086298 A1 | 4/2013 | Alanis | |
| 2013/0254321 A1 | 9/2013 | Johnsen et al. | |
| 2013/0254424 A1 | 9/2013 | Guay et al. | |
| 2013/0259033 A1 | 10/2013 | Hefty | |
| 2013/0301645 A1 | 11/2013 | Bogdanski et al. | |
| 2013/0301646 A1 | 11/2013 | Bogdanski et al. | |
| 2014/0177639 A1 | 6/2014 | Vershkov | |
| 2014/0181823 A1 | 6/2014 | Manula et al. | |
| 2014/0241208 A1 | 8/2014 | Johnsen | |
| 2014/0269274 A1 | 9/2014 | Banavalikar | |
| 2014/0269720 A1 | 9/2014 | Srinivasan | |
| 2015/0098466 A1* | 4/2015 | Haramaty | H04L 12/18 370/392 |
| 2015/0113132 A1 | 4/2015 | Srinivas | |
| 2015/0295758 A1 | 10/2015 | Melander | |
| 2016/0036733 A1 | 2/2016 | Srinivasan | |
| 2016/0072816 A1* | 3/2016 | Makhervaks | H04L 63/101 726/13 |
| 2016/0127236 A1 | 5/2016 | Zahid | |
| 2016/0179582 A1 | 6/2016 | Skerry | |
| 2016/0246631 A1* | 8/2016 | Tsirkin | G06F 9/45558 |
| 2016/0337272 A1 | 11/2016 | Berman | |
| 2017/0099195 A1 | 4/2017 | Raney | |
| 2017/0289016 A1 | 10/2017 | Ficet | |

FOREIGN PATENT DOCUMENTS

| | | |
|---|---|---|
| JP | 2015514271 | 5/2015 |
| JP | 2015515683 | 5/2015 |
| JP | 2015517762 | 6/2015 |
| JP | 2016119654 | 6/2016 |
| JP | 2017525279 | 8/2017 |
| KR | 20150009550 | 1/2015 |
| WO | 2015017145 | 2/2015 |
| WO | 2016007760 | 1/2016 |

OTHER PUBLICATIONS

Japanese Patent Office, Notice of Reasons for Refusal dated Oct. 28, 2022 for Japanese Patent Application No. 2021-164659 , 4 pages.
Japanese Patent Office, Notice of Reasons for Refusal dated Oct. 3, 2022 for Japanese Patent Application No. 2021-131306 , 12 pages.
Bogdanski, et al., "Making the Network Scalable: Inter-subnet Routing in InfiniBand", Aug. 26, 2013, pp. 685-698, 14 pages.
Unkown, "Local Area Network (LAN) Emulation over InfiniBand", ip.com Journal, ip.com Inc., West Henrietta, NY, US, Sep. 18, 2003 (Sep. 18, 2003), XP013012867, ISSN: 1533-0001, 2 pages.
United States Patent and Trademark Office, Office Communication dated Jan. 10, 2022 for U.S. Appl. No. 16/802,233 , 24 pages.
China National Intellectual Property Administration, Board Opinion dated Dec. 24, 2021 for Chinese Patent Application No. 201780002937.4 , 8 pages.
Japanese Patent Office, Decision to Grant a Patent dated Jan. 30, 2023 for Japanese Patent Application No. 2021-164659 , 5 pages.
United States Patent and Trademark Office, Notice of Allowance and Fee(s) Due dated Jun. 28, 2022 for U.S. Appl. No. 16/802,233 , 16 pages.
India Patent Office, Intellectual Property India, Hearing Notice in Reference of Application No. 201747046149 dated Aug. 29, 2023 for India Patent Application No. 201747046149, 2 pages.

\* cited by examiner

SYSTEM AND METHOD FOR ALLOWING MULTIPLE GLOBAL IDENTIFIER (GID) SUBNET PREFIX VALUES CONCURRENTLY FOR INCOMING PACKET PROCESSING IN A HIGH PERFORMANCE COMPUTING ENVIRONMENT

CLAIM OF PRIORITY AND CROSS REFERENCE TO RELATED APPLICATIONS

This application is a continuation of and claims priority to U.S. Patent Application entitled "SYSTEM AND METHOD FOR ALLOWING MULTIPLE GLOBAL IDENTIFIER (GID) SUBNET PREFIX VALUES CONCURRENTLY FOR INCOMING PACKET PROCESSING IN A HIGH PERFORMANCE COMPUTING ENVIRONMENT", application Ser. No. 16/778,674, filed on Jan. 13, 2020, now U.S. patent Ser. No. 11/190,429, issued Nov. 30, 2021, which application is a continuation of U.S. Patent Application entitled "SYSTEM AND METHOD FOR ALLOWING MULTIPLE GLOBAL IDENTIFIER (GID) SUBNET PREFIX VALUES CONCURRENTLY FOR INCOMING PACKET PROCESSING IN A HIGH PERFORMANCE COMPUTING ENVIRONMENT", application Ser. No. 16/259,901, filed on Jan. 28, 2019, now U.S. patent Ser. No. 10/581,713, issued Mar. 3, 2020, which application a continuation of U.S. Patent Application entitled "SYSTEM AND METHOD FOR ALLOWING MULTIPLE GLOBAL IDENTIFIER (GID) SUBNET PREFIX VALUES CONCURRENTLY FOR INCOMING PACKET PROCESSING IN A HIGH PERFORMANCE COMPUTING ENVIRONMENT", application Ser. No. 15/416,696, filed on Jan. 26, 2017, now U.S. patent Ser. No. 10/205,646, issued Feb. 12, 2019, which application claims the benefit of priority to U.S. Provisional Patent Application entitled "SYSTEM AND METHOD FOR USING SUBNET PREFIX VALUES IN GLOBAL ROUTE HEADERS FOR LINEAR FORWARDING TABLE LOOKUP IN A HIGH PERFORMANCE COMPUTING ENVIRONMENT", Application No. 62/288,101, filed on Jan. 28, 2016, each of which is incorporated by reference in its entirety.

This application is related to the following patent applications, each of which is hereby incorporated by reference in its entirety:

U.S. Patent Application entitled "SYSTEM AND METHOD FOR USING SUBNET PREFIX VALUES IN GLOBAL ROUTE HEADER (GRH) FOR LINEAR FORWARDING TABLE (LFT) LOOKUP IN A HIGH PERFORMANCE COMPUTING ENVIRONMENT", application Ser. No. 15/416,642, filed Jan. 26, 2017, now U.S. patent Ser. No. 10/230,607, issued Mar. 12, 2019; and U.S. Patent Application entitled "SYSTEM AND METHOD FOR USING Q_KEY VALUE ENFORCEMENT AS A FLEXIBLE WAY OF PROVIDING RESOURCE ACCESS CONTROL WITHIN A SINGLE PARTITION IN A HIGH PERFORMANCE COMPUTING ENVIRONMENT", application Ser. No. 15/416,709, filed Jan. 26, 2017, now U.S. patent Ser. No. 10/284,448, issued May 7, 2019.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD

The embodiments herein are generally related to computer systems, and are particularly related to providing network switch functionality in a network environment.

BACKGROUND

As larger cloud computing architectures are introduced, the performance and administrative bottlenecks associated with the traditional network and storage have become a significant problem. There has been an increased interest in using high performance lossless interconnects such as InfiniBand (IB) technology as the foundation for a cloud computing fabric.

The 48K unicast local identification (LID) value space in a single IB subnet represents a limitation for the size of the subnet in terms of number of end nodes. This limit is of particular importance when virtualized host channel adapters (HCAs) provide multiple virtual HCA instances where each such virtual HCA instance may be configured with an independent LID for each virtual port.

The IB standard specification defines router nodes in order to allow multiple subnets to be connected within the same IB fabric and support packet forwarding based on mapping of fabric wide 128 bit destination global identifier (DGID) address values to 16 bit destination LID (DLID) address values for each intermediate subnet as well as for the final target subnet.

However, mapping of 128 bit DGID values to 16 bit DLID values at IB wire speed requires complex content addressable memory (CAM) based lookup hardware that has limited scalability in terms of the number of individual DGIDs that can be uniquely looked up (i.e. within reasonable cost/complexity constraints for the hardware implementation). This implies that in order to scale to a large number of individual destinations, the mapping of 128 bit DGID values to 16 bit DLID values must be flexible and must be able to use a hierarchical scheme so that a large number of individual DGID addresses can be mapped via a single lookup entry.

However, while a hierarchical mapping structure represents scalability in terms of the total number of subnets and end nodes that can be represented, it also represents a severe limitation of the ability to route individual destinations independently in order to maintain load-balancing and QOS constraints for different flows and workloads throughout the multi-subnet fabric.

In addition, the InfiniBand (IB) specification requires that the HCAs are able to receive packets with global Route Headers (GRHs) where the subnet prefix of the Destination GID (DGID) of the incoming GRH is either a default prefix or a single prefix that has been assigned to the relevant HCA port by the local Subnet Manager (SM). While this allows flexibility in terms of allowing a subnet to migrate from using the default prefix to using an assigned prefix, it does not however resolve the issue of changing the assigned prefix value dynamically at run time. This situation also does not allow a global fabric implementation to use multiple subnet prefix values in order to control the routing for one or more end-nodes that each have one or more fixed Global Unique Identifier (GUID) values.

This is the general area that embodiments of the claimed invention are intended to address.

SUMMARY

Described herein are systems and methods that can support both dynamic updates of the subnet prefix as well as the use of multiple prefix values to represent multiple paths through the fabric as well as dynamic updates of such paths with minimum impact on existing data connections and existing data flows. Exemplary systems and methods provide for the ability of HCAs to selectively ignore subnet prefix values in Destination GIDs (DGIDs). The ability of HCAs to selectively ignore subnet prefix values in DGIDs supports dynamic update of the subnet prefix. The ability of HCAs to selectively ignore subnet prefix values in DGIDs also supports the use of multiple prefix values to represent multiple paths through the fabric as well as dynamic updates of such paths with minimum impact on existing data connections and existing data flows. The exemplary systems and methods may be applied in high performance computing environments that use intra- and inter-subnet address resolution, such as engineered systems for middleware and application execution or a middleware machine environment, using subnet prefix values in global route headers (GRHs) for linear forwarding table (LFT) lookup in high performance computing environments. The exemplary systems and methods may be applied in other high performance computing environments as well.

DETAILED DESCRIPTION

Figure 1:
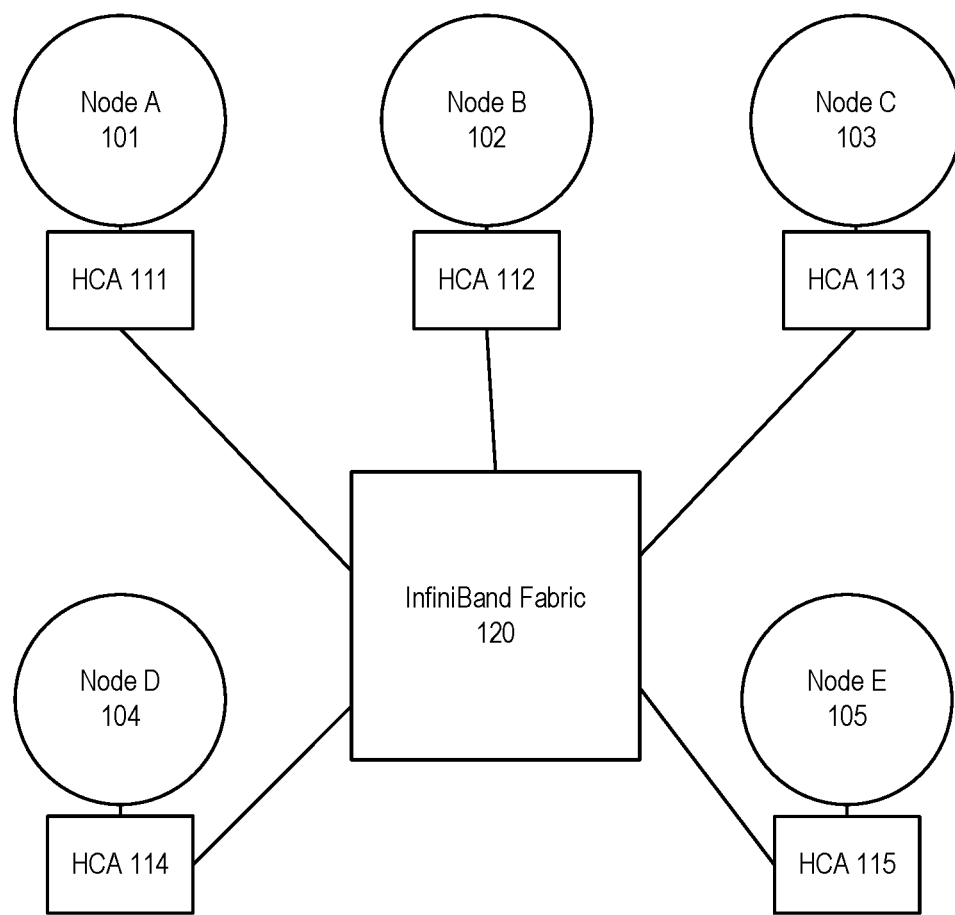
FIG. 1 shows an illustration of an InfiniBand environment, in accordance with an embodiment.

The example embodiments are illustrated, by way of example and not by way of limitation, in the figures of the accompanying drawings in which like references indicate similar elements. It should be noted that references to "an" or "one" or "some" embodiment(s) in this disclosure are not necessarily to the same embodiment, and such references mean at least one. While specific implementations are discussed, it is understood that the specific implementations are provided for illustrative purposes only. A person skilled in the relevant art will recognize that other components and configurations may be used without departing from the scope and spirit of the claimed invention.

Common reference numerals can be used to indicate like elements throughout the drawings and detailed description; therefore, reference numerals used in a figure may or may not be referenced in the detailed description specific to such figure if the element is described elsewhere.

Described herein are systems and methods that support multiple global identifier (GID) subnet prefix values concurrently. It is to be appreciated that allowing multiple GID subnet prefix values concurrently beneficially enables, among other things, intra- and inter-subnet forwarding decisions enabling live migration of virtual machines (VMs) using subnet prefix values in global route headers (GRHs) for linear forwarding table (LFT) lookup in a high performance computing environments.

The following description of the example embodiments uses an InfiniBand™ (IB) network as an example for a high performance network. Throughout the following description, reference can be made to the InfiniBand™ specification (also referred to variously as the InfiniBand specification, IB specification, or the legacy IB specification). Such reference is understood to refer to the InfiniBand® Trade Association Architecture Specification, Volume 1, Version 1.3, released March, 2015, available at http://www.infinibandta.org, which is herein incorporated by reference in its entirety. It will be apparent to those skilled in the art that other types of high performance networks can be used without limitation. The following description also uses the fat-tree topology as an example for a fabric topology. It will be apparent to those skilled in the art that other types of fabric topologies can be used without limitation.

To meet the demands of the cloud in the current era (e.g., Exascale era), it is desirable for virtual machines to be able to utilize low overhead network communication paradigms such as Remote Direct Memory Access (RDMA). RDMA bypasses the OS stack and communicates directly with the hardware, thus, pass-through technology like Single-Root I/O Virtualization (SR-IOV) network adapters can be used. In accordance with an embodiment, a virtual switch (vSwitch) SR-IOV architecture can be provided for applicability in high performance lossless interconnection networks. As network reconfiguration time is critical to make live-migration a practical option, in addition to network architecture, a scalable and topology-agnostic dynamic reconfiguration mechanism can be provided.

In accordance with an embodiment, and furthermore, routing strategies for virtualized environments using vSwitches can be provided, and an efficient routing algorithm for network topologies (e.g., Fat-Tree topologies) can be provided. The dynamic reconfiguration mechanism can be further tuned to minimize imposed overhead in Fat-Trees.

In accordance with an embodiment, virtualization can be beneficial to efficient resource utilization and elastic resource allocation in cloud computing. Live migration makes it possible to optimize resource usage by moving virtual machines (VMs) between physical servers in an application transparent manner. Thus, virtualization can enable consolidation, on-demand provisioning of resources, and elasticity through live migration.

InfiniBand™

InfiniBand™ (IB) is an open standard lossless network technology developed by the InfiniBand™ Trade Association. The technology is based on a serial point-to-point full-duplex interconnect that offers high throughput and low latency communication, geared particularly towards high-performance computing (HPC) applications and datacenters.

The InfiniBand™ Architecture (IBA) supports a two-layer topological division. At the lower layer, IB networks are referred to as subnets, where a subnet can include a set of hosts interconnected using switches and point-to-point links. At the higher level, an IB fabric constitutes one or more subnets, which can be interconnected using routers.

Within a subnet, hosts can be connected using switches and point-to-point links. Additionally, there can be a master management entity, the subnet manager (SM), which resides on a designated device in the subnet. The subnet manager is responsible for configuring, activating and maintaining the IB subnet. Additionally, the subnet manager (SM) can be responsible for performing routing table calculations in an IB fabric. Here, for example, the routing of the IB network aims at proper load balancing between all source and destination pairs in the local subnet.

Through the subnet management interface, the subnet manager exchanges control packets, which are referred to as subnet management packets (SMPs), with subnet management agents (SMAs). The subnet management agents reside on every IB subnet device. By using SMPs, the subnet manager is able to discover the fabric, configure end nodes and switches, and receive notifications from SMAs.

In accordance with an embodiment, intra-subnet routing in an IB network can be based on linear forwarding tables (LFTs) stored in the switches. The LFTs are calculated by the SM according to the routing mechanism in use. In a subnet, Host Channel Adapter (HCA) ports on the end nodes and switches are addressed using local identifiers (LIDs). Each entry in a linear forwarding table (LFT) consists of a destination LID (DLID) and an output port. Only one entry per LID in the table is supported. When a packet arrives at a switch, its output port is determined by looking up the DLID in the forwarding table of the switch. The routing is deterministic as packets take the same path in the network between a given source-destination pair (LID pair).

Generally, all other subnet managers, excepting the master subnet manager, act in standby mode for fault-tolerance. In a situation where a master subnet manager fails, however, a new master subnet manager is negotiated by the standby subnet managers. The master subnet manager also performs periodic sweeps of the subnet to detect any topology changes and reconfigures the network accordingly.

Furthermore, hosts and switches within a subnet can be addressed using local identifiers (LIDs), and a single subnet can be limited to 49151 unicast LIDs. Besides the LIDs, which are the local addresses that are valid within a subnet, each IB device can have a 64-bit global unique identifier (GUID). A GUID can be used to form a global identifier (GID), which is an IB layer three (L3) address.

The SM can calculate routing tables (i.e., the connections/routes between each pair of nodes within the subnet) at network initialization time. Furthermore, the routing tables can be updated whenever the topology changes, in order to ensure connectivity and optimal performance. During normal operations, the SM can perform periodic light sweeps of the network to check for topology changes. If a change is discovered during a light sweep or if a message (trap) signaling a network change is received by the SM, the SM can reconfigure the network according to the discovered changes.

For example, the SM can reconfigure the network when the network topology changes, such as when a link goes down, when a device is added, or when a link is removed. The reconfiguration steps can include the steps performed during the network initialization. Furthermore, the reconfigurations can have a local scope that is limited to the subnets, in which the network changes occurred. Also, the segmenting of a large fabric with routers may limit the reconfiguration scope.

An example InfiniBand fabric is shown in FIG. 1, which shows an illustration of an InfiniBand environment 100, in accordance with an embodiment. In the example shown in FIG. 1, nodes A-E, 101-105, use the InfiniBand fabric, 120, to communicate, via the respective host channel adapters 111-115. In accordance with an embodiment, the various nodes, e.g., nodes A-E, 101-105, can be represented by various physical devices. In accordance with an embodiment, the various nodes, e.g., nodes A-E, 101-105, can also be represented by various virtual devices, such as virtual machines.

Partitioning in InfiniBand

In accordance with an embodiment, IB networks can support partitioning as a security mechanism to provide for isolation of logical groups of systems sharing a network fabric. Each HCA port on a node in the fabric can be a member of one or more partitions. Partition memberships are managed by a centralized partition manager, which can be part of the SM. The SM can configure partition membership information on each port as a table of 16-bit partition keys (P_Keys). The SM can also configure switch and router ports with the partition enforcement tables containing P_Key information associated with the end-nodes that send or receive data traffic through these ports. Additionally, in a general case, partition membership of a switch port can represent a union of all membership indirectly associated with LIDs routed via the port in an egress (towards the link) direction.

In accordance with an embodiment, partitions are logical groups of ports such that the members of a group can only communicate to other members of the same logical group. At host channel adapters (HCAs) and switches, packets can be filtered using the partition membership information to enforce isolation. Packets with invalid partitioning information can be dropped as soon as the packets reaches an incoming port. In partitioned IB systems, partitions can be used to create tenant clusters. With partition enforcement in place, a node cannot communicate with other nodes that belong to a different tenant cluster. In this way, the security of the system can be guaranteed even in the presence of compromised or malicious tenant nodes.

In accordance with an embodiment, for the communication between nodes, Queue Pairs (QPs) and End-to-End contexts (EECs) can be assigned to a particular partition, except for the management Queue Pairs (QP0 and QP1). The P_Key information can then be added to every IB transport packet sent. When a packet arrives at an HCA port or a switch, its P_Key value can be validated against a table configured by the SM. If an invalid P_Key value is found, the packet is discarded immediately. In this way, communication is allowed only between ports sharing a partition.

Figure 2:
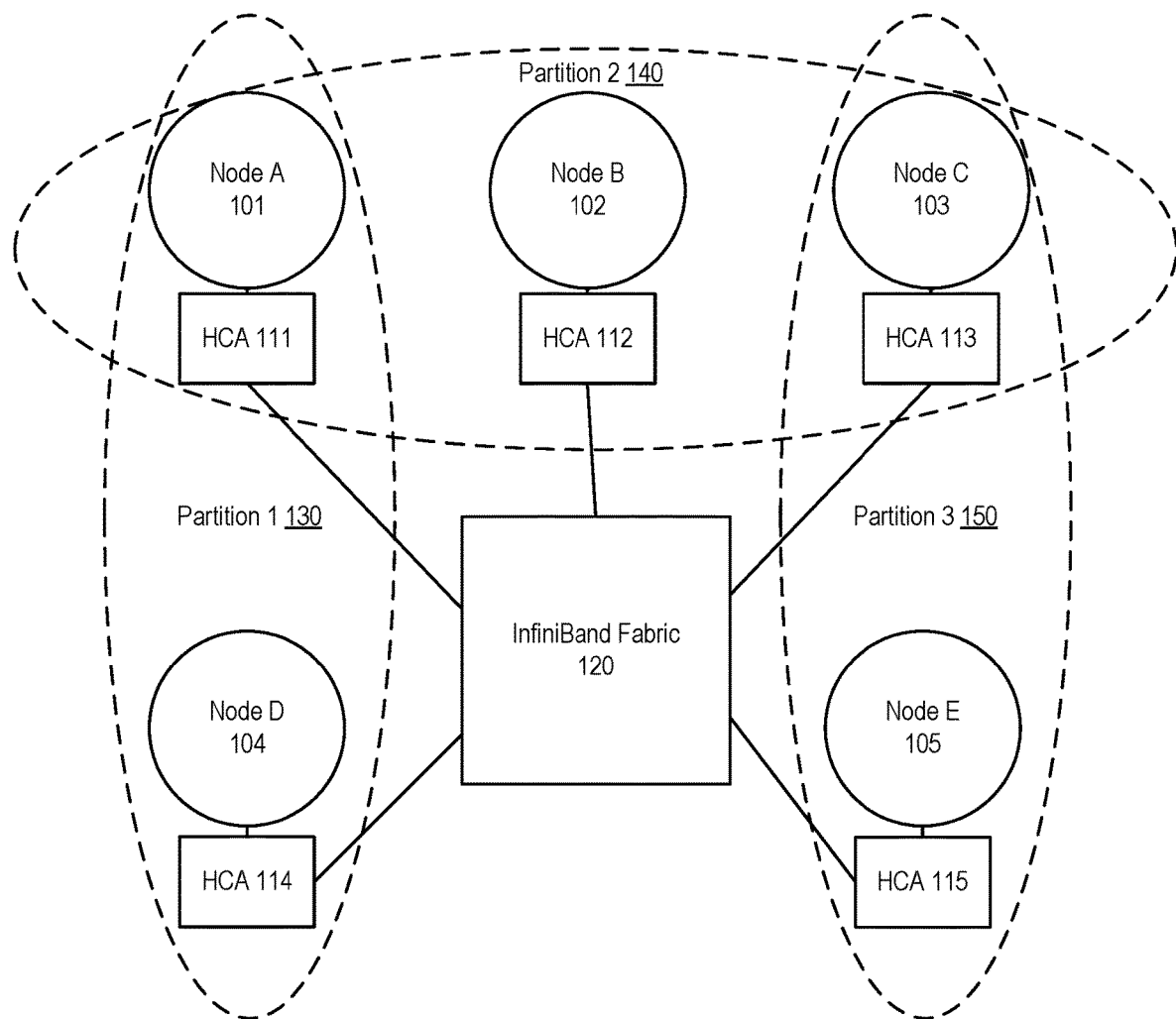
FIG. 2 shows an illustration of a partitioned cluster environment, in accordance with an embodiment

An example of IB partitions is shown in FIG. 2, which shows an illustration of a partitioned cluster environment, in accordance with an embodiment. In the example shown in FIG. 2, nodes A-E, 101-105, use the InfiniBand fabric, 120, to communicate, via the respective host channel adapters 111-115. The nodes A-E are arranged into partitions, namely partition 1, 130, partition 2, 140, and partition 3, 150. Partition 1 comprises node A 101 and node D 104. Partition 2 comprises node A 101, node B 102, and node C 103. Partition 3 comprises node C 103 and node E 105. Because of the arrangement of the partitions, node D 104 and node E 105 are not allowed to communicate as these nodes do not share a partition. Meanwhile, for example, node A 101 and node C 103 are allowed to communicate as these nodes are both members of partition 2, 140.

Virtual Machines in InfiniBand

During the last decade, the prospect of virtualized High Performance Computing (HPC) environments has improved considerably as CPU overhead has been practically removed through hardware virtualization support; memory overhead has been significantly reduced by virtualizing the Memory Management Unit; storage overhead has been reduced by the use of fast SAN storages or distributed networked file systems; and network I/O overhead has been reduced by the use of device passthrough techniques like Single Root Input/Output Virtualization (SR-IOV). It is now possible for clouds to accommodate virtual HPC (vHPC) clusters using high performance interconnect solutions and deliver the necessary performance.

However, when coupled with lossless networks, such as InfiniBand (IB), certain cloud functionality, such as live migration of virtual machines (VMs), still remains an issue due to the complicated addressing and routing schemes used in these solutions. IB is an interconnection network technology offering high bandwidth and low latency, thus, is very well suited for HPC and other communication intensive workloads.

The traditional approach for connecting IB devices to VMs is by utilizing SR-IOV with direct assignment. However, achieving live migration of VMs assigned with IB Host Channel Adapters (HCAs) using SR-IOV has proved to be challenging. Each IB connected node has three different addresses: LID, GUID, and GID. When a live migration happens, one or more of these addresses change. Other nodes communicating with the VM-in-migration can lose connectivity. When this happens, the lost connection can be attempted to be renewed by locating the virtual machine's new address to reconnect to by sending Subnet Administration (SA) path record queries to the IB Subnet Manager (SM).

Layers and Addressing in InfiniBand

The IB architecture is divided into multiple layers wherein each of the multiple layers operates separately and independently from the other layers. On one end of IB Layer abstraction, the IB Physical Layer defines the electrical and mechanical characteristics of the IB system, and on the other end of IB Layer abstraction the IB Upper Layer communicates transactions between host and remote clients. The IB Transport Layer operates to provide partitioning, channel multiplexing, transport services, and packet segmentation and reassembly when sending and receiving data, respectively. Packet forwarding and switching within a subnet is handled at the IB Link Layer, and the IB Network Layer handles routing of the packets from one subnet to another.

In general, the Network Layer defines the protocol for routing a packet within a single subnet and between different subnets. For this the IB architecture uses three different types of addresses. A first type of IB address is the 16 bits Local Identifier (LID). At least one unique LID is assigned to each HCA port and each switch by the SM. The LIDs are used to route traffic within a subnet wherein Link Level switching forwards packets from a device specified by a source LID (SLID) within a Local Route Header (LRH) of the packet to a device specified by a destination LID (DLID) within the Local Route Header LRH. Since the LID is 16 bits long, 65536 unique address combinations can be made, of which only 49151 (0x0001-0xBFFF) can be used as unicast addresses. Consequently, the number of available unicast addresses defines the maximum size of an IB subnet.

A second type of IB address is the 64 bits Global Unique Identifier (GUID) assigned by the manufacturer to each device (e.g. HCAs and switches) and each HCA port. The SM may assign additional subnet unique GUIDs to an HCA port, which is useful when SR-IOV is used. Routers operating at the Network Layer send packets containing a Global Route Header (GRH) between different subnets. The routers forward the packets across subnets using the unique GUID of each device. In the process, the last router in the packet path towards the destination port in the destination subnet modifies the LRH of the packets by replacing the source LID in the LRH with the proper LID of the destination port.

A third type of address is the 128 bits Global Identifier (GID). The GID is a valid IPv6 unicast address, and at least one is assigned to each HCA port. The GID is formed by combining a globally unique 64 bits prefix assigned by the fabric administrator, and the GUID address of each HCA port. GIDs are independent of LIDs and, as such, remain unaffected by subnet reconfiguration.

Fat-Tree (FTree) Topologies and Routing

In accordance with an embodiment, some of the IB based HPC systems employ a fat-tree topology to take advantage of the useful properties fat-trees offer. These properties include full bisection-bandwidth and inherent fault-tolerance due to the availability of multiple paths between each source destination pair. The initial idea behind fat-trees was to employ fatter links between nodes, with more available bandwidth, as the tree moves towards the roots of the topology. The fatter links can help to avoid congestion in the upper-level switches and the bisection-bandwidth is maintained.

Figure 3:
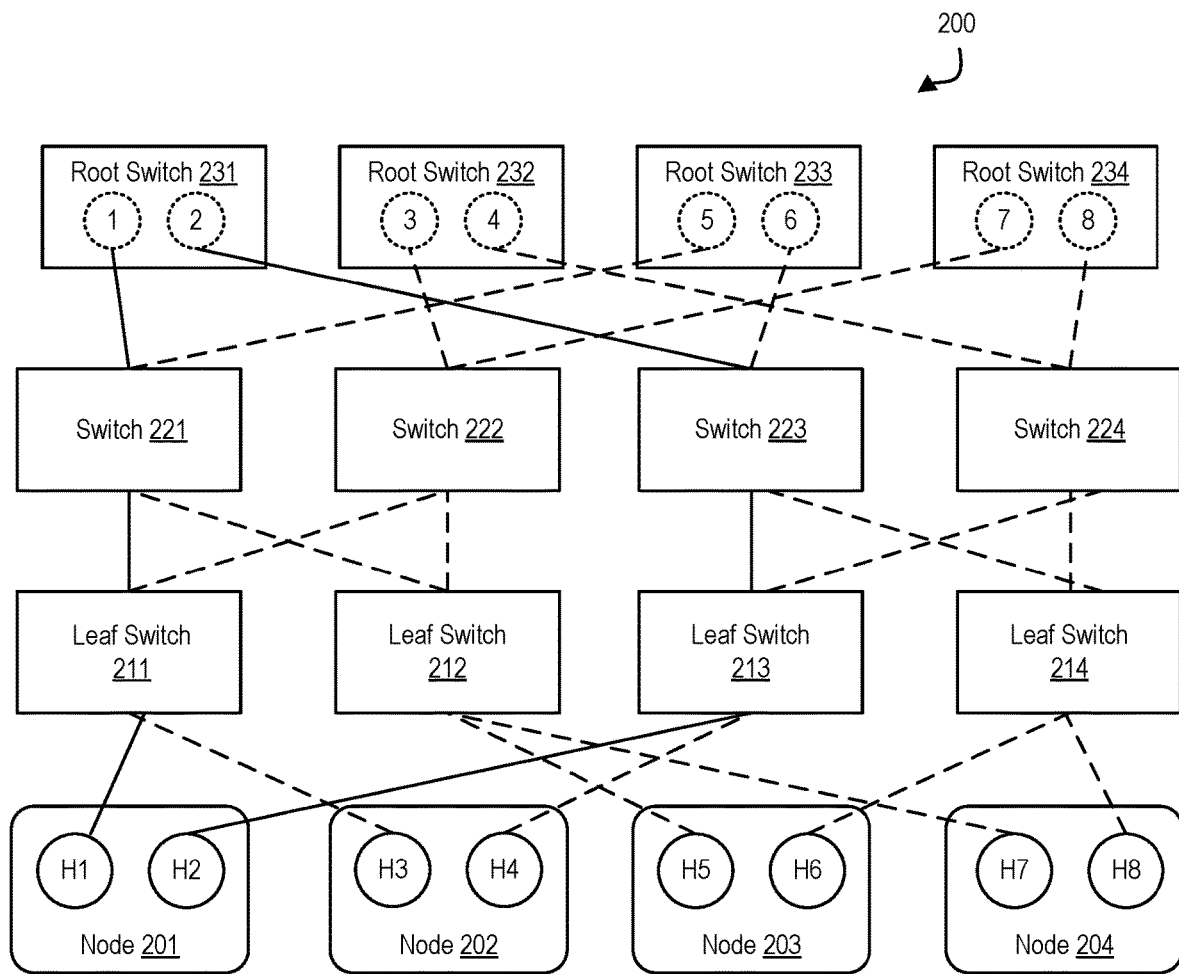
FIG. 3 shows an illustration of a tree topology in a network environment, in accordance with an embodiment.

FIG. 3 shows an illustration of a tree topology in a network environment, in accordance with an embodiment. As shown in FIG. 3, one or more end nodes 201-204 can be connected in a network fabric 200. The network fabric 200 can be based on a fat-tree topology, which includes a plurality of leaf switches 211-214, and multiple spine switches or root switches 231-234. Additionally, the network fabric 200 can include one or more intermediate switches, such as switches 221-224.

Also as shown in FIG. 3, each of the end nodes 201-204 can be a multi-homed node, i.e., a single node that is connected to two or more parts of the network fabric 200 through multiple ports. For example, the node 201 can include the ports H1 and H2, the node 202 can include the ports H3 and H4, the node 203 can include the ports H5 and H6, and the node 204 can include the ports H7 and H8.

Additionally, each switch can have multiple switch ports. For example, the root switch 231 can have the switch ports 1-2, the root switch 232 can have the switch ports 3-4, the root switch 233 can have the switch ports 5-6, and the root switch 234 can have the switch ports 7-8.

In accordance with an embodiment, the fat-tree routing mechanism is one of the most popular routing algorithm for IB based fat-tree topologies. The fat-tree routing mechanism is also implemented in the OFED (Open Fabric Enterprise Distribution—a standard software stack for building and deploying IB based applications) subnet manager, OpenSM.

The fat-tree routing mechanism aims to generate LFTs that evenly spread shortest-path routes across the links in the network fabric. The mechanism traverses the fabric in the indexing order and assigns target LIDs of the end nodes, and thus the corresponding routes, to each switch port. For the end nodes connected to the same leaf switch, the indexing order can depend on the switch port to which the end node is connected (i.e., port numbering sequence). For each port, the mechanism can maintain a port usage counter, and can use this port usage counter to select a least-used port each time a new route is added.

In accordance with an embodiment, in a partitioned subnet, nodes that are not members of a common partition are not allowed to communicate. Practically, this means that some of the routes assigned by the fat-tree routing algorithm are not used for the user traffic. The problem arises when the fat tree routing mechanism generates LFTs for those routes the same way it does for the other functional paths. This behavior can result in degraded balancing on the links, as nodes are routed in the order of indexing. As routing can be performed oblivious to the partitions, fat-tree routed subnets, in general, provide poor isolation among partitions.

In accordance with an embodiment, a Fat-Tree is a hierarchical network topology that can scale with the available network resources. Moreover, Fat-Trees are easy to build using commodity switches placed on different levels of the hierarchy. Different variations of Fat-Trees are commonly available, including k-ary-n-trees, Extended Generalized Fat-Trees (XGFTs), Parallel Ports Generalized Fat-Trees (PGFTs) and Real Life Fat-Trees (RLFTs).

A k-ary-n-tree is an n level Fat-Tree with $k^n$ end nodes and $n \cdot k^{n-1}$ switches, each with 2 k ports. Each switch has an equal number of up and down connections in the tree. XGFT Fat-Tree extends k-ary-n-trees by allowing both different number of up and down connections for the switches, and different number of connections at each level in the tree. The PGFT definition further broadens the XGFT topologies and permits multiple connections between switches. A large variety of topologies can be defined using XGFTs and PGFTs. However, for practical purposes, RLFT, which is a restricted version of PGFT, is introduced to define Fat-Trees commonly found in today's HPC clusters. An RLFT uses the same port-count switches at all levels in the Fat-Tree.

Input/Output (I/O) Virtualization

In accordance with an embodiment, I/O Virtualization (IOV) can provide availability of I/O by allowing virtual machines (VMs) to access the underlying physical resources. The combination of storage traffic and inter-server communication impose an increased load that may overwhelm the I/O resources of a single server, leading to backlogs and idle processors as they are waiting for data. With the increase in number of I/O requests, IOV can provide availability; and can improve performance, scalability and flexibility of the (virtualized) I/O resources to match the level of performance seen in modern CPU virtualization.

In accordance with an embodiment, IOV is desired as it can allow sharing of I/O resources and provide protected access to the resources from the VMs. IOV decouples a logical device, which is exposed to a VM, from its physical implementation. Currently, there can be different types of IOV technologies, such as emulation, paravirtualization, direct assignment (DA), and single root-I/O virtualization (SR-IOV).

In accordance with an embodiment, one type of IOV technology is software emulation. Software emulation can allow for a decoupled front-end/back-end software architecture. The front-end can be a device driver placed in the VM, communicating with the back-end implemented by a hypervisor to provide I/O access. The physical device sharing ratio is high and live migrations of VMs are possible with just a few milliseconds of network downtime. However, software emulation introduces additional, undesired computational overhead.

In accordance with an embodiment, another type of IOV technology is direct device assignment. Direct device assignment involves a coupling of I/O devices to VMs, with no device sharing between VMs. Direct assignment, or device passthrough, provides near to native performance with minimum overhead. The physical device bypasses the hypervisor and is directly attached to the VM. However, a downside of such direct device assignment is limited scalability, as there is no sharing among virtual machines—one physical network card is coupled with one VM.

In accordance with an embodiment, Single Root IOV (SR-IOV) can allow a physical device to appear through hardware virtualization as multiple independent lightweight instances of the same device. These instances can be assigned to VMs as passthrough devices, and accessed as Virtual Functions (VFs). The hypervisor accesses the device through a unique (per device), fully featured Physical Function (PF). SR-IOV eases the scalability issue of pure direct assignment. However, a problem presented by SR-IOV is that it can impair VM migration. Among these IOV technologies, SR-IOV can extend the PCI Express (PCIe) specification with the means to allow direct access to a single physical device from multiple VMs while maintaining near to native performance. Thus, SR-IOV can provide good performance and scalability.

SR-IOV allows a PCIe device to expose multiple virtual devices that can be shared between multiple guests by allocating one virtual device to each guest. Each SR-IOV device has at least one physical function (PF) and one or more associated virtual functions (VF). A PF is a normal PCIe function controlled by the virtual machine monitor (VMM), or hypervisor, whereas a VF is a light-weight PCIe function. Each VF has its own base address (BAR) and is assigned with a unique requester ID that enables I/O memory management unit (IOMMU) to differentiate between the traffic streams to/from different VFs. The IOMMU also apply memory and interrupt translations between the PF and the VFs.

Unfortunately, however, direct device assignment techniques pose a barrier for cloud providers in situations where transparent live migration of virtual machines is desired for data center optimization. The essence of live migration is that the memory contents of a VM are copied to a remote hypervisor. Then the VM is paused at the source hypervisor, and the VM's operation is resumed at the destination. When using software emulation methods, the network interfaces are virtual so their internal states are stored into the memory and get copied as well. Thus the downtime could be brought down to a few milliseconds.

However, migration becomes more difficult when direct device assignment techniques, such as SR-IOV, are used. In such situations, a complete internal state of the network interface cannot be copied as it is tied to the hardware. The SR-IOV VFs assigned to a VM are instead detached, the live migration will run, and a new VF will be attached at the destination. In the case of InfiniBand and SR-IOV, this process can introduce downtime in the order of seconds. Moreover, in an SR-IOV shared port model the addresses of the VM will change after the migration, causing additional overhead in the SM and a negative impact on the performance of the underlying network fabric.

InfiniBand SR-IOV Architecture—Shared Port

There can be different types of SR-IOV models, e.g. a shared port model, a virtual switch model, and a virtual port model.

Figure 4:
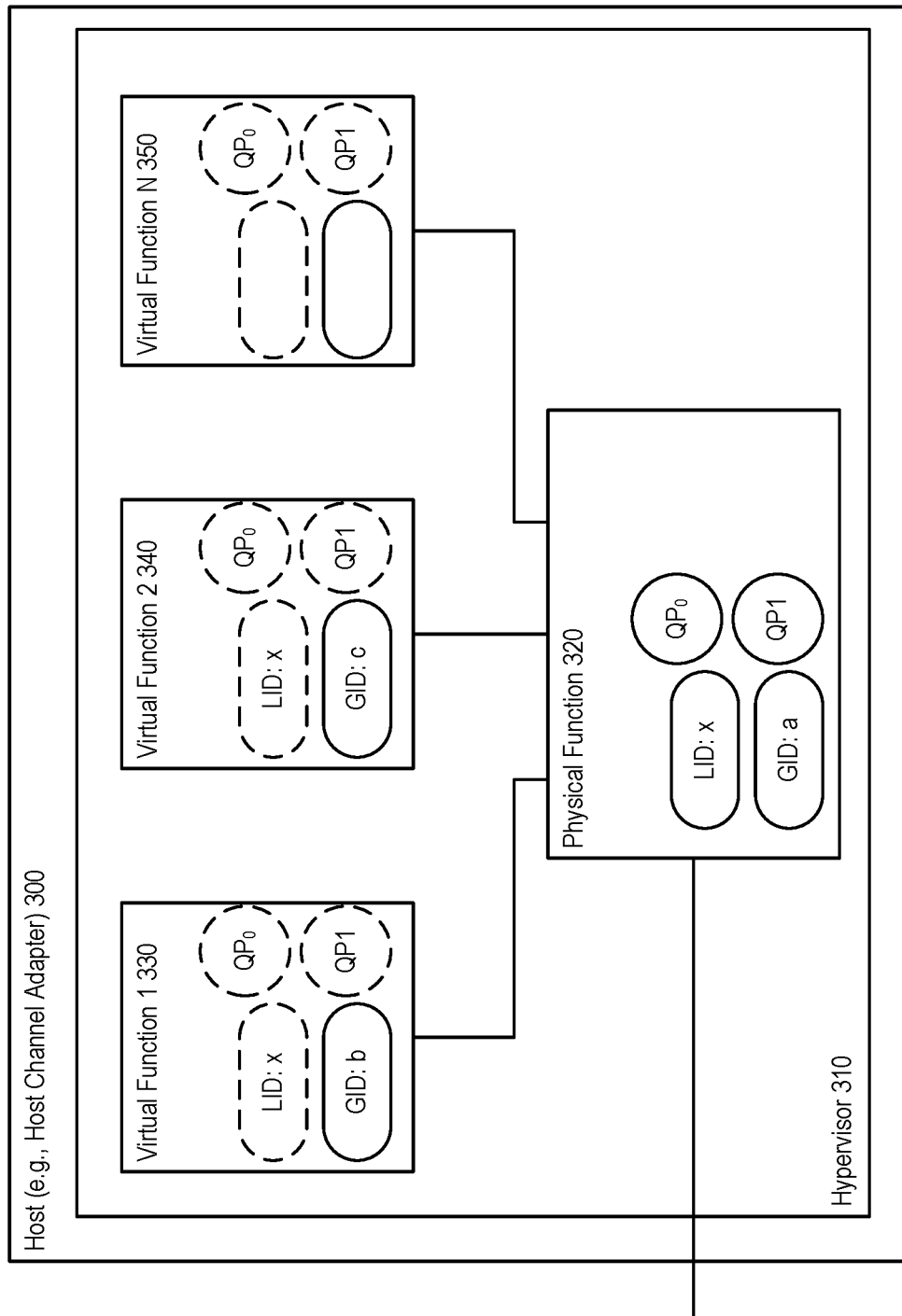
FIG. 4 shows an exemplary shared port architecture, in accordance with an embodiment.

FIG. 4 shows an exemplary shared port architecture, in accordance with an embodiment. As depicted in the figure, a host 300 (e.g., a host channel adapter) can interact with a hypervisor 310, which can assign the various virtual functions 330, 340, 350, to a number of virtual machines. As well, the physical function can be handled by the hypervisor 310.

In accordance with an embodiment, when using a shared port architecture, such as that depicted in FIG. 4, the host, e.g., HCA, appears as a single port in the network with a single shared LID and shared Queue Pair (QP) space between the physical function 320 and the virtual functions 330, 350, 350. However, each function (i.e., physical function and virtual functions) can have their own GID.

As shown in FIG. 4, in accordance with an embodiment, different GIDs can be assigned to the virtual functions and the physical function, and the special queue pairs, QP0 and QP1 (i.e., special purpose queue pairs that are used for InfiniBand management packets), are owned by the physical function. These QPs are exposed to the VFs as well, but the VFs are not allowed to use QP0 (all SMPs coming from VFs towards QP0 are discarded), and QP1 can act as a proxy of the actual QP1 owned by the PF.

In accordance with an embodiment, the shared port architecture can allow for highly scalable data centers that are not limited by the number of VMs (which attach to the network by being assigned to the virtual functions), as the LID space is only consumed by physical machines and switches in the network.

However, a shortcoming of the shared port architecture is the inability to provide transparent live migration, hindering the potential for flexible VM placement. As each LID is associated with a specific hypervisor, and shared among all VMs residing on the hypervisor, a migrating VM (i.e., a virtual machine migrating to a destination hypervisor) has to have its LID changed to the LID of the destination hypervisor. Furthermore, as a consequence of the restricted QP0 access, a subnet manager cannot run inside a VM.

InfiniBand SR-IOV Architecture Models—Virtual Switch (vSwitch)

Figure 5:
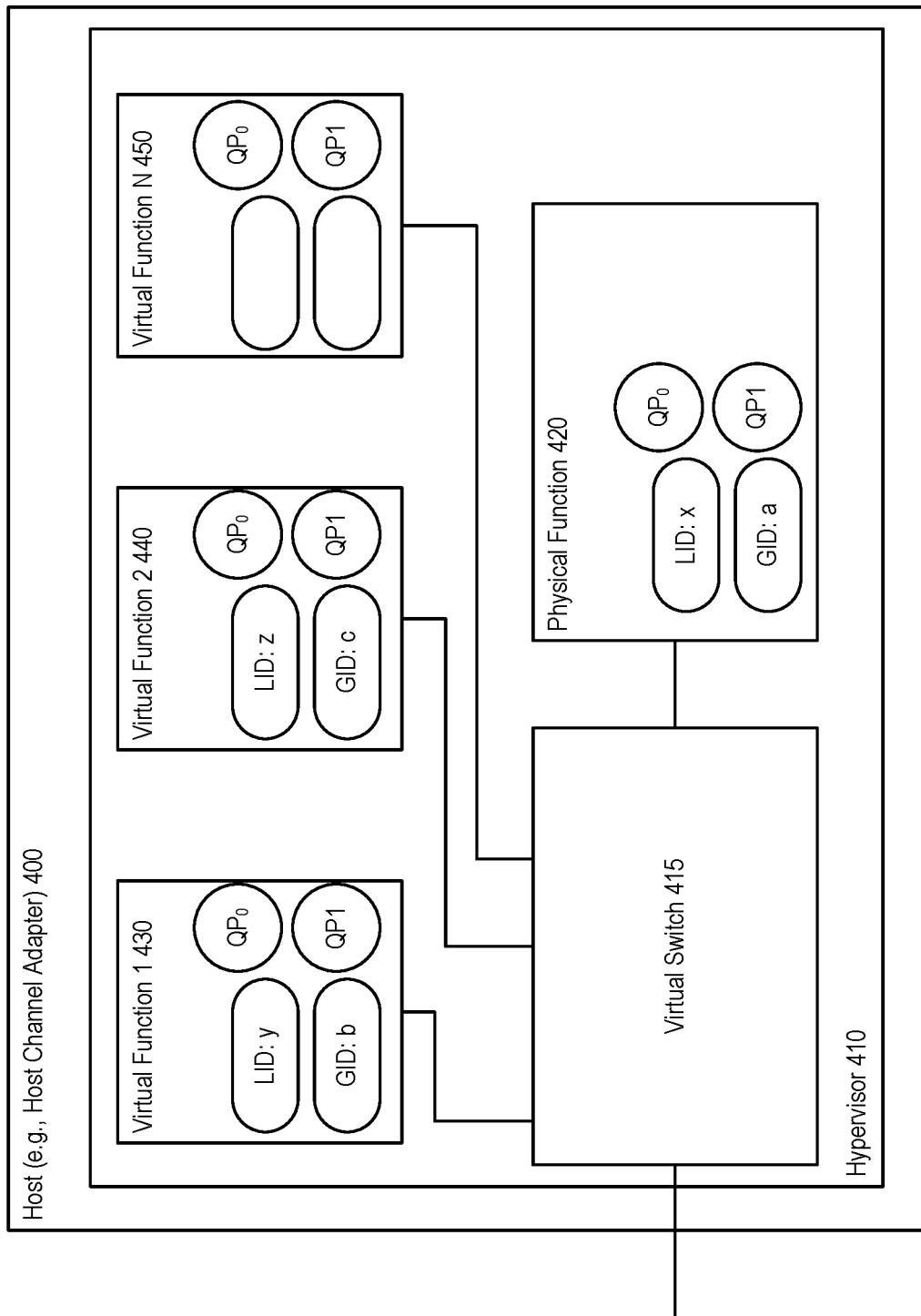
FIG. 5 shows an exemplary vSwitch architecture, in accordance with an embodiment.

FIG. 5 shows an exemplary vSwitch architecture, in accordance with an embodiment. As depicted in the figure, a host 400 (e.g., a host channel adapter) can interact with a hypervisor 410, which can assign the various virtual functions 430, 440, 450, to a number of virtual machines. As well, the physical function can be handled by the hypervisor 410. A virtual switch 415 can also be handled by the hypervisor 401.

In accordance with an embodiment, in a vSwitch architecture each virtual function 430, 440, 450 is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM, the HCA 400 looks like a switch, via the virtual switch 415, with additional nodes connected to it. The hypervisor 410 can use the PF 420, and the VMs (attached to the virtual functions) can use the VFs.

In accordance with an embodiment, a vSwitch architecture provides transparent virtualization. However, because each virtual function is assigned a unique LID, the number of available LIDs gets consumed rapidly. As well, with many LID addresses in use (i.e., one each for each physical function and each virtual function), more communication paths have to be computed by the SM and more Subnet Management Packets (SMPs) have to be sent to the switches in order to update their LFTs. For example, the computation of the communication paths might take several minutes in large networks. Because LID space is limited to 49151 unicast LIDs, and as each VM (via a VF), physical node, and switch occupies one LID each, the number of physical nodes and switches in the network limits the number of active VMs, and vice versa.

InfiniBand SR-IOV Architecture Models—Virtual Port (vPort)

Figure 6:
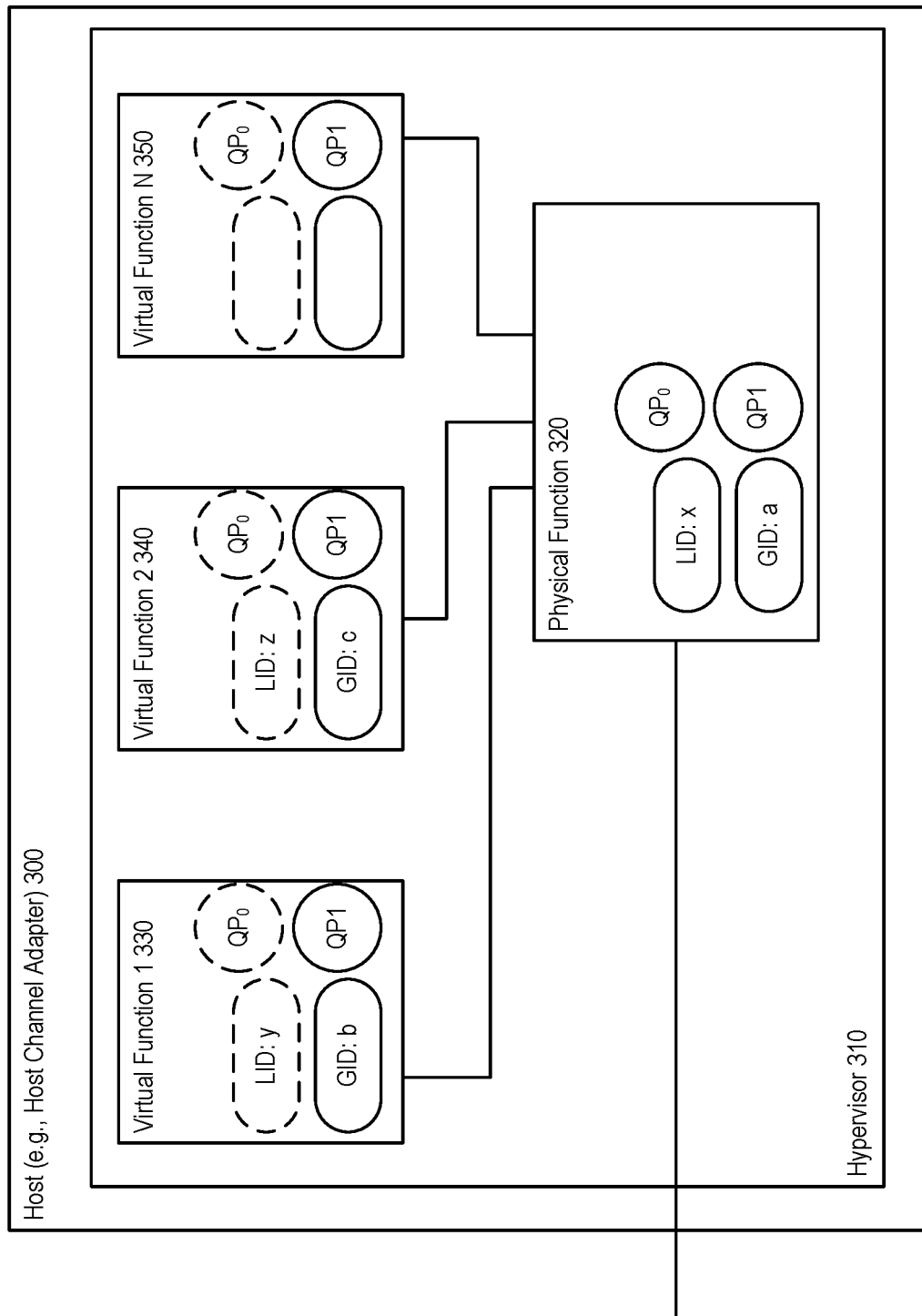
FIG. 6 shows an exemplary vPort architecture, in accordance with an embodiment.

FIG. 6 shows an exemplary vPort concept, in accordance with an embodiment. As depicted in the figure, a host 300 (e.g., a host channel adapter) can interact with a hypervisor 410, which can assign the various virtual functions 330, 340, 350, to a number of virtual machines. As well, the physical function can be handled by the hypervisor 310.

In accordance with an embodiment, the vPort concept is loosely defined in order to give freedom of implementation to vendors (e.g. the definition does not rule that the implementation has to be SRIOV specific), and a goal of the vPort is to standardize the way VMs are handled in subnets. With the vPort concept, both SR-IOV Shared-Port-like and vSwitch-like architectures or a combination of both, that can be more scalable in both the space and performance domains, can be defined. A vPort supports optional LIDs, and unlike the Shared-Port, the SM is aware of all the vPorts available in a subnet even if a vPort is not using a dedicated LID.

InfiniBand SR-IOV Architecture Models—vSwitch with Prepopulated LIDs

In accordance with an embodiment, the present disclosure provides a system and method for providing a vSwitch architecture with prepopulated LIDs.

Figure 7:
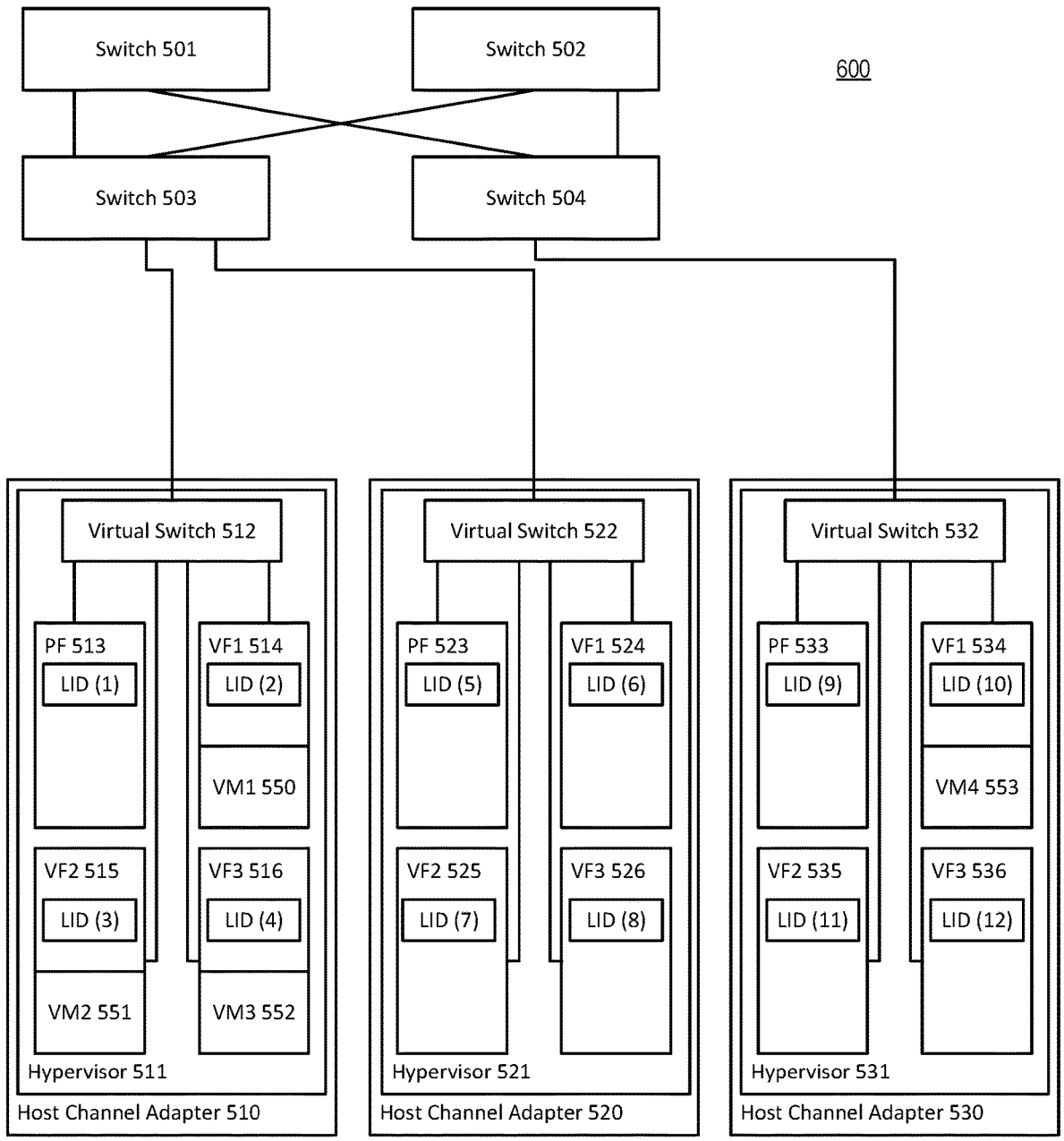
FIG. 7 shows an exemplary vSwitch architecture with prepopulated LIDs, in accordance with an embodiment.

FIG. 7 shows an exemplary vSwitch architecture with prepopulated LIDs, in accordance with an embodiment. As depicted in the figure, a number of switches 501-504 can provide communication within the network switched environment 600 (e.g., an IB subnet) between members of a fabric, such as an InfiniBand fabric. The fabric can include a number of hardware devices, such as host channel adapters

510, 520, 530. Each of the host channel adapters 510, 520, 530, can in turn interact with a hypervisor 511, 521, and 531, respectively. Each hypervisor can, in turn, in conjunction with the host channel adapter it interacts with, setup and assign a number of virtual functions 514, 515, 516, 524, 525, 526, 534, 535, 536, to a number of virtual machines. For example, virtual machine 1 550 can be assigned by the hypervisor 511 to virtual function 1 514. Hypervisor 511 can additionally assign virtual machine 2 551 to virtual function 2 515, and virtual machine 3 552 to virtual function 3 516. Hypervisor 531 can, in turn, assign virtual machine 4 553 to virtual function 1 534. The hypervisors can access the host channel adapters through a fully featured physical function 513, 523, 533, on each of the host channel adapters.

In accordance with an embodiment, each of the switches 501-504 can comprise a number of ports (not shown), which are used in setting a linear forwarding table in order to direct traffic within the network switched environment 600.

In accordance with an embodiment, the virtual switches 512, 522, and 532, can be handled by their respective hypervisors 511, 521, 531. In such a vSwitch architecture each virtual function is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM (not shown), the HCAs 510, 520, and 530 look like a switch, via the virtual switches, with additional nodes connected to them.

Figure 8:
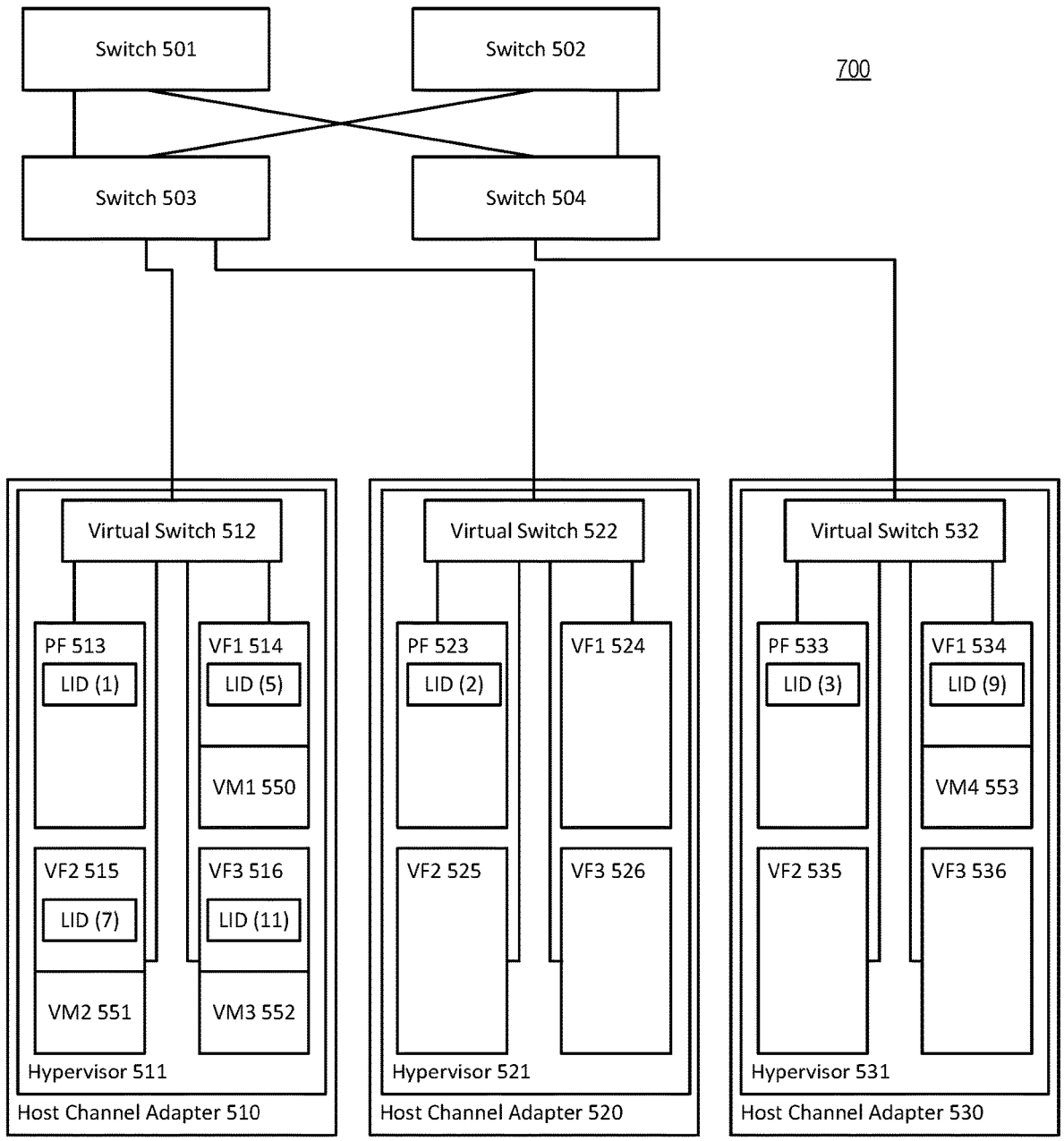
FIG. 8 shows an exemplary vSwitch architecture with dynamic LID assignment, in accordance with an embodiment.

In accordance with an embodiment, the present disclosure provides a system and method for providing a vSwitch architecture with prepopulated LIDs. Referring to FIG. 8, the LIDs are prepopulated to the various physical functions 513, 523, 533, as well as the virtual functions 514-516, 524-526, 534-536 (even those virtual functions not currently associated with an active virtual machine). For example, physical function 513 is prepopulated with LID 1, while virtual function 1 534 is prepopulated with LID 10. The LIDs are prepopulated in an SR-IOV vSwitch-enabled subnet when the network is booted. Even when not all of the VFs are occupied by VMs in the network, the populated VFs are assigned with a LID as shown in FIG. 7.

In accordance with an embodiment, much like physical host channel adapters can have more than one port (two ports are common for redundancy), virtual HCAs can also be represented with two ports and be connected via one, two or more virtual switches to the external IB subnet.

In accordance with an embodiment, in a vSwitch architecture with prepopulated LIDs, each hypervisor can consume one LID for itself through the PF and one more LID for each additional VF. The sum of all the VFs available in all hypervisors in an IB subnet, gives the maximum amount of VMs that are allowed to run in the subnet. For example, in an IB subnet with 16 virtual functions per hypervisor in the subnet, then each hypervisor consumes 17 LIDs (one LID for each of the 16 virtual functions plus one LID for the physical function) in the subnet. In such an IB subnet, the theoretical hypervisor limit for a single subnet is ruled by the number of available unicast LIDs and is: 2891 (49151 available LIDs divided by 17 LIDs per hypervisor), and the total number of VMs (i.e., the limit) is 46256 (2891 hypervisors times 16 VFs per hypervisor). (In actuality, these numbers are actually smaller since each switch, router, or dedicated SM node in the IB subnet consumes a LID as well). Note that the vSwitch does not need to occupy an additional LID as it can share the LID with the PF.

In accordance with an embodiment, in a vSwitch architecture with prepopulated LIDs, communication paths are computed for all the LIDs the first time the network is booted. When a new VM needs to be started the system does not have to add a new LID in the subnet, an action that would otherwise cause a complete reconfiguration of the network, including path recalculation, which is the most time consuming part. Instead, an available port for a VM is located (i.e., an available virtual function) in one of the hypervisors and the virtual machine is attached to the available virtual function.

In accordance with an embodiment, a vSwitch architecture with prepopulated LIDs also allows for the ability to calculate and use different paths to reach different VMs hosted by the same hypervisor. Essentially, this allows for such subnets and networks to use a LID Mask Control (LMC) like feature to provide alternative paths towards one physical machine, without being bound by the limitation of the LMC that requires the LIDs to be sequential. The freedom to use non-sequential LIDs is particularly useful when a VM needs to be migrated and carry its associated LID to the destination.

In accordance with an embodiment, along with the benefits shown above of a vSwitch architecture with prepopulated LIDs, certain considerations can be taken into account. For example, because the LIDs are prepopulated in an SR-IOV vSwitch-enabled subnet when the network is booted, the initial path computation (e.g., on boot-up) can take longer than if the LIDs were not pre-populated.

InfiniBand SR-IOV Architecture Models—vSwitch with Dynamic LID Assignment

In accordance with an embodiment, the present disclosure provides a system and method for providing a vSwitch architecture with dynamic LID assignment.

FIG. 8 shows an exemplary vSwitch architecture with dynamic LID assignment, in accordance with an embodiment. As depicted in the figure, a number of switches 501-504 can provide communication within the network switched environment 700 (e.g., an IB subnet) between members of a fabric, such as an InfiniBand fabric. The fabric can include a number of hardware devices, such as host channel adapters 510, 520, 530. Each of the host channel adapters 510, 520, 530, can in turn interact with a hypervisor 511, 521, 531, respectively. Each hypervisor can, in turn, in conjunction with the host channel adapter it interacts with, setup and assign a number of virtual functions 514-516, 524-526, 534-536, to a number of virtual machines. For example, virtual machine 1 550 can be assigned by the hypervisor 511 to virtual function 1 514. Hypervisor 511 can additionally assign virtual machine 2 551 to virtual function 2 515, and virtual machine 3 552 to virtual function 3 516. Hypervisor 531 can, in turn, assign virtual machine 4 553 to virtual function 1 534. The hypervisors can access the host channel adapters through a fully featured physical function 513, 523, 533, on each of the host channel adapters.

In accordance with an embodiment, each of the switches 501-504 can comprise a number of ports (not shown), which are used in setting a linear forwarding table in order to direct traffic within the network switched environment 700.

In accordance with an embodiment, the virtual switches 512, 522, and 532, can be handled by their respective hypervisors 511, 521, 531. In such a vSwitch architecture each virtual function is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM (not shown), the HCAs 510, 520, and 530 look like a switch, via the virtual switches, with additional nodes connected to them.

In accordance with an embodiment, the present disclosure provides a system and method for providing a vSwitch architecture with dynamic LID assignment. Referring to FIG. 8, the LIDs are dynamically assigned to the various physical functions 513, 523, 533, with physical function 513 receiving LID 1, physical function 523 receiving LID 2, and physical function 533 receiving LID 3. Those virtual functions that are associated with an active virtual machine can also receive a dynamically assigned LID. For example, because virtual machine 1 550 is active and associated with virtual function 1 514, virtual function 514 can be assigned LID 5. Likewise, virtual function 2 515, virtual function 3 516, and virtual function 1 534 are each associated with an active virtual function. Because of this, these virtual functions are assigned LIDs, with LID 7 being assigned to virtual function 2 515, LID 11 being assigned to virtual function 3 516, and LID 9 being assigned to virtual function 1 534. Unlike vSwitch with prepopulated LIDs, those virtual functions 524-526 and 534-536 not currently associated with an active virtual machine do not receive a LID assignment.

In accordance with an embodiment, with the dynamic LID assignment, the initial path computation can be substantially reduced. When the network is booting for the first time and no VMs are present then a relatively small number of LIDs can be used for the initial path calculation and LFT distribution.

In accordance with an embodiment, much like physical host channel adapters can have more than one port (two ports are common for redundancy), virtual HCAs can also be represented with two ports and be connected via one, two or more virtual switches to the external IB subnet.

In accordance with an embodiment, when a new VM is created in a system utilizing vSwitch with dynamic LID assignment, a free VM slot is found in order to decide on which hypervisor to boot the newly added VM, and a unique non-used unicast LID is found as well. However, there are no known paths in the network and the LFTs of the switches for handling the newly added LID. Computing a new set of paths in order to handle the newly added VM is not desirable in a dynamic environment where several VMs may be booted every minute. In large IB subnets, computing a new set of routes can take several minutes, and this procedure would have to repeat each time a new VM is booted.

Advantageously, in accordance with an embodiment, because all the VFs in a hypervisor share the same uplink with the PF, there is no need to compute a new set of routes. It is only needed to iterate through the LFTs of all the physical switches in the network, copy the forwarding port from the LID entry that belongs to the PF of the hypervisor—where the VM is created— to the newly added LID, and send a single SMP to update the corresponding LFT block of the particular switch. Thus the system and method avoids the need to compute a new set of routes.

In accordance with an embodiment, the LIDs assigned in the vSwitch with dynamic LID assignment architecture do not have to be sequential. When comparing the LIDs assigned on VMs on each hypervisor in vSwitch with prepopulated LIDs versus vSwitch with dynamic LID assignment, it is notable that the LIDs assigned in the dynamic LID assignment architecture are non-sequential, while those prepopulated in are sequential in nature. In the vSwitch dynamic LID assignment architecture, when a new VM is created, the next available LID is used throughout the lifetime of the VM. Conversely, in a vSwitch with prepopulated LIDs, each VM inherits the LID that is already assigned to the corresponding VF, and in a network without live migrations, VMs consecutively attached to a given VF get the same LID.

In accordance with an embodiment, the vSwitch with dynamic LID assignment architecture can resolve the drawbacks of the vSwitch with prepopulated LIDs architecture model at a cost of some additional network and runtime SM overhead. Each time a VM is created, the LFTs of the physical switches in the subnet are updated with the newly added LID associated with the created VM. One subnet management packet (SMP) per switch is needed to be sent for this operation. The LMC-like functionality is also not available, because each VM is using the same path as its host hypervisor. However, there is no limitation on the total amount of VFs present in all hypervisors, and the number of VFs may exceed that of the unicast LID limit. Of course, not all of the VFs are allowed to be attached on active VMs simultaneously if this is the case, but having more spare hypervisors and VFs adds flexibility for disaster recovery and optimization of fragmented networks when operating close to the unicast LID limit.

Figure 9:
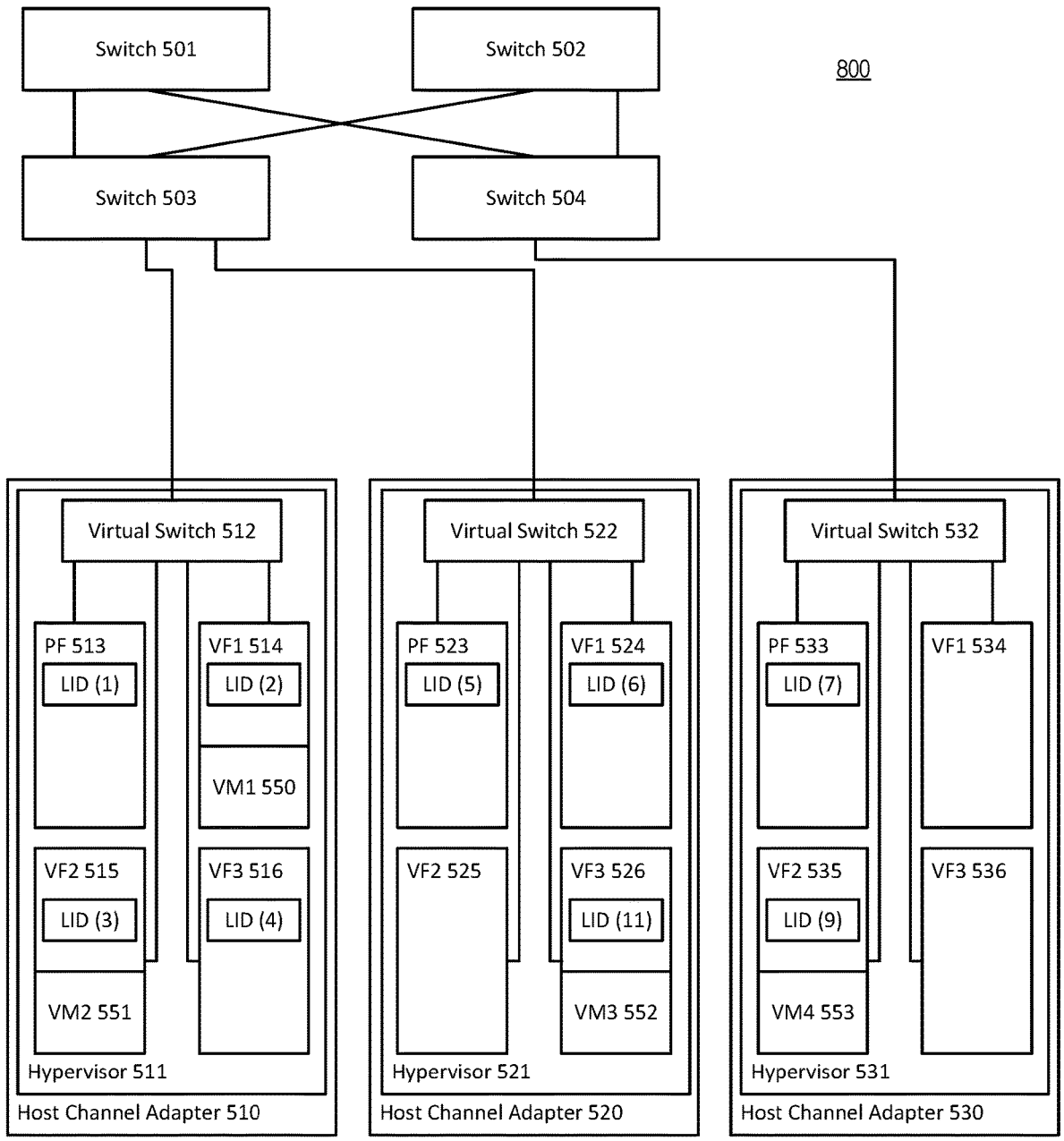
FIG. 9 shows an exemplary vSwitch architecture with vSwitch with dynamic LID assignment and prepopulated LIDs, in accordance with an embodiment.

InfiniBand SR-IOV Architecture Models —vSwitch with Dynamic LID Assignment and Prepopulated LIDs FIG. 9 shows an exemplary vSwitch architecture with vSwitch with dynamic LID assignment and prepopulated LIDs, in accordance with an embodiment. As depicted in the figure, a number of switches 501-504 can provide communication within the network switched environment 800 (e.g., an IB subnet) between members of a fabric, such as an InfiniBand fabric. The fabric can include a number of hardware devices, such as host channel adapters 510, 520, 530. Each of the host channel adapters 510, 520, 530, can in turn interact with a hypervisor 511, 521, and 531, respectively. Each hypervisor can, in turn, in conjunction with the host channel adapter it interacts with, setup and assign a number of virtual functions 514, 515, 516, 524, 525, 526, 534, 535, 536, to a number of virtual machines. For example, virtual machine 1 550 can be assigned by the hypervisor 511 to virtual function 1 514. Hypervisor 511 can additionally assign virtual machine 2 551 to virtual function 2 515. Hypervisor 521 can assign virtual machine 3 552 to virtual function 3 526. Hypervisor 531 can, in turn, assign virtual machine 4 553 to virtual function 2 535. The hypervisors can access the host channel adapters through a fully featured physical function 513, 523, 533, on each of the host channel adapters.

In accordance with an embodiment, each of the switches 501-504 can comprise a number of ports (not shown), which are used in setting a linear forwarding table in order to direct traffic within the network switched environment 800.

In accordance with an embodiment, the virtual switches 512, 522, and 532, can be handled by their respective hypervisors 511, 521, 531. In such a vSwitch architecture each virtual function is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM (not shown), the HCAs 510, 520, and 530 look like a switch, via the virtual switches, with additional nodes connected to them.

In accordance with an embodiment, the present disclosure provides a system and method for providing a hybrid vSwitch architecture with dynamic LID assignment and prepopulated LIDs. Referring to FIG. 9, hypervisor 511 can be arranged with vSwitch with prepopulated LIDs architecture, while hypervisor 521 can be arranged with vSwitch with prepopulated LIDs and dynamic LID assignment.

Hypervisor 531 can be arranged with vSwitch with dynamic LID assignment. Thus, the physical function 513 and virtual functions 514-516 have their LIDs prepopulated (i.e., even those virtual functions not attached to an active virtual machine are assigned a LID). Physical function 523 and virtual function 1 524 can have their LIDs prepopulated, while virtual function 2 and 3, 525 and 526, have their LIDs dynamically assigned (i.e., virtual function 2 525 is available for dynamic LID assignment, and virtual function 3 526 has a LID of 11 dynamically assigned as virtual machine 3 552 is attached). Finally, the functions (physical function and virtual functions) associated with hypervisor 3 531 can have their LIDs dynamically assigned. This results in virtual functions 1 and 3, 534 and 536, are available for dynamic LID assignment, while virtual function 2 535 has LID of 9 dynamically assigned as virtual machine 4 553 is attached there.

In accordance with an embodiment, such as that depicted in FIG. 8, where both vSwitch with prepopulated LIDs and vSwitch with dynamic LID assignment are utilized (independently or in combination within any given hypervisor), the number of prepopulated LIDs per host channel adapter can be defined by a fabric administrator and can be in the range of 0<=prepopulated VFs <=Total VFs (per host channel adapter), and the VFs available for dynamic LID assignment can be found by subtracting the number of prepopulated VFs from the total number of VFs (per host channel adapter).

In accordance with an embodiment, much like physical host channel adapters can have more than one port (two ports are common for redundancy), virtual HCAs can also be represented with two ports and be connected via one, two or more virtual switches to the external IB subnet.

InfiniBand—Inter-Subnet Communication (Fabric Manacled

In accordance with an embodiment, in addition to providing an InfiniBand fabric within a single subnet, embodiments of the current disclosure can also provide for an InfiniBand fabric that spans two or more subnets.

Figure 10:
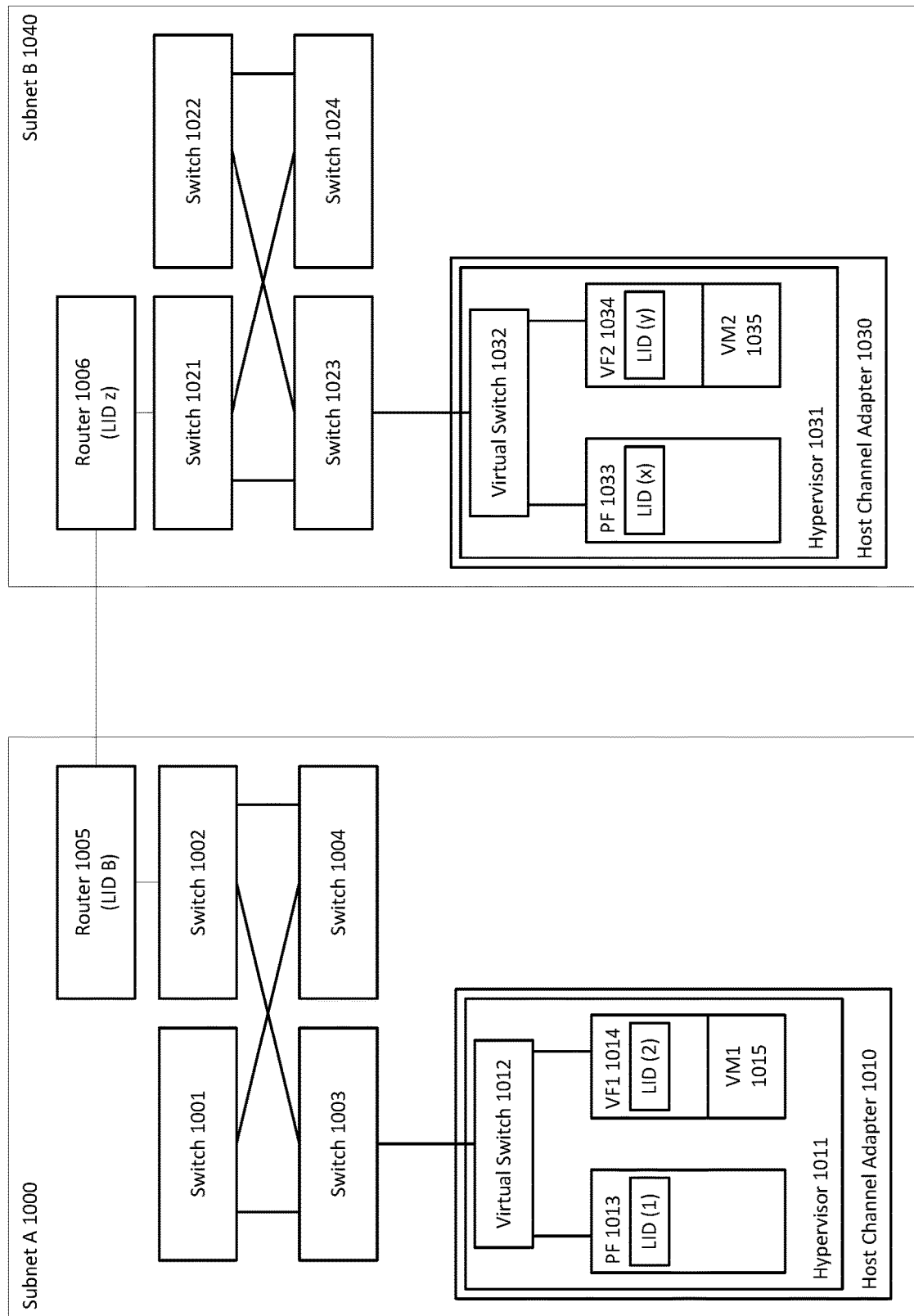
FIG. 10 shows an exemplary multi-subnet InfiniBand fabric, in accordance with an embodiment.

FIG. 10 shows an exemplary multi-subnet InfiniBand fabric, in accordance with an embodiment. As depicted in the figure, within subnet A 1000, a number of switches 1001-1004 can provide communication within subnet A 1000 (e.g., an IB subnet) between members of a fabric, such as an InfiniBand fabric. The fabric can include a number of hardware devices, such as, for example, host channel adapter 1010. Host channel adapter 1010 can in turn interact with a hypervisor 1011. The hypervisor can, in turn, in conjunction with the host channel adapter it interacts with, setup a number of virtual functions 1014. The hypervisor can additionally assign virtual machines to each of the virtual functions, such as virtual machine 1 10105 being assigned to virtual function 1 1014. The hypervisor can access their associated host channel adapters through a fully featured physical function, such as physical function 1013, on each of the host channel adapters. Within subnet B 1040, a number of switches 1021-1024 can provide communication within subnet B 1040 (e.g., an IB subnet) between members of a fabric, such as an InfiniBand fabric. The fabric can include a number of hardware devices, such as, for example, host channel adapter 1030. Host channel adapter 1030 can in turn interact with a hypervisor 1031. The hypervisor can, in turn, in conjunction with the host channel adapter it interacts with, setup a number of virtual functions 1034. The hypervisor can additionally assign virtual machines to each of the virtual functions, such as virtual machine 2 1035 being assigned to virtual function 2 1034. The hypervisor can access their associated host channel adapters through a fully featured physical function, such as physical function 1033, on each of the host channel adapters. It is noted that although only one host channel adapter is shown within each subnet (i.e., subnet A and subnet B), it is to be understood that a plurality of host channel adapters, and their corresponding components, can be included within each subnet.

In accordance with an embodiment, each of the host channel adapters can additionally be associated with a virtual switch, such as virtual switch 1012 and virtual switch 1032, and each HCA can be set up with a different architecture model, as discussed above. Although both subnets within FIG. 10 are shown as using a vSwitch with prepopulated LID architecture model, this is not meant to imply that all such subnet configurations must follow a similar architecture model.

In accordance with an embodiment, at least one switch within each subnet can be associated with a router, such as switch 1002 within subnet A 1000 being associated with router 1005, and switch 1021 within subnet B 1040 being associated with router 1006.

In accordance with an embodiment, at least one device (e.g., a switch, a node . . . etc.) can be associated with a fabric manager (not shown). The fabric manager can be used, for example, to discover inter-subnet fabric topology, created a fabric profile (e.g., a virtual machine fabric profile), build a virtual machine related database objects that forms the basis for building a virtual machine fabric profile. In addition, the fabric manager can define legal inter-subnet connectivity in terms of which subnets are allowed to communicate via which router ports using which partition numbers.

In accordance with an embodiment, when traffic at an originating source, such as virtual machine 1 within subnet A, is addressed to a destination at a different subnet, such as virtual machine 2 within subnet B, the traffic can be addressed to the router within subnet A, i.e., router 1005, which can then pass the traffic to subnet B via its link with router 1006.

Overall, an example embodiment provides a very large fabric with many nodes and, further provides for multiple subnets each having a subnet boundary. The subnet boundaries enable independent subnet managers (SM). In particular, the subnet boundaries enable one independent SM in/for each of the multiple subnets within the very large fabric.

In addition, very efficient packet routing is enabled by the use of the simple lookup mechanism of the Linear Forwarding Table (LFT) lookup protocol in order to route the packet flow in a unique way throughout the whole fabric.

Local/Intra-Subnet Routing:

For Layer 2 (L2) addressing, the example embodiment uses the "normal" local id based routing/forwarding within each subnet. That is, the 16-bit Destination Local Identifier (DLID) in the Local Route Header (LRH) of the IB Packet is looked up when it is being routed at the switch port and, the output port is quickly found by directly indexing the LFT in hardware using the DLID value in the LRH of the IB packet.

Layer 3 (L3) Address/Addressing:

The Global Route Header (GRH) of packets in the example embodiments essentially use the 128-bit scheme: the unique 64-bit node address—the "GUID," and the 64-bit Subnet Prefix Number. The example embodiment provides for a very large fabric that is divided into many independent subnets, wherein the same route/routing capabilities are enabled spanning different subnets. That is, in the example embodiment, the path between endpoints can be routed in the same way as if there was a large single subnet.

In virtual machines (VMs), the physical end nodes can represent a large number of virtual endpoints, wherein each of the virtual endpoints have (and should have for legacy compatibility reasons) their own complete IB address including the 16-bit DLID. However, the 16-bit DLID space becomes exhausted quickly. Essentially, there is more space in each virtual subnet than there is address space-pointing capability using the 16-bit DLID.

In accordance with the example embodiment, therefore, the total fabric is divided into a set of independent subnets, a private "LID space" is provided, and a mechanism is provided for extracting a designated bit-field from the 64-bit Subnet Prefix Number portion of the L3 address. In accordance with the mechanism of the example embodiment, instead of using the entire 64-bits of the L3 address to encode the subnet number, the subject embodiment provides hardware support for extracting a designated bit-field—the ISRN—from the 64-bit Subnet Prefix Number portion of the L3 address. Accordingly, when there is to be communication from (virtual) Subnet A to (virtual) Subnet B through an intermediate infrastructure, the example embodiment encodes in the designated bit-field of the 64-bit Subnet Prefix Number portion of the L3 address both:
  a) the LID in/of the destination subnet; and
  b) an "intermediate" LID of an "intermediate switch fabric" infrastructure.

Global Route Header (GRH) Based Linear Forwarding Table (LFT) Lookup

Figure 11:
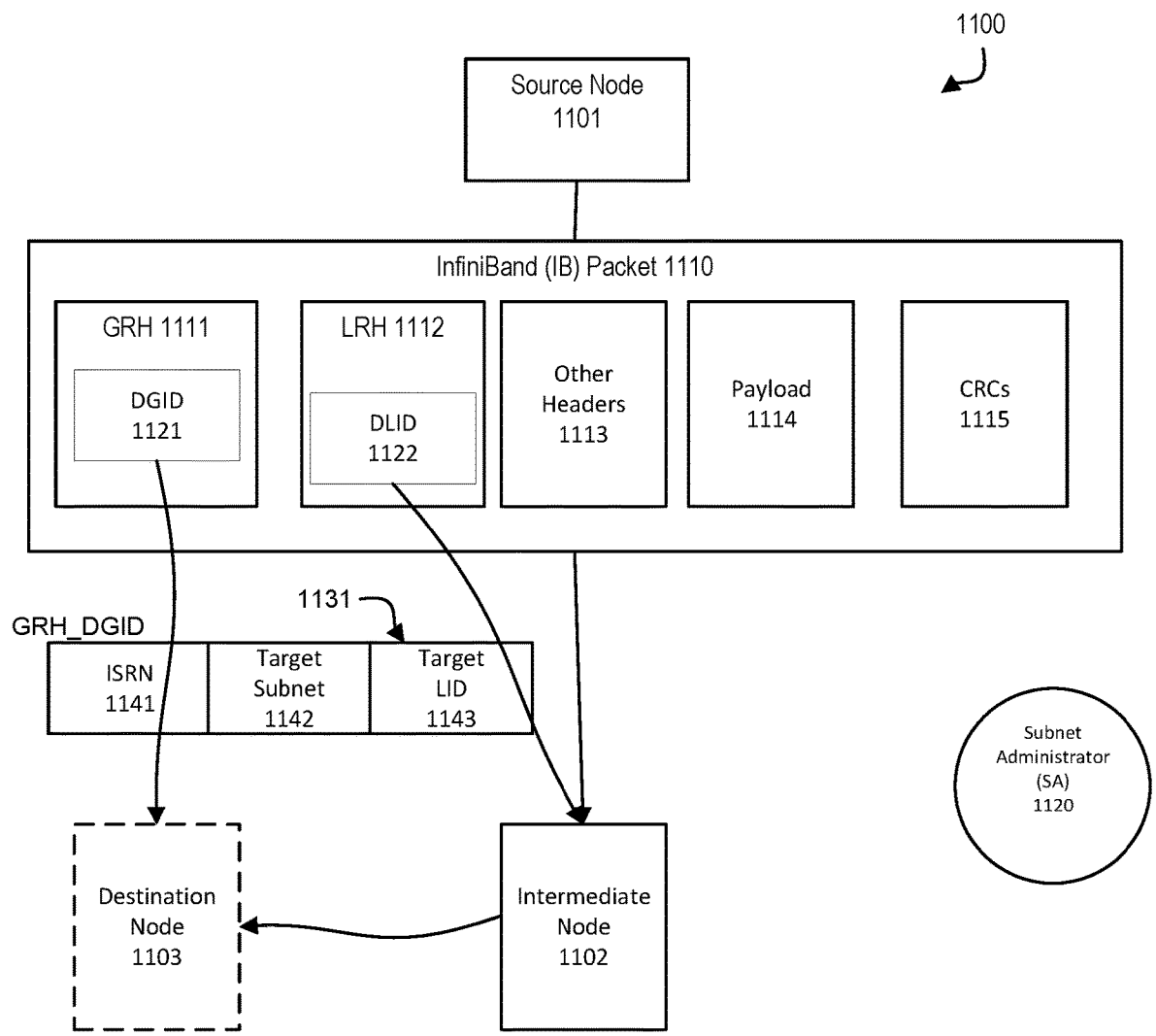
FIG. 11 shows an illustration of a data packet format using InfiniBand (IB) addressing to access a data service in a network environment, in accordance with an embodiment.

In order to reduce the amount of switch/router on-chip resources required to enable scalable, flexible and deterministic routing/forwarding for both intra-subnet and inter-subnet traffic within a single fabric configuration with coordinated management of routing/forwarding throughout the whole IB fabric, a scheme is used in accordance with an embodiment for identifying inter-subnet routes via numbers that are used for linear table lookup in a manner the same as LID-based table lookup within a single subnet. In this regard, FIG. 11 shows an illustration of a data packet format using the InfiniBand (IB) addressing scheme to access a data service in a network environment, in accordance with an embodiment. As shown in the figure, a first IB subnet 1100 can include a plurality of physical (or virtual) nodes 1101 and 1102 and a subnet administrator (SA) 1120. A source node 1101 within the first IB subnet 1100 can send a packet (e.g. an IB packet 1110) to a destination node 1103 in a second IB subnet other than the first IB subnet 1100, via an intermediate node 1102. The destination node 1103 is shown in dashed lines to represent that it is in the second IB subnet.

The IB packet 1110 can include the payload 1114 and various headers according to the IB protocols. These headers can include a global routing header (GRH) 1111, a local routing header (LRH) 1112, and other headers 1113. Additionally, the IB packet 1110 can be applied with various cyclic redundancy checks (CRCs) 1115.

In accordance with an embodiment, the system can take advantage of a subnet prefix portion of the destination global identifier (DGID) 1121 in the GRH 1111 and the destination local identifier (DLID) 1122 in the LRH 1112 for supporting intra- and inter-subnet addressing in the first IB subnet 1100 and the second IB subnet.

For example, the system can set the DLID 1122 in the IB packet 1110 to be the DLID for the intermediate node 1102 (instead of the DLID for the destination node 1103). Within the IB subnet 1100, the IB packet 1110 can be routed via linear forwarding table LFT lookup to the intermediate node 1102 based on the DLID 1122 as resolved by the SA 1120. Thus, the IB packet 1110 can be processed using a data service provided on the intermediate node 1102. Similar data services can be provided in the other nodes 1101 and 1103 as well as may be necessary or desired.

Furthermore, the system can use selected portions of the DGID 1121 in the GRH 1111 to indicate the DLID for the destination node 1103. Thus, the data service software in the intermediate node 1102 is able to resolve (or obtain) the real DLID for the destination node 1103 based on the DGID 1121 information in the GRH 1111.

In accordance with an embodiment, the intermediate node 1102 can perform additional packet header 1113 and/or payload 1114 modifications when necessary. For example, the fabric level access control can be set up in a way that the source node 1101 and the destination node 1103 are either limited members of a relevant partition or not members of the same partition. In such a case, the intermediate node 1102 may be allowed to change the P_Key value in the IB packet 1110 before forwarding the modified packet to the destination node 1103.

Allowing Multiple GID Subnet Prefix Values Concurrently for Incoming IB Packets

The InfiniBand (IB) Specification requires that Host Channel Adapters (HCAs) are able to receive packets with GRH where the subnet prefix 1131 of the Destination GID (DGID) 1121 of the incoming GRH 1111 is either a default prefix or a single prefix that has been assigned to the relevant HCA port by the local Subnet Manager (SM). This allows flexibility in terms of allowing a subnet to migrate from using the default prefix to using an assigned prefix. However, this provision of the IB specification does not resolve the issue of changing the assigned prefix value dynamically at run time, nor does it allow a global fabric implementation to use multiple subnet prefix values in order to control the routing for one or more end-nodes that each have one or more fixed GUID values such as described above, for example, with reference to the example embodiment. Accordingly, an example embodiment herein allows multiple GID subnet prefix values concurrently for incoming IB packets.

In accordance with an example embodiment, by extending the ability to accept both the IB Specification default subnet prefix 1131 as well as the single end port subnet prefix value assigned by the Subnet Manager (SM) also together with the ability to selectively ignore the subnet prefix value 1131, a HCA implementation of the example embodiment supports both dynamic updates of the subnet prefix as well as the use of multiple prefix values to represent multiple paths through the fabric and further as well as dynamic updates of such paths without impacting existing data connections/flows.

This flexible scheme preferably is based on the relevant router ports representing ingress paths to the local subnet to control that incoming subnet prefix values are acceptable for the local subnet.

In accordance with an example embodiment, the assignment of GUIDs to end-nodes in the various subnets have either a subnet local scope, or are based on use of the globally unique EUI-64 values of the GRH. In the first (local scope) case, the uniqueness of a DGID depends on that the subnet prefix 1131 values are not the same for two identical destination GUIDs In the second (global scope) case, no dependency on the prefix uniquely identifying the relevant destination port is required.

FIG. 11 shows the DGID portion 1121 of the exemplary packet 1100 including subnet prefix forwarding portion 1131 including an Inter-Subnet-Route-Number (ISRN) 1141 used in accordance with an embodiment together with a Target Subnet Number 1142 and a Target LID 1143. The ISRN 1141 allows the same linear forwarding tables (LFTs) to be used by fabric switches configured in accordance with an embodiment for making both intra-subnet forwarding decisions as well as for making inter-subnet forwarding decisions. The embodiment supports both fabric local/internal subnet numbers as well as "global" subnet numbers so that inter-subnet traffic within a single fabric configuration can use a different subnet prefix value than traffic between different fabrics.

In order to enable the end-to-end route be completely defined in the packet headers without any need to do any mapping from GRH.DGID to DLID at any point along the path from source to final destination, an embodiment provides a GRH.DGID.subnetprefix format that includes both the Inter Subnet Route Number, a target "fabric local subnet number" as well as the destination LID value in the target subnet.

A scheme or protocol of forwarding domains associated with switch/router ports is supported in an example embodiment wherein each forwarding domain type defines which address information is used for lookup in the LFTs, as well as if a change in forwarding domain type implies that the local route header should be updated with DLID values from the GRH.

The above DGID.subnetprefix format is used in accordance with an embodiment in order to support a three level forwarding domain structure with a source subnet, an intermediate switch fabric and a target subnet. The source and intermediate nodes 1101, 1102 in the source subnet 1100 use the initial LRH.DLID of the packet 1100 for linear forwarding table (LFT) lookup, whereas the transition to the destination node 1103 in the intermediate switch fabric implies that the Inter Subnet Route Number 1141 of the subnet prefix forwarding portion 1131 used for LFT lookup. The intermediate switch fabric may be referred to herein also as "core fabric" for convenience.

In order to indicate that a packet is being forwarded within an intermediate switch fabric type forwarding domain, a special DLID value is used in accordance with an embodiment, wherein the special DLID value can be matched against a value stored in a register in the ingress switch port. The special DLID value represents a "Special Switch Port" wherein the special switch port defines an "end" of a local virtual subnet. This allows the single LFT lookup operation to be based on the relevant section of the GRH.DGID.subnetprefix rather than the LRH.DLID value.

In accordance with an embodiment and in order to be able determine when a change of forwarding domain is to take place, each ingress switch port includes one or more registers with type status for each possible egress port in the same switch node so that the packet processing in the ingress path can prepare the packet for the next forwarding domain if the target port looked up in the LFT represents a change of forwarding domain type.

In accordance with the example embodiment, in the case where the IB packet 1110 is intra-subnet transferring from a port within the source subnet 1100 such as from a port at the source node 1101 to a port also within the source subnet 1100 such as to a port at the intermediate node 1102, the LRH.DLID of the packet is directly used to index a LFT at each switch for standard intra-subnet packet transfer.

Further in accordance with the example embodiment, in the case where the IB packet 1110 is inter-subnet transferring from a port within the source subnet 1100 such as from a port at the source node 1101 to the intermediate switch fabric outside of the source subnet 1100, the DLID 1122 portion of the Local Route Header 1112 of the packet 1110 is updated locally to a value that is configured to represent intermediate switch fabric forwarding in the relevant intermediate switch fabric outside of the source subnet 1100.

In accordance with yet a further example embodiment and with continued reference to FIG. 11, in the case where the IB packet is inter-subnet transferring from the intermediate switch fabric outside of the source subnet 1100 such as from the destination node 1103 to the target source subnet 1100 such as to either the source node 1101 or the intermediate node 1102, the LRH.DLID is updated with the DLID field from the DGID.subnetprefix and is then used to forward the packet to the final destination port using LFT lookup in the target source subnet 1100. In this transition, it is also possible to verify that the target local subnet number in the packet GRH.DGID.subnetprefix is matched with local subnet number that this port represents. This checking is preferably based on a register in each such port.

In an example embodiment, any switch port can represent a "gateway" between the local (source) subnet and the intermediate switch fabric and each such gateway switch port is identified with one or more specific DLIDs in the local subnet. It is therefore possible to implement fat-tree based topologies where multiple parallel core-fabrics can exist. In this way the addressing scalability of the complete fabric can scale with the topology since each parallel core fabric can represent an independently routed domain. The 48K LFT size is then only a limitation within each of these parallel core fabrics, and the number of individual "inter subnet route numbers" within the complete core fabric is 48K times the number of parallel core fabrics.

In addition and in accordance with an embodiment, in order to able to handle "random" connectivity between different fabric configurations with independent management of internal routes, an embodiment provides a support scheme for supporting both fabric local/internal subnet numbers as well as "global" subnet numbers so that inter-subnet traffic within a single fabric configuration can use a different subnet prefix value than traffic between different fabrics. The support scheme also provides TCAM based lookup and mapping of complete DGID values in order to allow forwarding of arbitrary subnet prefix and GUID values.

Fabric Model

As an overview of the core fabric model in accordance with the example embodiment, the IB fabric configuration facilitates scaling to very large fat-tree configurations that can be decomposed into individual subnets, while still maintaining the flexibility of being able to explicitly route individual paths for individual physical or virtual destinations. The system is constructed as a single fabric configuration that is managed in a hierarchical manner, but where a top level management entity has full visibility of the complete fabric.

In order to provide large system construction flexibility while still supporting native IB connectivity between different independently managed systems, the fabric model of the example embodiment enables "arbitrary" IB connectivity between different fabric configurations/topologies that are not managed by the same single top level entity.

The example embodiment encodes path/route information as part of the subnet prefix portion 1131 of the DGID field in the packet GRH for achieving the above goals and also for providing inter-subnet communication within a single fabric configuration. The example embodiment also supports a standard subnet prefix scheme that enable IB-IB routing between independent IB fabrics.

In addition to scaling to very large configurations with hundreds or thousands of physical hosts, the system of an example embodiment also facilitates use of very small subnet configurations where a single integrated circuit chip may be used to implement multiple virtual switches that each represent a different IB subnet managed by a different set of Subnet Managers (SMs). In addition, even for very large total fabric configurations, such small subnet configurations may still be used as necessary or desired in order to reflect the desired decomposition into logical system units. On the other hand, some configurations may have very large single subnet topologies that are still part of a larger single fabric.

In general, the need for flexibility in up-scaling as well as down-scaling imposes a challenge in terms of system on-chip resources for handling packet routing and forwarding decisions. This includes both intra-subnet and inter-subnet forwarding, and in particular the ability to address individual virtual end-points in different subnets.

Figure 12:
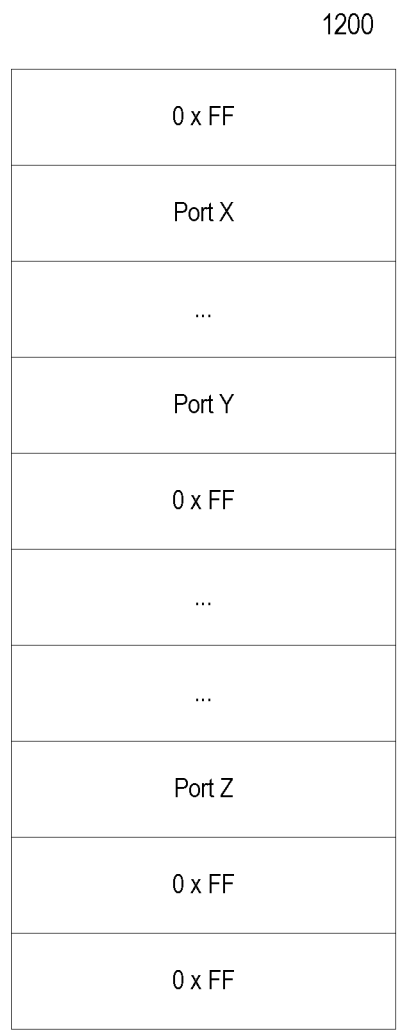
FIG. 12 shows an exemplary portion of a Linear Forwarding Table (LFT) for intra- and inter-subnet forwarding, in accordance with an embodiment.

Embodiments herein provide schemes for reducing the amount of system on-chip resources required to enable scalable, flexible and deterministic routing/forwarding for both intra-subnet and inter-subnet traffic within a single fabric configuration. In particular, an "Inter-Subnet-Route-Number" (ISRN) can be used for identifying inter-subnet routes via numbers that can be used for table lookup in a manner similar to LID based table lookup within a single subnet. In addition, otherwise standard or "legacy" linear forwarding tables are used for both intra- and inter-subnet forwarding decisions. For example, FIG. 12 shows a portion of a Linear Forwarding Table (LFT) 1200 that may be indexed from 0-48 k equivalently by either the LRH.DLID value or by the ISRN value. In the LFT 1200 illustrated, each entry in the table contains either a supported port number or a "0x FF" entry representing an entry not used. In further addition, both fabric local/internal subnet numbers as well as "global" subnet numbers are supported so that inter-subnet traffic within a single fabric configuration can use a different subnet prefix value than traffic between different fabrics. Yet still further, a GRH.DGID.subnetprefix format is provided and supported. In the example embodiment, the GRH.DGID.subnetprefix format includes both an "inter subnet route number", a target "fabric local subnet number" as well as the destination LID value in the target subnet in order to enable the end-to-end route be completely defined in the packet headers without any need to do any mapping from GRH.DGID to DLID at any point along the path from source to final destination.

Leaf-switch based forwarding is provided in order to allow a hierarchical topology with "randomized" multi-path forwarding between individual subnets. In addition, in order to able to handle "random" connectivity between different fabric configurations, the example embodiment supports both fabric local/internal subnet numbers as well as "global" subnet numbers so that inter-subnet traffic within a single fabric configuration can use a different subnet prefix value than traffic between different fabrics, and provides TCAM based lookup and mapping of complete DGID values in order to allow forwarding of arbitrary subnet prefix and GUID values.

Local Fabric

In accordance with an embodiment, a "Local Fabric" is a physical IB fabric infrastructure that represents connectivity within and between one or more physical "leaf subnet" and/or "core fabric" topologies. Local fabrics are managed in a hierarchical manner, but with the constraint that a top-level central management entity such as for example control-plane software, is capable of managing any ID value assignment and observe both physical connectivity and routing (packet forwarding) constraints throughout the complete local fabric (i.e. a "holistic view" of the local fabric).

Remote Fabric

In accordance with an embodiment, a "Remote Fabric" is any IB fabric topology/infrastructure that is connected to a local fabric via one or more IB links but where the port on the remote side of the link is not controlled by the same top level central management entity as the local fabric. The ports connecting two independent local fabrics are typically be configured as router ports. Hence, these two ports form, in accordance with an embodiment, a minimal IB subnet.

Gateway Subnet

In accordance with an embodiment, a "Gateway Subnet" is a "trivial" physical IB subnet that is typically formed by connecting one router port from one local fabric with exactly one router port from another local fabric (i.e. no intermediate switch). The gateway subnet has a trivial configuration that is established at link-up time and packet forwarding policy is controlled independently by the routers on each side. The two router ports implement a mutual discovery protocol in order to learn about the remote fabric. Alternatively and/or additionally, administrative input in each local fabric can selectively be used as necessary or desired to define a set of one or more what remote subnet numbers and individual GIDs should be routed through different Gateway Subnets. A significant aspect of the gateway subnet definition herein is that it places the boundary between the two top level administrative domains on an IB link rather than on a router or switch device that has to be managed.

More complex Gateway subnets imply that switches within the gateway subnet also require management and this management introduces complexity and policy issues that are not present or are significantly less present in the direct link case. Hence, rather than having a well-defined owner of each side of a single link, the question of ownership of the gateway subnet becomes an issue. As with any large scale networking, it is however possible to imagine more complex configurations where multiple local fabrics are connected via one or more other local fabrics (i.e. the admin of the intermediate local fabric determines how the different connected remote fabrics are allowed to communicate via this local fabric. The embodiments herein are applicable to this more complex gateway model since each local fabric may have connectivity to multiple other local fabrics. In any case, even with these types of intermediate local fabrics, the boundary between any pair of local fabrics is preferably a minimal gateway subnet as defined above.

Leaf Subnet

A "Leaf Subnet" is a physical IB subnet that has its own unicast and multicast LID spaces. Host type end-nodes such as compute and storage servers are typically connected to the local fabric via a single leaf subnet. However, a single host may also be connected with multiple leaf subnets as desired. A leaf subnet is configured and controlled by one or more cooperating Subnet Manager (SM) instances and, within a leaf subnet, packets are forwarded based on LRH.DLID portions of the packet header. A leaf subnet may consist of legacy switches (e.g. NM2s) or any other proprietary or other switches, and is identified by an administratively defined "Identification Subnet Number" (ISN) that represents policy input to the set of Subnet Managers that are controlling the leaf subnet, as well as the central top-level management entity. The ISN may be globally unique, and is preferably unique across all local fabrics that can be directly connected via IB links, i.e. via the Gateway Subnets. Each leaf subnet may be connected to one or more "core fabrics" via ports, and each leaf subnet is associated with at least one "Fabric Local Subnet Number" (FLSN) when it is connected to at least one core fabric. The FLSN value has scope for the local fabric and is allocated by the local fabric management infrastructure. In addition, a leaf subnet may be connected to other IB subnets via router ports that do not represent core fabric connectivity. In the general case, such "global" connectivity represents connectivity to a remote fabric via a gateway subnet and, for this kind of global connectivity, the ISN value is used for DGID based addressing of this leaf subnet from remote subnets/fabrics. However, it is also possible to connect two leaf subnets in the same local fabric in this way i.e. without a local core fabric. This kind of connectivity may use either ISN or FLSN based DGID addressing. Router port based connectivity directly from a leaf subnet, either within the local fabric or to a remote fabric, may involve either system ports or other router implementations.

Core Fabric

In accordance with an embodiment, a "Core Fabric" is topology in accordance with the example embodiment that connects one or more leaf subnets within the context of a single local fabric. The expression "intermediate switch fabric" may be used alternatively herein. In accordance with an embodiment, a core fabric provides additional connectivity between different sections of a single leaf subnet such as for example sections that already have direct connectivity within the same physical subnet. In the example embodiment, preferably, a single core fabric represents a single "Inter Subnet Route Number" (ISRN) value space. A single core fabric can have directly connected end-nodes. A special case of end-nodes is switch management ports (port 0). These can be reached via a dedicated ISRN value and requires GRH based communication. Physical end-nodes connected via physical IB links and/or system ports in general represent a separate FLSN (or ISN) value and communication is preferably GRH-based. Such directly connected end-nodes then in general represent a "trivial" leaf subnet with only two ports and a single link, i.e. the end-node port and the relevant system port. It is to be appreciated that, in the environment of the example embodiment, a directly connected physical end-node can also be addressed via a dedicated ISRN value as long as the end-node implementation is able to handle that the DLID value may not be unique. In order to reduce required value space since FLSN values in general have to be global for the whole local fabric, separate FLSN values might selectively not be allocated for such end-ports.

A single core fabric, in accordance with an example embodiment, processes or otherwise handles Direct Route (DR) Subnet Management Packets (SMPs) in a manner similar to other processing or handling within a conventional physical IB subnet. In accordance with an embodiment, however, a single core fabric is configured to support LID based forwarding as well as ISRN based forwarding. Accordingly, the total LID value space used is coordinated with the total ISRN value space used. The coordination includes using different sections of the same physical LFT resources for both types of forwarding, and configuring the size of these sections as a run-time configuration parameter for each system port.

In an example embodiment, there are no restrictions on overlapping LID and ISRN values as long as the sum of the two used value spaces can be supported by the involved hardware components. Assuming a sufficient LID value space is allocated, both system Port 0 instances as well as directly connected end-nodes can be reached via LID based addressing. In this way, a single core fabric instance can also represent a conventional IB subnet and represent a destination leaf subnet within a local fabric at the same time as it is functioning as a core fabric between one or more (other) leaf subnets.

In addition, in an example embodiment, a single core fabric can have direct physical connectivity to one or more other single core fabrics while still maintaining independent ISRN value spaces for each such single core fabric. DR SMPs may be used to communicate between the two core fabric instances without depending on any other type of forwarding being supported. Based on coordination of value spaces and reservation of a specific subset of either LID or ISRN space, communication between all or a subset of the end nodes in two core fabrics can be allowed or is otherwise enabled using either LID or ISRN based addressing.

A single core fabric may have, in an example embodiment, one or more router ports that represent connectivity to remote fabrics. That is, they are independent local fabrics without any coordinated FLSN or ISRN spaces. Such remote connectivity is preferably implemented using Gateway Subnets. In this case, forwarding of packets to/from local end nodes or connected leaf subnets is based on GRHs with ISN based subnet prefix values as well as the associated GUID value in the DGID field. Such forwarding does not depend on any specific formats for any part of the DGID, and instead relies on TCAM based forwarding.

Addressing Mode

In accordance with an embodiment, the "Addressing Mode" of a packet defines the particular header information to be used to determine how the packet should be forwarded from source to destination. An IB packet may include multiple headers (i.e. LRH and GRH) that contain information about how the packet should be forwarded from source to destination. Thus, the addressing mode of a packet defines what such information to be used for the next forwarding decision.

In an example embodiment, the relevant addressing modes in this context includes the following:
 LRH/DLID Addressing Mode;
 GRH/ISRN Addressing Mode;
 GRH/LeafSwitch Addressing Mode; and
 GRH/DGID Addressing Mode.

Forwarding Mode

In accordance with an embodiment, "Forwarding Mode" applies to switch ports that perform the packet forwarding decisions. While the "addressing mode" concept applies to the headers of an IB packet, the switch ports that perform forwarding decisions operate in a "forwarding mode" that corresponds to some packet addressing mode. A switch port may support more than one addressing mode concurrently. Hence, in order to allow a switch port to select the correct forwarding mode for a particular packet, the packet may have to contain information that allows the switch port to deterministically determine the addressing mode. Such information includes both DGID type information as well as special DLID values that have been reserved to denote a specific forwarding mode (e.g. GRH/ISRN). Also, in some cases, the next hop addressing mode is a function of both address information in the packet as well as configuration information associated with ports in the fabric. The ability in the example embodiment to determine when the destination leaf subnet has been reached is an example of the next hop addressing mode being a function of both address information in the packet as well as configuration information associated with ports in the fabric.

Forwarding Domains

Figure 13:
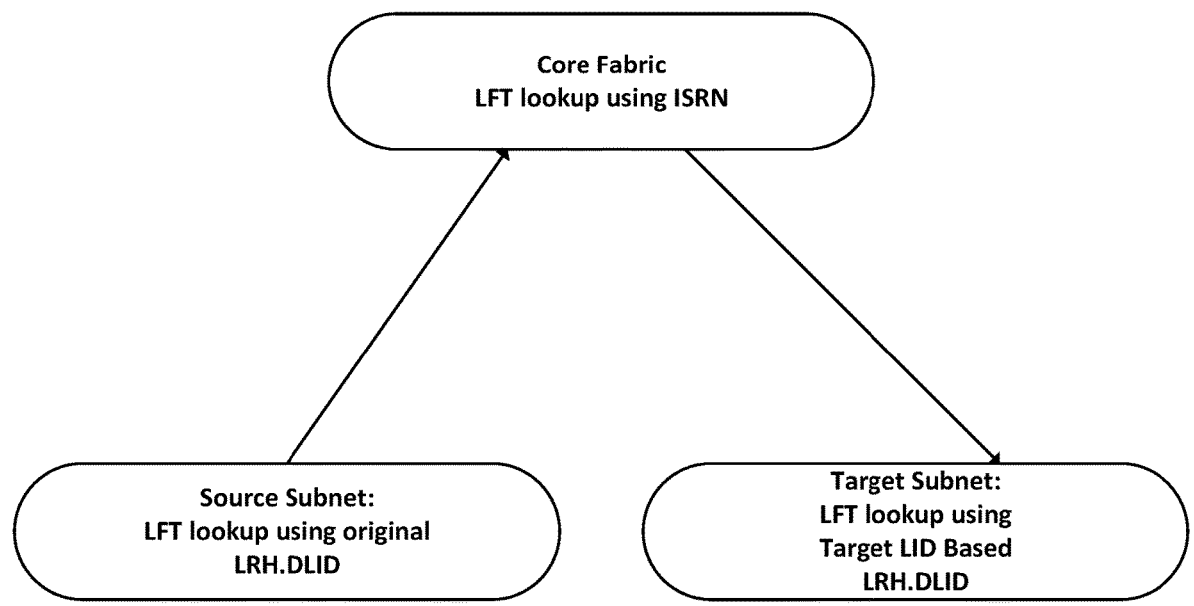
FIG. 13 shows an illustration of forwarding domains in accordance with an embodiment.

In accordance with an embodiment, any specific Leaf Subnet, Core Fabric or Gateway Subnet instance may represent a "Forwarding Domain." As an IB packet is forwarded through the complete IB fabric, it passes through one or more "forwarding domains" such as shown in FIG. 13 where each such forwarding domain represents a specific forwarding mode as well as a specific address value space. In accordance with an embodiment, "Forwarding Domains" are boundaries between multiple Leaf-Subnets and multiple Core Fabrics. In the most straight forward scheme, any individual system instance will belong to a single forwarding domain, e.g. a single leaf-subnet or single core-fabric instance. In this case, all boundaries between any pair of leaf-subnet or core-fabric instances exist on the one or more links that connect different system instances. In order to allow both leaf-subnets and core-fabric instances to have arbitrary sizes, individual system instances are selectively divided into two or more "virtual switch" instances where each such virtual switch represents a collection of one or more "virtual switch ports" that all represent connectivity to/within either a single leaf-subnet or a single core-fabric. In this case, the boundary between any pair of forwarding domains will exist within the system crossbar that connects two or more virtual switch instances.

As shown in FIG. 13, within a Source Subnet, LFT lookup is performed in a first forwarding domain using the original (or legacy) LRH.DLID scheme. In a second forwarding domain and as shown, LFT lookup within the Core Fabric and when forwarding packets from a Source Subnet to the Core Fabric, is performed using the ISRN scheme in accordance with the example embodiment herein. Further and as shown, LFT lookup in a third forwarding domain when forwarding packets from the Core Fabric to the Target Subnet is performed using the Target LID 1143 (FIG. 11) based LRH.DLID.

Gateway Port

In accordance with an embodiment, a physical system port that represents connectivity to a forwarding domain is referred to herein as a "gateway port." For the reasons set out below, a gateway port is defined from the perspective of another port on the same system instance sending packets to the gateway port. First, sending packets to a gateway port implies that the addressing mode for the packet is changed because the sending is one of:

I. sending source-leaf to core-fabric,
II. sending core-fabric to destination-leaf, or
III. sending source-leaf to destination-leaf.

Since the addressing mode of a packet applies to how forwarding decisions are made for packets received from the IB link, the change of addressing mode when crossing from one forwarding domain shown in FIG. 13 to another is, in accordance with an embodiment, implemented as the packet is moved from the system ingress port to the egress port such as may be, for example, the gateway port. The addressing mode will then be active when the packet is forwarded to the IB link from the gateway/egress port.

For this reason, the gateway port is defined from the perspective of another port on the same system instance sending packets to the gateway port.

It is to be appreciated that a link that represents a boundary between different forwarding domains will normally have gateway ports on both sides of the link. The motivation for having gateway ports on both sides of the link is to ensure that forwarding policy updates are contained on each side of the link, and thereby remove the need for any write type management operations across the link. For example, if one side of the link represents a core-fabric and the other side of the link represents a leaf-subnet, then the subnet manager on the leaf-subnet side has in accordance with the example embodiment complete control of forwarding of the packets received on the IB link.

In the example embodiment, packets on the link typically have different addressing mode in each direction, and the forwarding mode for the ports on each side of the IB link will correspond to the "forwarding domain" on that side of the link. For example, if one side of the link represents a core-fabric and the other side of the link represents a leaf-subnet, then packets being forwarded from the core-fabric to the leaf-subnet will have LRH/DLID-based addressing mode as shown on the right in FIG. 13, and the packets being forwarded from the leaf-subnet to the core fabric will have GRH/ISRN-based addressing mode as shown on the left in FIG. 13.

It is to be noted that in the case of a single gateway port located on only one side of the link, that single gateway port is to be managed as part of the forwarding domain on the remote side of the link. As an example, if one side of the link represents a core-fabric and the other side represents a leaf-subnet, and if there is no gateway port on the leaf-subnet side, then the port on the core-fabric side of the link would also need to be part of the leaf-subnet and, further, to have its forwarding logic configured by the subnet manager in the leaf-subnet. Since this implies that this subnet manager then effectively implements the first hop forwarding within the core fabric, an unnecessary dependency between the two forwarding domains can be effectively eliminated by moving the boundary between the forwarding domains from the link to the system crossbar where the gateway port is located on the core-fabric side. The above is followed correspondingly relative to forwarding for the packets in the other direction.

On the other hand, with gateway ports on both sides of the link, the only dependency between the forwarding domains is that the forwarding of packets through the gateway port and onto the IB link is performed with an assurance that the packet has or is provided with the correct addressing mode. Since the output port for the packet is already decided when the change of addressing mode is performed, the change of addressing mode has no impact on forwarding/routing decision at this point.

On the receiving side, the ingress packet handling and forwarding decisions is performed in accordance with a standard intra-subnet protocol just as for any switch port in that forwarding domain.

In the case of crossbar based boundaries within a single system instance, any physical port that is a gateway port relative to any virtual switch instance on the same crossbar, i.e. within the same system instance) may also be a virtual switch port within another virtual switch within the same system instance.

A special case involves a single port connecting a system instance to some leaf-subnet or core-fabric. Although technically a single port is by definition not a switch in the sense that it can perform packet forwarding between other source and target end-ports within the local subnet/forwarding-domain, from an IBTA perspective a switch with only a single external port is still a valid construct in that it provides access to the switch management port and thereby allows the switch management port to function as an end-point within the subnet. In the subject example embodiment, such a single port is still relevant for switching since it provides access via the crossbar based forwarding domain boundaries to other leaf-subnets and/or core-fabrics. Hence, from the perspective of the remote leaf-subnet or core-fabric it provides access to a number of gateway ports, but not to any virtual switch port within the local forwarding domain.

In addition to the above, it is to be noted that if more than one physical port connects a system instance to the same core-fabric or leaf-subnet, then this collection of ports would by default be represented as a virtual switch instance. However, from a fabric topology perspective, there may be no need for this switched connectivity, and it will be a matter of fabric definition policy to represent the collection of ports as one or more virtual switches, including the case of all individual ports only providing connectivity, to gateway ports in other leaf-subnets or core fabrics without allowing connectivity to other ports in the same forwarding domain.

Leaf-Subnet Virtual-Switch

In accordance with an embodiment, a "Leaf-Subnet Virtual-Switch" defines, as a baseline, a collection of one or more physical ports on a single system instance that connects to the same leaf subnet. If Fabric Local Subnet Numbers (FLSNs) are in use, then all the ports in the same leaf-subnet virtual-switch will normally represent the same FLSN value. It is to be noted that, conceptually, different ports within the same leaf-subnet virtual-switch may represent different FLSN values and each port may represent more than one value even though they all represent the same physical subnet. Also, the same FLSN value may be associated with leaf-subnet virtual-switch ports in different physical leaf-subnets.

One motivation for the above schemes is to allow VM migration between leaf subnets without implying a change of path info. However, in order to maintain the complete path information, the DLID can be preserved or a mapping function can be provided for the DLID that can be used in such exception cases.

With a restricted number of mapping resources, as well as a restricted number of more than one FLSN values per port, an advanced scheme in accordance with a further example embodiment is to use a two-step migration scheme where the migration is performed without any path update in the first round using some of the restricted hardware resources, while providing for a concurrent path update process so that the restricted hardware resources could be released again once the path information has been updated by all relevant peers and the original path/address is no longer needed.

In an example embodiment, a leaf-subnet virtual-switch presents itself as a standard IB switch via standard SMA attributes. Hence, legacy Subnet Managers (SMs) are able to discover and configure a system based leaf-subnet virtual-switch in a manner similar to any other standard IB legacy switch that is part of the local subnet.

Further in an example embodiment, a leaf-subnet virtual-switch may be extended to represent connectivity to other parts of the local fabric or to a gateway subnet providing connectivity to a remote fabric. Such connectivity implies that one or more "special" ports are included in the leaf-subnet virtual-switch and can be observed directly such as, for example, as additional port numbers on the same virtual switch via special SMA attributes. That is, one or more core-fabric gateway ports can provide connectivity to one or more core fabrics, and one or more virtual router ports can provide connectivity to physical router ports as well as to various other ports outside the scope of the leaf-subnet virtual-switch.

For example, a virtual router port can be observed indirectly via standard SMA attributes, but then represented by another switch port that has a (virtual) link to another port that is identified as a router port.

In this way, a legacy Subnet Manager (SM) is able to discover and utilize router based connectivity to other subnets. It is to be appreciated, however, that a system aware Subnet Manager (SM) will make use of the special SMA attributes to discover special ports directly, so the need for "legacy SM" support is diminished.

Further with regard to the example embodiment, one or more leaf-subnet gateway ports can provide connectivity to one or more other leaf subnets.

Leaf Subnet Virtual-Switch Port

In accordance with an example embodiment, a leaf-subnet virtual-switch port can belong to a leaf-subnet virtual-switch instance, and uses the LRH.DLID value in order to look up output port number such as for example for packets arriving on the IB link. The type of port the output port number represents relative to this leaf-subnet virtual-switch instance is defined in the example embodiment by configuration information available to the member physical ports. The output port may represent another virtual switch port in the same leaf-subnet virtual-switch, a core fabric gateway port, a virtual router port or a leaf-subnet gateway port providing direct connectivity to another leaf subnet. The output port may in general not be a physical router port because this implies that a new LRH will be constructed in a dynamic fashion based on the packet GRH, and this can only be done via a virtual router port.

It is to be appreciated that, given the definition of simplified Gateway Subnets with only two ports (i.e. local and remote router port), it is possible to provide a simplified scheme where the DLID to use for the next hop is based on either a fixed value, or would be based on having the local physical router port record the LID value of the remote router port, and ensure that this is used as the next hop DLID.

It is to further be appreciated that a physical port that is a leaf-subnet virtual-switch port may also operate as a Leaf Subnet Gateway Port from the perspective of another leaf-subnet virtual-switch or core-fabric virtual-switch.

Core-Fabric Virtual-Switch

In accordance with an embodiment, a "Core-Fabric Virtual-Switch" defines, as a baseline, a collection of one or more physical ports on a single system instance that connects to the same core fabric.

A core-fabric virtual-switch presents itself in the example embodiment as a special IB switch via selected special SMA attributes. Hence, a legacy Subnet Manager (SM) will not be able to discover and configure a core-fabric virtual switch of the system of the example embodiment.

A core-fabric virtual-switch may be extended to represent connectivity to other parts of the local fabric or to a gateway subnet providing connectivity to a remote fabric. Such connectivity implies that one or more other "special" ports are included in the core-fabric virtual-switch and can be observed directly, for example as additional port numbers on the same virtual switch via special selected SMA attributes, wherein one or more leaf-subnet gateway ports can provide connectivity to one or more leaf subnets, one or more virtual router ports can provide connectivity to physical router ports as well as to various other ports outside the scope of the leaf-subnet virtual-switch, and one or more core-fabric gateway ports can provide connectivity to one or more other core fabrics.

Core-Fabric Virtual-Switch Port

In accordance with the example embodiment, a core-fabric virtual-switch port of a core-fabric virtual-switch instance uses the GRH.DGID.ISRN value in order to look up output port for packets arriving on the IB link. The type of output port the looked up port number represents relative to this core-fabric virtual-switch instance is defined by configuration information available to the member physical ports. The output port may represent another core-fabric virtual-switch port in the same core-fabric virtual-switch, a leaf-subnet gateway port, a virtual router port, or a core fabric gateway port providing direct connectivity to another core fabric.

The output port may in general not be a physical router port because this implies that a new LRH has to be constructed in a dynamic fashion based on the packet GRH, and this can only be done via a virtual router port.

It is to be appreciated that a physical port that is a core-fabric virtual-switch port may also operate as a Core Fabric Gateway Port from the perspective of another leaf-subnet virtual-switch or core-fabric virtual-switch.

Core-Fabric Gateway Port

It is to be appreciated that in the case of system crossbar based virtual switch and forwarding domain boundaries, a physical port that is a core-fabric gateway port may also operate as a core-fabric virtual-switch port from the perspective of the core-fabric virtual-switch that represents the relevant core fabric connectivity. Hence, from the perspective of the physical switch port, the packet forwarding alternatives include those described for "Core-Fabric Virtual-Switch Port" above in addition to the gateway port related forwarding described in this section.

In accordance with an example embodiment, a core-fabric gateway port represents a port that handles ingress to or egress from a core fabric instance relative to one or more leaf-subnet virtual-switch port(s) or core-fabric virtual-switch port(s) belonging to other core-fabric virtual-switches in the same system instance such as for example where those virtual core fabric switches also represent other core fabric instances/forwarding domains.

A core fabric gateway port receiving packets via the system crossbar can, in general, not change any addressing mode, and instead rely on that the received packet already has been set up with correct addressing from the system ingress port that forwarded it.

It is to be noted that in an example embodiment, since the physical port may have multiple roles and the specific role is decided at the point of forwarding the packet from the ingress port, there is in general no need for updating address information at the egress point unless some hardware design constraints makes this kind of pipelining more efficient.

In the case of link-based forwarding domain boundaries, a core fabric gateway port is part of the forwarding domain of the leaf-subnet the local system instance represents. Hence, the forwarding mode for packets arriving on the IB link is the "LRH/DLID" forwarding mode.

In the case of system crossbar based forwarding domain boundaries, a core fabric gateway port is part of the forwarding domain defined by the remote core fabric instance. Hence, the forwarding mode for packets arriving on the IB link is the "GRH/ISRN" forwarding mode.

The type of output port the looked up port number represents relative to the relevant forwarding domain (i.e. the core-fabric instance the gateway port represents) is defined by configuration information available to the physical port (i.e. same information as outlined for the virtual-switch port personality, if any, of the physical port).

The output port may represent a leaf-subnet gateway port, or another core-fabric gateway port such as might be the case when two core fabrics are connected via a single system crossbar, and may also represent a virtual router port.

Figure 14:
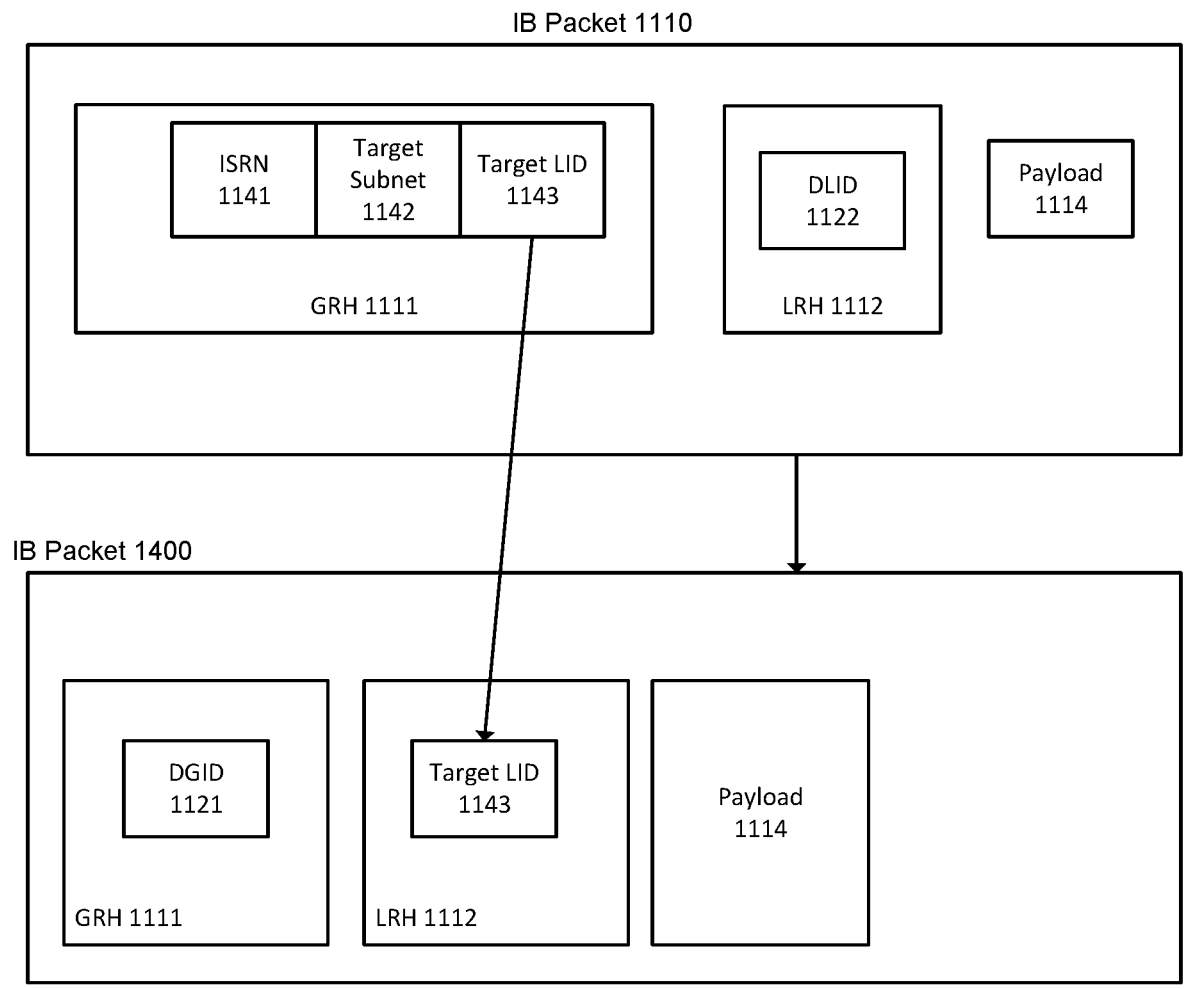
FIG. 14 shows an illustration of modifying a packet header from an GRH/ISRN addressing mode format to a LRH/DLID based forwarding format, in accordance with an embodiment.

FIG. 14 shows an illustration of modifying a packet header from an GRH/ISRN addressing mode format to a LRH/DLID based forwarding format, in accordance with an embodiment. When packets move from the core-fabric gateway port via the system crossbar to a leaf-subnet gateway port, then this transition represents changing from GRH/ISRN addressing mode to LRH/DLID based forwarding. This implies that, as shown in the figure, a new LRH is constructed in the header of a new packet 1400 with the DLID 1143 extracted from the packet GRH 1111 (i.e., the system specific GRH.DGID.remoteDLID field). It is to be noted that, in general, this forwarding is well defined independently of correlating the packet FLSN value with the FLSN value associated with the leaf subnet gateway port. That is, the only information needed in order to accomplish the change in addressing mode is that the egress port is defined as a leaf-subnet gateway port from the perspective of the ingress port, and this is independent of what FLSN value is involved. Based on this observation, any correlation of packet FLSN value with the port FLSN value is essentially an "assert" of that the routing is set up correctly.

This issue is similar to that of the LID(s) associated with end nodes. The local LID(s) are needed in order to generate a correct SLID when sending packets, but as long as the subnet is routed correctly according to LID assignment, there is essentially no need to handle the DLID in incoming packets once the packet has arrived at the destination end-node. As long as switch forwarding tables are updated in correct sequence relative to assigning initial or new LID values to end nodes, the end nodes will never observe a case where the received DLID is in conflict with the assigned LID.

On the other hand, making DLID check optional in the end-node implies that the fabric in principle can use any number of LIDs and associated routings for forwarding to a single end node. In this case where the destination is a leaf subnet, making the FLSN value check optional implies that VM migration between different leaf subnets can be implemented with more flexibility.

Figure 15:
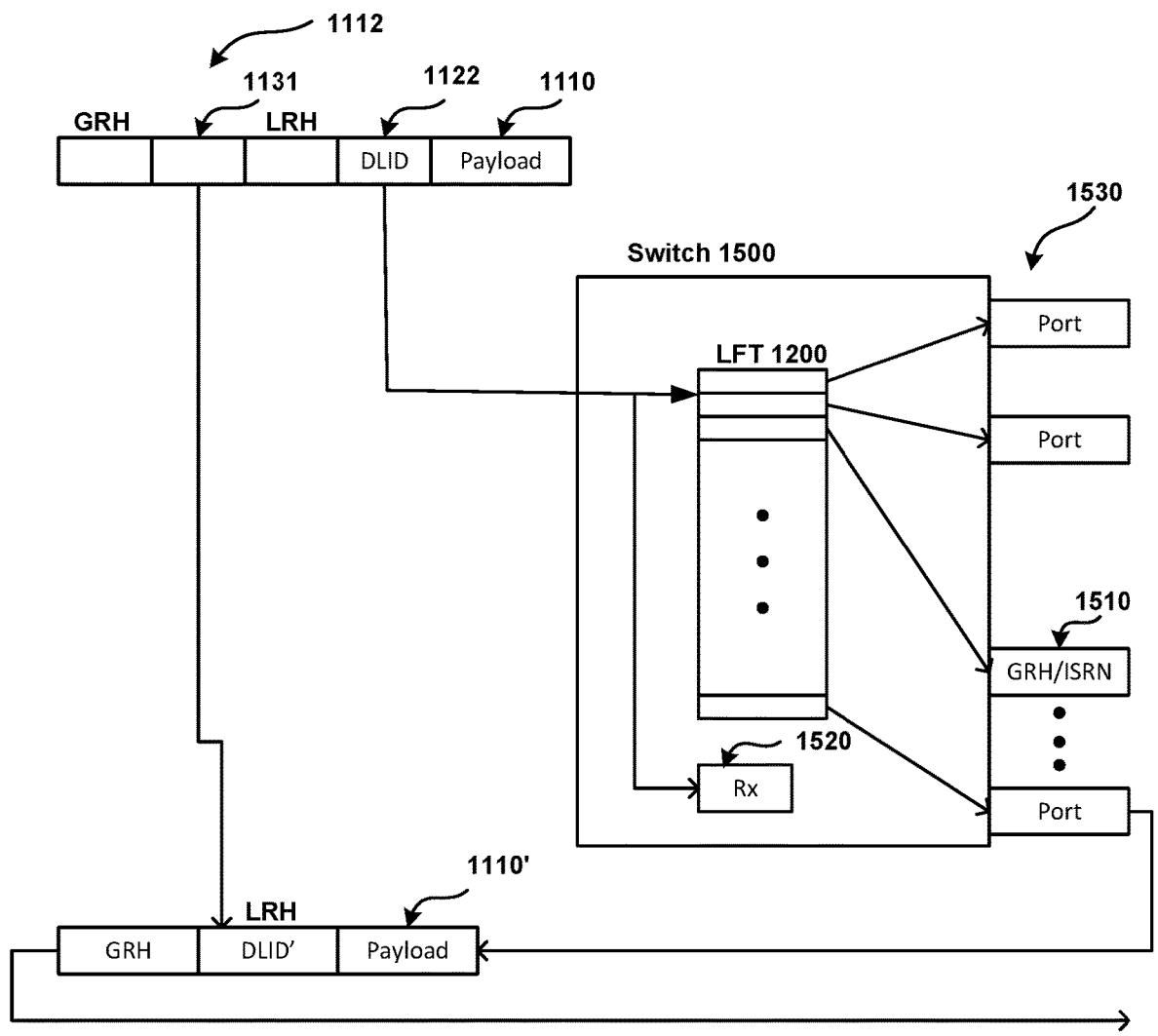
FIG. 15 is an illustration of a switch providing a mechanism defining a special switch port boundary for changing packet forwarding from an LRH/DLID addressing mode to a GRH/ISRN addressing mode, in accordance with an embodiment.

FIG. 15 is an illustration of a switch providing a mechanism defining a special switch port boundary for changing packet forwarding from an LRH/DLID addressing mode to a GRH/ISRN addressing mode, in accordance with an embodiment. When packets move from a leaf-subnet gateway port via the system crossbar to the core-fabric gateway port, then this transition represents changing from the LRH/DLID addressing mode to the GRH/ISRN addressing mode. This implies that, as shown in the figure, a new LRH is constructed with a fixed DLID identifying ISRN based forwarding. In this regard, a switch 1500 provides a mechanism defining a special switch port boundary for changing packet forwarding from an LRH/DLID addressing mode to a GRH/ISRN addressing mode. In accordance with an embodiment supporting ingress into the intermediate switch fabric, a mechanism is provided in selected switches 1500 of the fabric whereby a boundary can be defined. In an embodiment, a "Special Switch Port" (SSP) 1510 is defined, wherein the SSP represents an "end" of a local subnet. In an embodiment, the packet uses the DLID 1122 (FIG. 11) in the original/normal Local Route Header 1112 to point to the SSP 1510 via the LFT 1200 (FIG. 12) representative of a virtual end port of the virtual subnet. The SSP is provided with an attribute indicating that at this point it represent an "End Port" in this subnet. The Special Attribute indicates a change in mode of forwarding—wherein at the next level of forwarding, instead of using the DLID 1122 in the Local Route Header 1112, it uses the designated/dedicated bit-field 1131 from the 64-bit Subnet Prefix Number portion of the GRH/L3 address. Essentially, the original DLID 1122 is replaced with the designated/dedicated bit field, or a portion thereof, to form a new DLID 1110' for use in ISRN based forwarding in accordance with the example embodiment.

In an embodiment, the switch 1500 can use a LID-based filtering technique. In this embodiment, the switch 1500 can include a receiving (Rx) filter 1520, which can identify packets targeting the SSP 1510. Thus, the switch 1500 can separate the data flow traffic targeting the SSP 1510 from the data flow traffic targeting the normal/legacy forwarding modality ports 1530. For example, the Rx filter 1520 can separate the mixed data flow traffic based on the service DLID (e.g. using DLID based filtering). The following is an exemplary data service DLID table:

DLID=0xF

DLID=0xFF

When an incoming packet has a matching DLID, (e.g. 0xF or 0xFF), the Rx filter 1520 can direct the packet to the SSP 1510. On the other hand, if an incoming packet does not have a matching DLID (i.e. with a DLID other than 0xF and 0xFF), the Rx filter 1520 can direct the incoming packet to the normal/legacy forwarding modality ports 1530, which can use an IB protocol engine to handle the IB packet according to the standard IB protocol.

In accordance with an example embodiment, when packets move between the core-fabric gateway port and another core-fabric gateway port (i.e. connected to a different core fabric instance) then the same GRH.DGID.ISRN value is still used for forwarding. Hence, the management software ensures that packet traffic crossing from one core fabric instance to another is representing a GRH.DGID.ISRN value that is handled consistently in both the two or more core fabrics since by default, each core fabric instance represents its own ISRN value space.

When packets move from the core-fabric gateway port to a virtual router port, then the next step forwarding scheme is a function of the policies implemented by the virtual router port.

The output port may in general not be a physical router port because this implies that a new LRH is to be constructed in a dynamic fashion based on the packet GRH, and this is performed via a virtual router port.

Leaf-Subnet Gateway Port

In the case of a system crossbar based forwarding domain boundaries, a physical port that is a leaf-subnet gateway port may also operate as a leaf-subnet virtual-switch port from the perspective of the leaf-subnet virtual-switch that represents the relevant leaf-subnet connectivity. Hence, from the perspective of the physical switch port, the packet forwarding alternatives includes those described for "Leaf-Subnet Virtual-Switch Port" above in addition to the gateway port related forwarding described in this section.

In accordance with an example embodiment, a leaf-subnet gateway port represents a port that handles ingress to or egress from a leaf-subnet instance relative to one or more core-fabric gateway ports and/or one or more leaf-subnet virtual-switch ports belonging to other leaf-subnet virtual-switches in the same system instance. In this regard, a leaf-subnet gateway port receiving packets via the system crossbar in general does not change any addressing mode(s), and instead relies on that the received packet already has been set up with correct addressing from the system ingress port that forwarded it.

In the case of link based forwarding domain boundaries, a leaf-subnet gateway port is part of the forwarding domain of the core fabric the particular system instance represents. Hence, the forwarding mode for packets arriving on the IB link is the "GRH/ISRN" forwarding mode.

In the case of system crossbar based forwarding domain boundaries, a leaf-subnet gateway port is part of the forwarding domain defined by the remote leaf subnet instance. Hence, the forwarding mode for packets arriving on the IB link is the "LRH/DLID" forwarding mode.

The output port may selectively represent a core-fabric gateway port or another leaf-subnet gateway port such as when two leaf subnets are connected via a single system crossbar, and may also represent a virtual router port.

In accordance with the example embodiment, when packets move from the leaf-subnet gateway port via the system crossbar to a core-fabric gateway port, then this transition represents changing from the LRH/DLID-based forwarding mode to the GRH/ISRN-based forwarding mode.

In accordance with the example embodiment, when packets move from a core-fabric gateway port via the system crossbar to the leaf-subnet gateway port, then this transition represents changing from GRH/ISRN addressing mode to LRH/DLID addressing mode.

In accordance with the example embodiment, when packets move between the leaf-subnet gateway port and another leaf-subnet gateway port (i.e. connected to a different leaf subnet) then the original packet LRH.DLID value is used for looking up the output port, but two alternatives exist for how the LRH is constructed for the next hop as set out below.

As the first alternative, if the packet has no GRH and the destination port allows "un-modified LID forwarding", then the packet is forwarded with the same LRH.DLID. Hence, in this case it is up to management software to ensure that packet traffic crossing from one leaf-subnet instance to another without generation of new LRH.DLID is representing a LRH.DLID value that is handled consistently in both leaf subnet since by default each leaf subnet instance represents its own LID value space.

As the second alternative, if the packet has GRH that does represent ISRN based forwarding, then the packet is forwarded if there is an FLSN match with the output port. It is to be noted that similar to what was pointed out in the core fabric gateway port discussion above, there is in general no need to perform FLSN matching in this case either as long as the routing and forwarding table setup is done correctly.

Still, in accordance with an embodiment, the use of FLSN checking can be selectively enabled in order to actually verify that the forwarding of packets between different forwarding domains are not in conflict with FLSN assignment. In this case also, making the FLSN value check optional implies that VM migration between different leaf subnets can be implemented with more flexibility as set out below regarding VM migration.

As the further alternative, if the packet has GRH that does not represent ISRN based forwarding but the destination port allows "un-modified LID forwarding," then the packet is forwarded with the same LRH.DLID. Hence, also in this case, management software ensures that packet traffic crossing from one leaf-subnet instance to another without generation of new LRH.DLID is representing a LRH.DLID value that is handled consistently in both leaf subnets since by default, each leaf subnet instance represents its own LID value space.

When packets move from the leaf-subnet gateway port to a virtual router port, then the next step forwarding scheme is a function of the policies implemented by the virtual router port. The output port may in general not be a physical router port because this implies that a new LRH is to be constructed in a dynamic fashion based on the packet GRH, and this is performed via a virtual router port.

Combined Core-Fabric and Leaf-Subnet Virtual-Switch

In accordance with an example embodiment, a combined core-fabric and leaf-subnet virtual-switch construction allows the same set of ports to provide the properties of both a core-fabric and a leaf-subnet virtual-switch at the same time. One motivation for this construction is to allow non-GRH based data and control traffic to take place between nodes directly connected with the one or more system instances in the core fabric. Forwarding options within the core fabric were described above.

From an implementation perspective of the subject embodiment, as long as a physical system port has configuration information that defines the role of other ports that can be used as output ports relative to the role of this port, there is a need to enforce a restriction that specific set of ports is defined as a combined Core-Fabric and Leaf-Subnet Virtual-Switch as opposed to allowing partial overlap of physical port membership between different virtual switch instances.

Combined Core-Fabric and Leaf-Subnet Virtual-Switch Port

A combined core-fabric and leaf-subnet virtual-switch port in accordance with an example embodiment supports both the GRH/ISRN forwarding mode and the LRH/DLID forwarding mode.

In order to perform the GRH/ISRN based forwarding, the LRH.DLID is a specific pre-defined value that is common for all ports in the ISRN based path. Hence, this LID value can either be a system chip level constant, or it preferably can be defined by a per physical port register.

The combined port can support a configurable number of DLID entries and another configurable range of ISRN values in terms of logical Linear Forwarding Table (LFT) capacity.

It is to be noted that, in general, it is preferred that all ports in the same virtual switch have the same DLID and/or ISRN LFT capacity so that the set of values can be supported by any port. However, this is merely a configuration policy and not an implementation constraint of the example embodiment.

Similarly, each virtual switch instance including the combined virtual switch instance type and the single virtual switch instance type are selectively defined in the example embodiment to logically represent per port Linear Forwarding Tables (LFTs) or a logically common LFT for all the virtual switch ports. However, this is a firmware option as the physical LFT implementation is distributed per port or per set of dual ports in the example embodiment. One reason for this firmware option is obviously to support the IB Specification compliant IB switch mode, as well as to be able to use Subnet Manager and routing engines and initialization engines that do not support distributed LFTs.

Virtual Router Port

A virtual router port is represented in the example embodiment by a system port number outside the range of physical ports. Hence, the virtual router port has no directly associated physical link. Any virtual switch port can look up a virtual router port, and the virtual router port then uses a configurable routing function on the packet GRH in order to define physical output port and next hop LRH.

It is to be noted that the routing function in the example embodiment includes both hierarchical forwarding between end-points in the same local fabric, as well as generic forwarding between independent local fabric instances.

If a packet without a GRH is sent to a virtual router port, then preferably the packet is either dropped or a new LRH and physical output port is generated based on a configurable function.

Each virtual switch port has an associated default virtual router port that is used as intermediate output port if an LFT based lookup is not possible because the DLID or ISRN value from the packet is outside the LFT range supported by the port. In this case, the virtual router port is operable to selectively either drop the packet as a default per the IB Specification, or perform a configurable function on the packet headers in order to define physical output port and next hop LRH.

Physical Router Port

A physical router port is, in the example embodiment, a port that handles ingress to a local fabric instance or egress from a local fabric instance. The physical router port is represented as an IB Specification compliant router port from the link side.

In the example embodiment, a physical router port is associated with the same packet forwarding logic as a virtual router port used for packets arriving from the link side.

In the example, embodiment, a physical router port is looked up or otherwise referenced by a virtual router port or another physical router port that has performed a selected function on the packet GRH of a packet and then produced a new LRH intended to exit on the link of the physical router port.

Simple LRH.DLID insertion is provided based on remote DLID value associated with remote router port in minimal gateway subnet.

Inter Subnet Route Number (ISRN)

In accordance with the example embodiment, the Inter Subnet Route Number (ISRN) is a value defined by a variable part of a packet GRH.DGID.subnetprefix that is used to index LFT entries within a core fabric instance. The ISRN value space is per core-fabric instance, and the Fabric Global Manager (FGM) coordinates the use of the ISRN values.

In the example embodiment, packets to be forwarded using the ISRN value have a special reserved LRH.DLID value that indicates to the receiving port that the ISRN value should be used for LFT based forwarding.

In an embodiment, an ability for system ports to have "multiple personalities" implies that the packet should contain information about the particular type of forwarding mechanism to use as opposed to having this (only) as a per port configuration info.

Fabric Local Subnet Number (FLSN)

In accordance with the example embodiment, the Fabric Local Subnet Number (FLSN) is a value that identifies a destination subnet within a local fabric. Preferably, all FLSN numbers are allocated and managed by the Fabric Global Manager (FGM). Any packet that is forwarded based on ISRN value also has a destination FLSN value.

An FLSN value is associated with Leaf-Subnet Gateway ports that assume a logical port role, and packets forwarded to such ports will have the packet FLSN number matched against the port FLSN number in order to determine that the destination subnet has been reached.

In an embodiment, an ability for system ports to have "multiple personalities" implies that the packets are be qualified as having reached their destination subnet based on combination of both packet and port information as opposed to simply relying upon per port configuration information.

Fabric Global Manager (FGM)

In accordance with the example embodiment, the Fabric Global Manager (FGM) is a "super Subnet Manager" that is capable of performing discovery and configuration of a complete local fabric instance. The FGM cooperates with "FGM aware" Subnet Managers in each individual leaf subnet.

It is to be noted that each leaf-subnet Subnet Manager is capable of managing its own local leaf-subnet independently of the FGM, but will depend on the FGM in order to facilitate any inter-subnet traffic that involves any core-fabric or other leaf-subnet in the local fabric.

Identification Subnet Number (ISN)

In accordance with the example embodiment, an Identification Subnet Number (ISN) is an administratively assigned subnet number that may have a global or a site specific uniqueness. The ISN number is used together with a GUID in order to form GID values that are selectively used for inter-subnet traffic between different local fabric instances.

Hardware GUID (HW GUID)

In accordance with the example embodiment, a hardware GUID is a 64 bit globally unique identification of a hardware resource. Each physical system instance in the example embodiment has a base HW GUID value. Each system based virtual switch instance has a HW GUID that is derived from the base HW GUID in a pre-defined way. Each physical HCA will have a base HW GUID. Each virtual HCA port will have a HW GUID that is derived from the base HW GUID in a pre-defined way.

Virtual GUID (vGUID)

In accordance with the example embodiment, a virtual GUID (vGUID) is a 64 bit GUID value that is either globally unique or unique within a local fabric. A virtual GUID is also guaranteed to be unique relative to any HW GUID present in the local fabric.

A virtual GUID is typically associated with a Virtual Machine instance, and the same vGUID value (one for each vHCA port the VM is using) will normally be associated with a VM throughout the VM lifecycle that may include multiple migrations between physical servers and vHCA instances.

It is to be noted that a particular vHCA instance is identified by its HW GUID, but whenever a VM is using it, the vHCA ports can then also be addressed using the relevant VM vGUID values.

Packet Header Formats and Conventions:

The standards for the packet Local and Global Route Header (LRH/GRH) formats and conventions will now be described. First, the Local Route Header (LRH) used in the example embodiment herein is as defined by the InfiniBand (IB) Specification. Similarly, Global Route Header (GRH) used in the example embodiment herein is as defined by the InfiniBand (IB) Specification, but with a set of two additions/exceptions: 1) the GRH.DGID.SUBNET_PREFIX can have type "ISRN" and 2) the GRH.DGID.SUBNET_PREFIX can have type "LeafSwitchHierarchy."

When the GRH.DGID.SUBNET_PREFIX is of the type "ISRN," the GRH.DGID.SUBNET_PREFIX has, in the example embodiment, the following format (in addition to the ISRN Type:
(Destination) Fabric Local Subnet Number
Inter Subnet Route Number (i.e. in the core fabric instance defined by the initial LRH.DLID value in the source leaf subnet)
DLID (in destination leaf subnet defined by the Fabric Local Subnet Number).

When the GRH.DGID.SUBNET_PREFIX is of the type "LeafSwitchHierarchy," the GRH.DGID.SUBNET_PREFIX has, in the example embodiment, the following format (in addition to the LeafSwitchHierarchy Type:
(Destination) Fabric Local Subnet Number
(Destination) Leaf Switch Number All special sub-fields have run-time defined sizes and offsets. (I.e. enabled by using dedicated TCAM entries to perform the sub-field extractions).

Mapping and Selection of SL and VL values throughout a Local Fabric:

In accordance with the example embodiment herein, within a single leaf-subnet, packets with only LRH and no GRH will be using legacy SL to VL mapping. The example embodiment may, selectively as desired or necessary, extend the local LID and/or SL/VL value space by using reserved bits and new header version number. Extending the number of port numbers that can be looked up by the LFT and allow more such "alias" port numbers to represent other SL/VL mappings for an associated physical port. (i.e. same effect as the above TBD for SL/VL handling but consumes LFT memory rather than relying on proprietary use of reserved LRH bits.) This implies use of multiple DLID values rather than different SL values to achieve traffic separation.

Mapping and selection of values within a single leaf-subnet packets with both LRH and no GRH will by default use, in the example embodiment, legacy SL to VL mapping. The GRH fields are preferably used in the same way as in core fabrics.

Mapping and selection of values between leaf-subnets and within core fabrics, packets with only LRH are preferably to be handled as in a single leaf subnet.

Mapping and selection of values between leaf-subnets and within core fabrics, packets with both LRH and GRH will have SL selection based on the following scheme: each Traffic Class value represents a set of possible SL values; a hashing of the Flow Label value selects among the available SL values defined by traffic class, and support is provided for "aggressive" credit wait policy as defined in the "Mapping and Selection of SL and VL values through Gateway Subnets" below.

Mapping and Selection of SL and VL Values Through Gateway Subnets:

By default, the same GRH based schemes as defined for use within a local fabric is supported by the example embodiment. In addition to the basic mapping, an egress router port such as for example a router port sending packets to the gateway subnet/router port in the remote fabric, may classify all such packets or a subset based on TBD criteria as having a more "aggressive" credit wait policy where packets will be dropped "early" in order to avoid congestion trees to build up in the local fabric.

Mapping and Selection of P Key Values Throughout a Local Fabric:

Each forwarding domain in the example embodiment has a range of P_Key values that can be used for traffic internal to the leaf-subnet without any coordination at the local fabric level. That is, the same private range can be used by all forwarding domains. Any P_Key value outside the local range is allocated via the FGM. The FGM ensures that gateway ports only accept forwarding of packets with P_Key values that are allowed to be forwarded into the relevant forwarding domain.

In a further example, the FGM can define special paths that involves mapping of P_Key values at specific gateway ports such as between different forwarding domains. In general, such mapping implies that the packet Invariant CRC (ICRC) is re-computed. As an alternative scheme that involves support from the end nodes such as HCAs, a scheme is provided where the normal packet ICRC is computed based on a packet P_Key value of 0, but in addition has a reserved bit field in the GRH that is not included in the ICRC, but which contains a CRC parity value for the current P_Key value.

Mapping and Selection of P Key Values Through Gateway Subnets:

The example embodiment as described herein makes, in general, no assumption about coordinated P_Key value allocation between different local fabric instances. Native IB communication is in this case based on a dynamically negotiated P_Key value between the involved local fabric instances, or based on a P_Key mapping scheme as outlined for the Local Fabric case above.

Forwarding of Multicast Packets Throughout a Local Fabric:

In the example embodiment, each forwarding domain has a range of MLID values that are considered private for the forwarding domain, wherein the same private range can be used by all forwarding domains. Any multicast group mapped to a private MLID can only be forwarded within the local forwarding domain. The FGM ensures that private MLID forwarding will not take place across forwarding domain boundaries, and coordinates the use of a set of shared MLID values that can be used to implement multicast forwarding throughout the complete local fabric instance. MGID values to be used via shared MLID values throughout the complete local fabric are allocated by the FGM. Such MGID values have a selected bit field that defines it to be an FGM controlled MGID. The local SM within each forwarding domain, is responsible for ensuring that there is no conflicting use of FGM controlled MGIDs.

In a further example, virtual router ports are used. In this example, multicast packets with a specific MGID and MLID value in one forwarding domain can be forwarded with the same MGID value but a different MLID value in another forwarding domain.

Forwarding of Multicast Packets Through Gateway Subnets:

The example embodiment as described herein makes, in general, no assumption about coordinated MGID value allocation between different local fabric instances. Native IB multicast communication with pure hardware based forwarding are in this case based on a dynamically negotiated MGID value between the involved local fabric instances.

By default in the example embodiment, any multicast forwarding between different local fabric instances is based on configuring a software based proxy service that operates in association with one or more physical router ports and receives multicast packets from the local fabric or from the physical router port and forwards the payload in a new multicast packet in the opposite direction. The proxy is, preferably, by default a normal multicast group member on the local fabric side, and has a special relationship with the physical router port in order to intercept all multicast packets arriving from the remote fabric such as, for example, via the gateway subnet.

In addition to the above, a mechanism is selectively provided ensure that multicast packets from the remote fabric are forwarded to the proxy in a way that does not interfere with any multicast forwarding in the local fabric. This could use a scheme or a notion of a "default MC destination" that uses a dedicated MLID in the local fabric. This is viable as long as the receiver(s) are able to receive any number of MGIDs and forward to the QP(s) associated with the proxy instance(s). This may also include a large number of partitions. If this functionality is hard to ensure for relevant HCAs, then an alternative embodiment herein is for the system to function to tunnel the IB MC packet in an IB unicast packet, in a way that is similar to how Enet packets are tunneled when received on an Enet GW port. The proxy implementation is then able to interpret and handle the incoming remote MC packet independently of how it is tunneled on the local fabric.

It is to be noted that, in order to handle any number of partitions, more than one SW proxy may be required in the direction from local fabric to remote fabric. It is to be further noted that for the physical router port, tunneling in both directions is implemented. Also, in the case where a proxy implementation exists in both fabrics, the tunneling is implemented by cooperating proxy implementations without the need for any dedicated hardware support. In this connection, a tunneling scheme implies that the max IB MTU cannot be forwarded as tunneled MC packets since the original IB headers have to be included as IB payload in the tunneling packet. The proxy is preferably able to handle the case where the same MGID value is used for two different logical multicast groups in different local fabrics.

Initial Discovery and Configuration of a Local Fabric:

In accordance with the example embodiment, by default, each system instance operates as a single conventional InfiniBand (IB) switch. In this default configuration, any existing IB Subnet Manager or SMP based diagnostic and monitoring tool is able to "see" or otherwise learn the complete connected fabric as a single IB subnet.

The division of a system instance into multiple virtual switches as well as defining port types and associated configuration information represents an "out-of-band" configuration policy that is, for example, not part of normal SMA operations. All or most out-of-band configuration operations can be implemented however via vendor specific SMP operations as an alternative to "pure" out-of-band configuration. It is to be noted that since in the example embodiment each system instance has E-net based management interface that is available independently of any IB link state, and also supports IPoIB/EoIB, the "out-of-band" configuration does in principle represent IP based access via any of the interfaces.

It is to be further noted that there is no notion of a pure "local" management interface like PCI-E that is inherently associated with a local management processor. Still, in order to solve "chicken-and-egg" configuration issues relative to security, the Enet interface may represent an initial source of configuration policy with the assumption that the physical system such as for example the "NM3 box," the system of the example embodiment is part of preferably has secured the Enet access via port based VLANs or other access control rules. This knowledge is preferably production time defined "a priori" and is persistent configuration information for the system instance.

In configurations where an HCA port representing an NM3 internal management processor is present and connected to a specific port on a specific system instance such as defined by the hardware design, then the system instance in accordance with the example embodiment should also have a priori information about the local system port having this connectivity.

Based on configuration information supplied initially via the Enet interface or via the management Host Channel Adapter (HCA), the firmware of the system of the example embodiment is able to authenticate configuration operations from other interfaces and/or other sources on the management Enet interface as well. Such configuration information is stored reliably and persistently by the firmware of the example embodiment.

The firmware in accordance with a further example embodiment may also have access to additional "a priori" persistent configuration information that allows the firmware to authenticate access from other interfaces/sources at initial deployment time. This could include public keys for vendor-specific management software etc. In addition, private keys used for authenticating the type and possible also the specific identity such as related to the hardware GUID of this vendor instance could be present as may be necessary or desired.

In accordance with the example embodiment, when port roles and virtual switches have been configured, the in-band management components such as for example the Subnet Manager (SM) and FGM instances, are able to discover their relevant portions of the local physical and/or virtual fabric using both legacy SMP-based subnet discovery methods as well as one or more vendor-specific SMP method(s).

In accordance with the example embodiment, each leaf subnet is preferably discovered and configured in parallel with other leaf subnets by independent SM instances.

In the core fabric(s), one or more "master" FGM instances may operate concurrently with, in general, one master FGM instance per core fabric instance.

Further, subnet managers in leaf-subnets preferably do not have any SMP access (read or write) outside their leaf-subnet, that is outside their forwarding domain. A legacy subnet manager in a leaf subnet will only be able to discover ordinary (virtual) switch ports and their local connectivity within the leaf subnet. A fabric-aware subnet manager in a leaf subnet is preferably able to discover gateway ports and the connectivity they represent, but is not be able to modify any configuration of the gateway ports. A fabric-aware subnet manager in a leaf subnet will by default preferably not be able to discover any remote port connectivity beyond a gateway port, nor any further hops, nor be able to modify any configuration information beyond a gateway port.

In the example embodiment, an FGM instance will by default be able to discover the complete local fabric. An FGM instance may avoid, by a configuration option for the FGM instance for example, or be prevented from, by access restrictions in remote virtual systems, performing any hop-by-hop DR SMP based discovery of the topology outside a local forwarding domain such as outside a specific core fabric instance, or outside the complete core fabric. Access restrictions may typically apply to different leaf subnets that has a different fabric level owner. In this case, the central FGM collects topology information from each core-fabric instance as well as topology information from each leaf subnet via the relevant subnet manager or FGM instances and uses this information to evaluate the optimized routing of the complete local fabric.

It is to be noted that, by default, full end-to-end connectivity within a local fabric will exist following a local routing of each forwarding domain where full connectivity is established between all end-ports in each leaf subnet, between all end ports and all gateway ports in each leaf subnet, and between each gateway port in each core fabric instance and, in particular, between any pair of leaf-subnet gateway ports.

Based on the above full connectivity, the central FGM can select end-to-end paths for all potential "pair of peers" in the local fabric based on combining a path in the source leaf subnet, a path in a relevant core fabric instance, if any, and the relevant path in the destination leaf subnet. The central FGM would need to ensure that any end-to-end path between the different leaf subnets is not representing any credit loop. However, credit loop avoidance will trivially be ensured as long as the following conditions are fulfilled: each leaf subnet represents a fat-tree where gateway ports to core fabric instances and/or other leaf subnets represents root switch nodes in the local leaf subnet, and each core fabric instance is routed with all leaf-subnet gateway ports as leaf nodes/ports within a regular fat-tree.

In accordance with the example embodiment, in order to ensure static optimization within the complete local fabric via dedicated or "primary" down-paths, the central FGM selects a path for the target leaf subnet that will use an egress gateway port in the root switch that represents the dedicated or "primary" down path for the destination node in the target leaf subnet. The information about root switch will in general be available from the master Subnet Manager (SM) within the leaf subnet. The master Subnet Manager (SM) in the leaf subnet has selected a root switch which may be a virtual switch or a complete physical instance of the system of the subject embodiment for the destination node as part of the local routing of the leaf subnet.

The selection of gateway port inherently also represents selection of a core fabric instance that currently has connectivity from the source leaf subnet and that represents a "reasonable" balancing of inter leaf subnet traffic at this point in time.

The central FGM then selects an ingress gateway port from the source leaf subnet to the selected core fabric instance, and an ISRN value that represents the primary path for the selected destination egress gateway port in the selected core fabric instance.

The selection of ingress gateway port to the core fabric instance also represents a "reasonable" balancing of the inter-leaf subnet traffic at this point in time.

In accordance with the example embodiment, the path from the source port in the source leaf subnet to the selected ingress gateway port to the selected core fabric instance is defined by the master Subnet Manager (SM) in the source leaf subnet. This path is preferably constructed by the master Subnet Manager (SM) without any knowledge about potential use for inter leaf subnet traffic. The central FGM can then construct the complete path based on combining the information from the master Subnet Manager in both the source and the target leaf subnet with the selected ISRN value for the selected core fabric instance.

In addition to the pure route information defined by the LID and ISRN values, the central FGM will also obtain SL values from each involved master Subnet Manager, and then also select Traffic Class and Flow Label to reflect SL/VL selection within the core fabric and SL selection upon entering of the target leaf subnet.

It is to be noted that in the simplest default case, a single SL value can be selected that will be preserved throughout the complete local fabric and with consistent mapping to a fixed VL in all forwarding domains such as for example in the same way as for a legacy single subnet fat-tree topology.

It is to be further noted that, unlike a conventional single subnet fabric where a DLID represents a final destination, and where the same DLID can be re-routed to use different routes through the fabric as a consequence of various link and/or switch failures within the fabric, the DLID-ISRN-DLID based end-to-end path within a fabric may need to be updated as a result of failures as long as there is not a coordinated re-routing of the DLIDs for ingress gateway ports from the source subnet to the core fabric, as well as the ISRN value representing the egress gateway port from the core fabric instance to the destination leaf subnet. Hence, in the example embodiment, if a gateway port is no longer available, then either a re-routing is performed of the relevant DLID or ISRN value to represent an alternative gateway port that can provide equivalent forward connectivity, or an update is performed of path information for impacted flows/communication peers.

Also in the example embodiment, in order to perform re-balancing of overall inter leaf-subnet paths, the central FGM selectively generates new path information for one or more flows and notifies the involved peers, or orchestrates an end-to-end re-routing of the current DLID-ISRN-DLID based path involving all related master subnet Managers and FGM instances.

Maintaining a Global Overview of Physical and Virtual Node Population:

In accordance with the example embodiment, the physical and virtual end-nodes in each leaf subnet are discovered and configured by the local master Subnet Manager (SM). Each master Subnet Manager will notify the central FGM about its local node population by queries and events. For core fabrics with communicating end-nodes including physical and virtual management servers as well as switch management ports, the relevant FGM instance keeps track of or otherwise maintains information relating to the population in the same way as the master SMs in the leaf subnets. The central FGM will thereby be able to keep track of the whereabouts of any end-node based on GUID, and hence be able to construct the relevant path information for any required communication.

In general, VM migration within a single leaf-subnet is handled locally within the leaf-subnet, but any change of routing or path information is communicated to the central FGM instance. VM migration across leaf-subnet boundaries will in general be coordinated via the central FGM.

It is to be noted the central FGM is in general responsible for coordination of vGUID and P_Key value ranges across the various leaf subnet and core fabric instance boundaries. Hence, any value allocation within any forwarding domain that is not in synchronism with the current global policy will not be allowed to become visible outside the relevant forwarding domain, nor have any negative impact on other forwarding domains.

Virtual Machine (VM) Migration:

In accordance with the example embodiment, virtual machine (VM) migration within a single leaf subnet can take place without any change of address information as long as unique DLID values are used to denote the virtual HCA ports the VM is representing.

Whenever a VM is migrated out of a leaf subnet, then in general, the addressing information is updated for all peers in the original leaf subnet that have been using LRH only (i.e. no GRH) based addressing to reach the VM, since use of GRH now becomes required. Likewise, whenever a VM is migrated out of a leaf subnet, then the addressing information is updated for all peers in other forwarding domains currently using GRH/ISRN based addressing. This is the case as long as it is not possible to preserve the VMs LID value used in the original subnet in addition to perform a re-routing of both the DLID for the initial core-fabric gateway port as well as the ISRN value for the subsequent leaf-subnet gateway port.

In accordance with a further example embodiment, using TCAM based forwarding and LRH generation via virtual router ports in the system instances that directly connects the new leaf subnet a VM is migrated to, it is possible to have an intermediate state where the LID for the initial core fabric gateway port as well as the ISRN value for the subsequent leaf subnet gateway port has been re-routed to provide forwarding to the relevant virtual router port, the virtual router port could do the generation of the final LRH with the new DLID so that the complete old addressing information would be valid following the migration.

The above scheme can be combined as necessary or desired with a "lazy" scheme for updating address information for all relevant peers, and both old (original) and new address information is could then be valid for the VM concurrently. When it has been confirmed for example by the central FGM that no peer no longer depends on the old address information, the old address information can be "recycled".

This scheme assumes that at least the original ISRN value is allocated exclusively for the VM (i.e. not for the leaf-subnet gateway port as such) so that it can be re-routed without causing conflicts for other destinations using the same ISRN value for the intermediate core fabric path.

In the case where VM migration occurs in a way that requires that a new core fabric instance has to be used to reach the VM after migration, then the same constraint exists for the DLID values used to address the core fabric gateway port in all communicating leaf subnets.

As special case here is the communication peers inside the original leaf subnet. - As long as these peers have been instructed to use GRH/ISRN based addressing in the first place, the VM migration can be handled transparently based on re-routing the original DLID and ISRN values (i.e. initially the original LRH.DLID will have pointed to the VM directly, but after migration, this will have been updated to point to the relevant core-fabric gateway port.

From the perspective of a VM that is being migrated out of a leaf subnet instance, it will in general have to update address information for all its communication peers since the first hop addressing in particular will not be the same in different leaf subnets. This is independent of all the enhancements to achieve address transparency for the communication peers outlined in the section above.

It is to be noted that, in all cases above, the assumption is that FLSN checking is not enabled or that migration only takes place between leaf subnet instances with the same FLSN value, or that the system implementation allows some number of FLSN values to be associated with each port as described above so that a few migrations with conflicting FLSN values can be handled at any point in time, that is until all peers have updated the address information as described above.

Hardware Support for the Leaf-Subnet/Core-Fabric Model:

Within a single leaf subnet, the system of the example embodiment implements the LRH.DLID based packet forwarding using Linear Forwarding Tables (LFTs) according to the InfiniBand (IB) Specification. By default, each virtual switch has an LFT that supports the full 48K unicast DLID space as well as a multicast forwarding table that supports the full 16K multicast DLID space. As long as the POR for the system is to have private unicast and multicast LFTs that is/are shared by pairs of physical ports, the minimum granularity for configuring virtual switch port membership is the groups of two ports sharing LFTs. Then with enhanced SM and FGM routing logic, multiple independent LFTs per virtual switch may be supported. However, as long as LFTs are shared by more than one physical port, the dependency is that the actual physical topology lends itself to handling of multiple independent LFTs.

It is to be noted that, the sharing of LFTs between physical ports has impact for how grouping of ports per cable connector (if more than 4x), as well as how the cabled physical connectivity of a large local fabric should look like in order for utilization of more than one LFT per virtual switch to be beneficial. Also, using various proprietary or pre-standard techniques, embodiments of the subject system could potentially expand the LRH.DLID unicast space beyond 48K.

In order to identify the boundary between forwarding domains such as for example between different leaf subnets and/or core fabric instances, the system of the example embodiment implements a set of features described below.

First, from within a leaf subnet, any core fabric gateway port is identified by one or more DLIDs so that forwarding takes place using normal LRH.DLID based lookup. In order to identify that a looked up output port represents a core fabric gateway port that requires a change in addressing mode from LRH/DLID (based on the original LRH) to GRH/ISRN information is provided that allows this change in mode to be determined before the packet is reaching the egress link in the output port. In order to avoid packet stalling, this information is made available as early as possible after the packet has been received at the ingress port, and the new LRH is made ready and well-defined once the arbiter allows the packet to be forwarded to the output port. Hence, the information is available along with the lookup of output port in the ingress port. Further, in order to allow the same output port to have more than one "personality" depending on which other local system port is sending the packet to it across the crossbar, having the type of output port available via registers associated with each input port is the most flexible scheme. This both saves space relative to have the port type encoded in the LFT entry, and it provides flexibility and no need for access arbitration relative to both shared LFT entries as well as relative to using a centralized approach where the type of output port is defined once for the whole chip. The hardware support for constructing the new packet with the new addressing mode includes generation of a fixed LRH.DLID based on an internal register, as well as logic to identify and extract the correct ISRN bit field from the GRH.

Second, within a core fabric instance, the identification of GRH/ISRN forwarding mode in an ingress port is based on matching the incoming LRH.DLID value with the contents of an internal register. Then, if the packet LRH.DLID value matches the value contained in the register, forwarding mode is the "GRH/ISRN" forwarding mode of the example embodiment. Otherwise, if the packet LRH.DLID value does not match the value contained in the register, the forwarding mode is the InfiniBand (IB) legacy "LRH/DLID" forwarding mode.

In the example embodiment, for performance and flexibility, this register is preferably replicated for all ports. This implies that it is also possible to have a leaf subnet virtual switch instance where the Subnet Manager (SM) is not aware of this system feature, but without reducing the available LFT size within that leaf subnet. From within a core fabric instance, the route towards a gateway port (or end port) is defined by the ISRN value that is used to look up the output port from the LFTs of each of the "in-route" system ingress ports.

In order to determine that the output port is a gateway to the destination leaf subnet, the straight forward solution of the example embodiment is to compare the packet FLSN number with the FLSN number(s) associated with the looked up output port. However, in order to identify the required change in addressing mode while still allowing the ingress port to operate in more than one mode, it is sufficient for the ingress port to have a flag per possible output port that tells if the output port represents a change in addressing mode or that the output port does not represent a change in addressing mode. Hence, if the ingress forwarding mode is GRH/ISRN, and the output port is flagged as representing change in addressing mode (i.e. relative to this ingress port), then the addressing mode can deterministically be changed to LRH/DLID based on the DLID value contained in the GRH.DGID.prefix.dlid. It is to be noted that in this case, matching the FLSN value would just represent an additional integrity check as long as the ISRN based routing within the core fabric instance is correct.

The HW support for constructing the new packet with the new addressing mode includes logic to identify and extract the correct DLID bit field from the GRH, as well as generation of the new LRH based on the extracted DLID value.

Third, when two leaf subnets are directly connected by different virtual switches on the same system instance, there is typically a mutual leaf-subnet gateway port relationship between the ports in the two virtual switches. Hence, from within leaf subnet A, there will be one or more DLID values that identifies a specific leaf subnet gateway port providing direct connectivity to leaf subnet B. Then in order to determine that the output port is a gateway to the destination leaf subnet, the straight forward solution of the example embodiment is to compare the packet FLSN number with the FLSN number(s) associated with the looked up output port. However, in order to identify the required change in addressing mode while still allowing the ingress port to operate in more than one mode, it is sufficient for the ingress port to have a flag per possible output port that indicates whether the output port represents a change in addressing mode or whether the output port does not represent a change in addressing mode such as for the cases above.

Still, in the case where the change in addressing mode can be either LRH/DLID to GRH/ISRN or LRH/DLID to LRH/DLID (i.e. as in this example), it is not sufficient to have only a single flag value per output port. Hence, the per output port flags preferably identify the type of gateway port, and not just change of addressing mode. Again, however, using FLSN matching is an alternative, but this is still primarily an integrity check as long as the forwarding between leaf subnet instances is correctly implemented.

Hardware Support for the Leaf-Subnet/Core-Fabric Model:

In order to support an arbitrary number of incoming DGID.subnetprefix values but still allow DGID.GUID values to be verified for a target physical or virtual HCA port, an embodiment includes a mode wherein checking incoming GRH.DGID against the hardware and alias GID values for a physical or virtual HCA port is restricted to the GUID portion only and the subnet prefix portion is ignored.

In principle, this mode could be specified individually for each GID table entry. However, from a HW implementation perspective, it may be difficult to have an associative match against several table entries and then also have multiple matches based on different matching criteria. Hence, a mode where the check is always done for only the GUID part is sufficient.

The assumption is then that each virtual HCA port is set up with two or more GID table entries that are unique also when only the GUID part is considered. The normal or default case is that the relevant hwGUID is present along with a vGUID that represents the currently active VM. The two corresponding GID table entries will each have a subnet prefix value based on the assigned ISN value.

Method for Using Subnet Prefix Values in (GRH) for (LFT) Lookup

Figure 16:
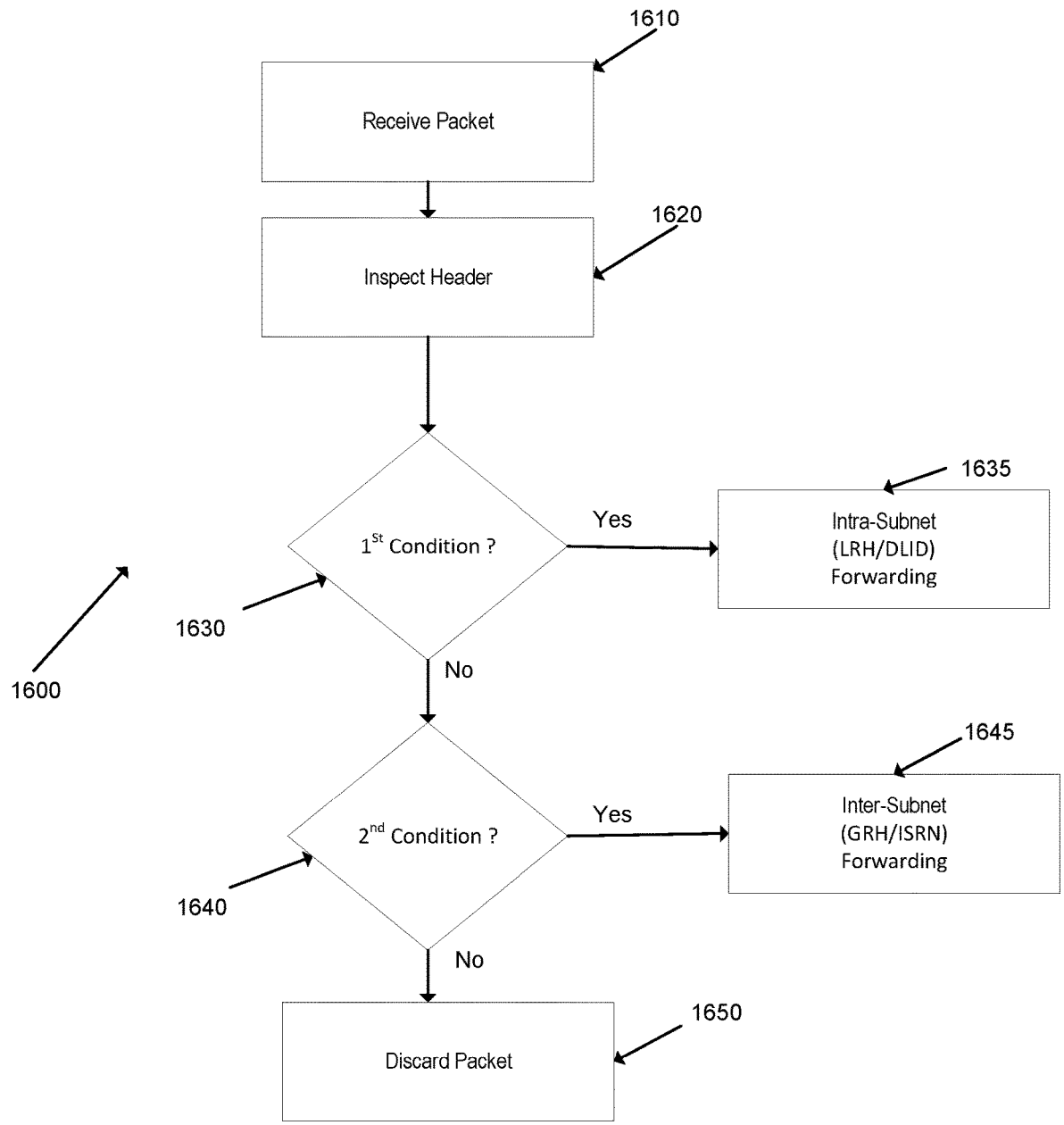
FIG. 16 is a flowchart for a method for using packet headers for linear forwarding table lookup for both intra- and inter-subnet forwarding, in accordance with an embodiment.

FIG. 16 illustrates a method 1600 in accordance with an embodiment for using packet headers for linear forwarding table lookup in a network switch environment in a high performance computing environment. The method of the figure will now be described. First and second subnets are provided at a computer environment including a network fabric. The first subnet is different than the second subnet. The first subnet comprises a first set of network switches wherein each of the first set of network switches includes a linear forwarding table (LFT) and a plurality of physical ports. The second subnet comprises a second set of network switches wherein each of the second set of network switches includes an LFT and a plurality of physical ports. This is the environment of the example embodiment of the method. Overall, the method 1600 allows a same first LFT of a first network switch of the first set of network switches to be used for both intra-subnet forwarding decisions of packets to be forwarded between ones of the first set of network switches of the first subnet, and inter-subnet forwarding decisions of the packets to be forwarded between the first and second sets of network switches of the first and second subnets, respectively.

In a first step 1610, a first packet is received at the first network switch of the first set of network switches of the first subnet. A first portion of a header of the first packet is inspected at step 1620. A first condition of the first portion of the header of the first packet is determined at step 1630, and a second condition of the first portion of the header of the first packet is determined at step 1640.

The intra-subnet forwarding decision is selectively made at step 1630 when the first portion of the header of the first packet is determined to have or otherwise exhibit the first condition. Otherwise, when the first portion of the header of the first packet is determined to not have or otherwise exhibit the first condition, the method continues to the inter-subnet forwarding decision step 1640.

When the intra-subnet forwarding decision is selectively made at step 1630 when the first portion of the header of the first packet is determined to have or otherwise exhibit the first condition, the packet is handled at step 1635 using intra-subnet (LRH/DLID) forwarding in accordance with an example embodiment.

Similarly, when the inter-subnet forwarding decision is selectively made at step 1640 when the first portion of the header of the first packet is determined to have or otherwise exhibit the second condition, the packet is handled at step 1645 using intra-subnet (GRH/ISRN) forwarding in accordance with an example embodiment.

At step 1650, the inter-subnet forwarding decision is selectively made using the first LFT of the first network switch in accordance with a second condition of the first portion of the header of the first packet for routing the first packet to a selected one of the set of second network switches of the second subnet.

In the example embodiment, the inspecting the first portion of the header of the first packet comprises inspecting a local route header (LRH) portion of the header of the first packet. Further in accordance with the example embodiment, the determining the condition of the first portion of the header of the first packet comprises comparing a selected portion of the LRH relative to a predetermined value stored at the first network switch, and determining the first condition in accordance with a mis-match between the selected portion of the LRH and the predetermined value, or determining the second condition in accordance with a match between the selected portion of the LRH and the predetermined value.

Further in the example embodiment, the determining the second condition in accordance with a match between the selected portion of the LRH and the predetermined value includes a step of using the LFT to index a Special Switch Port (SSP) using the selected portion of the LRH.

In particular with regard to the example embodiment, the routing of the first packet to a selected one of the set of second network switches of the second subnet includes selecting a section of a global route header (GRH) portion of the header of the first packet, the selected section of the GRH portion of the header storing an Inter-Subnet-Route-Number (ISRN), using the ISRN of the GRH to index the first LFT of the first network switch, and routing the first packet to the selected one of the set of second network switches of the second subnet in accordance with the indexing the first LFT using the ISRN of the GRH, wherein the second subnet is an intermediate core fabric of the network switch environment.

Further in accordance with the example embodiment, when neither the first nor second conditions of the first portion of the header of the first packet are determined at steps 1630 and 1640, the packet is discarded at step 1650.

Figure 17:
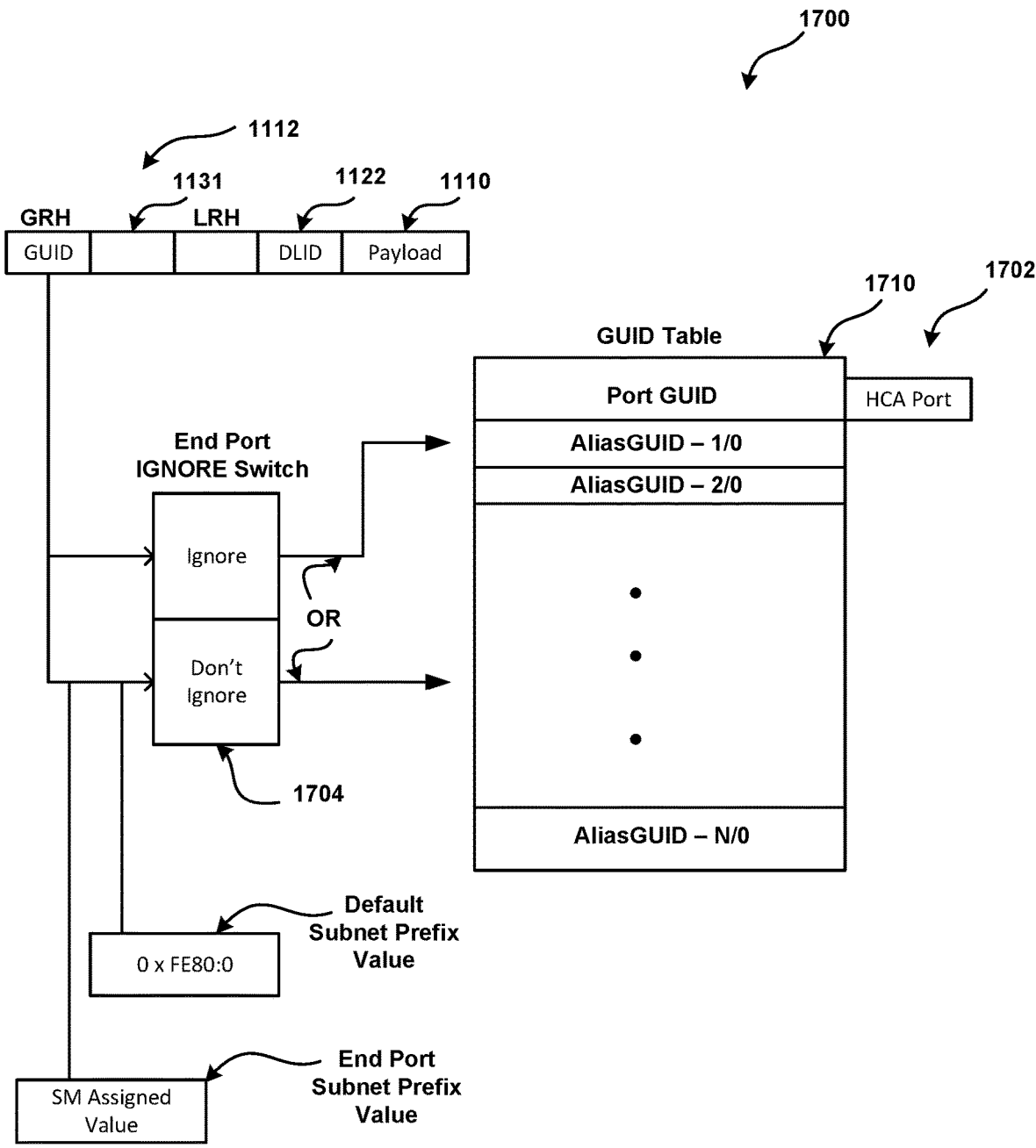
FIG. 17 is an illustration of a switch providing a mechanism for allowing multiple GID subnet prefix values concurrently for incoming IB packets, in accordance with an embodiment.

FIG. 17 is an illustration of a HCA providing a mechanism for allowing multiple GID subnet prefix values concurrently for incoming IB packets, in accordance with an embodiment. A system 1700 is illustrated for using multiple global identification subnet prefix values in a network HCA environment in a high performance computing environment. As illustrated, the system 1700 of the example embodiment is operable and otherwise includes a first subnet in an associated computer environment including a network fabric. The first subnet includes a first network HCA wherein the first network HCA further includes at least one port (i.e. either a physical or a virtual HCA port) 1702 operatively coupled with at least one PortGUID and optionally with one or more AliasGUIDs. A non-transient memory device stores a first flag 1704 and a first end port table 1710. In an example embodiment, the first flag comprises the header portion of the first packet. The first end port table 1710 includes a plurality of alias identification entries AliasGUID-1/0—AliasGUID-N/0. Each of the plurality of alias identification entries may comprise a Global Unique Identifier (GUID) value identifying a logical end port address identifier for the associated end port. Logic is provided by the HCA, wherein a first packet 1112 is received from the network fabric by the first network switch. The first packet 1112 comprises a header portion 1131 including a destination subnet prefix GRH identifying a destination subnet of the network fabric.

In the example embodiment, the first network HCA is allowed to receive the first packet from a first physical port of the first network HCA by selectively determining a logical state of the first flag 1704 and, selectively in accordance with a first logical state TRUE of the first flag 1704 ignoring the destination subnet prefix identifying the destination subnet of the network fabric, inspecting a Global Routing Header (GRH) portion of the first packet to determine a destination Global Unique Identifier (Dest GUID), comparing the Dest GUID with the plurality of GUID values stored in the first end port GUID table, and accepting the first packet if one of the end port GUID table entries contains a GUID value matching the Dest GUID.

Further in the example embodiment, the first network HCA is allowed to receive the first packet from a first port, selectively in accordance with a second logical state FALSE of the first flag 1704, inspecting the destination subnet prefix portion of the first packet to determine a correspondence between the destination subnet prefix and one or more of: a default subnet prefix value, and/or an assigned subnet prefix value, and selectively accepting the first packet based on it having a DGID value matching the one or more of the a default subnet prefix value and/or the assigned subnet prefix value as well as one of the GUID values in the corresponding end port GUID table.

The system of the example embodiment is further allowed to receive the first packet from the first port of the first network HCA by, selectively in accordance with the second logical state FALSE of the first flag 1704, inspecting the Global Routing Header (GRH) portion of the first packet to determine a destination Global Unique Identifier (Dest GUID), comparing the Dest GUID with the plurality of GUID values stored in the first end port table, and accepting the first packet to a physical port of the first network switch having a GUID value matching the Dest GUID.

The system of the example embodiment may receive from the network fabric a first packet comprising a header portion including a destination subnet prefix identifying a second subnet of the network fabric, wherein the second subnet is different than the first subnet.

The logic is executed by the processor to selectively determining whether the subnet prefix value is to be ignored or is to not be ignored. In this way, the HCA implementation of the example embodiment is able to support both dynamic updates if the subnet prefix as well as the use of multiple prefix values to represent multiple paths through the fabric as well as dynamic updates of such path without impacting existing data connections and/or flows. The concept is that the "ignore flag" is policy information in HCA memory/register. This flag is consulted every time a packet is received in order to determine how to handle the DGID in packets with GRH. Hence, the state of the flag determines the handling of incoming packets with GRH, but the state of the flag itself is not defined by incoming packets and the state (i.e. the current policy) is not defined by the header portion of an incoming packet.

The system of the example embodiment receives the assigned subnet prefix value from a local Subnet Manager (SM) of the first subnet. The received assigned subnet prefix value is compared with the destination subnet prefix of the first packet.

Figure 18:
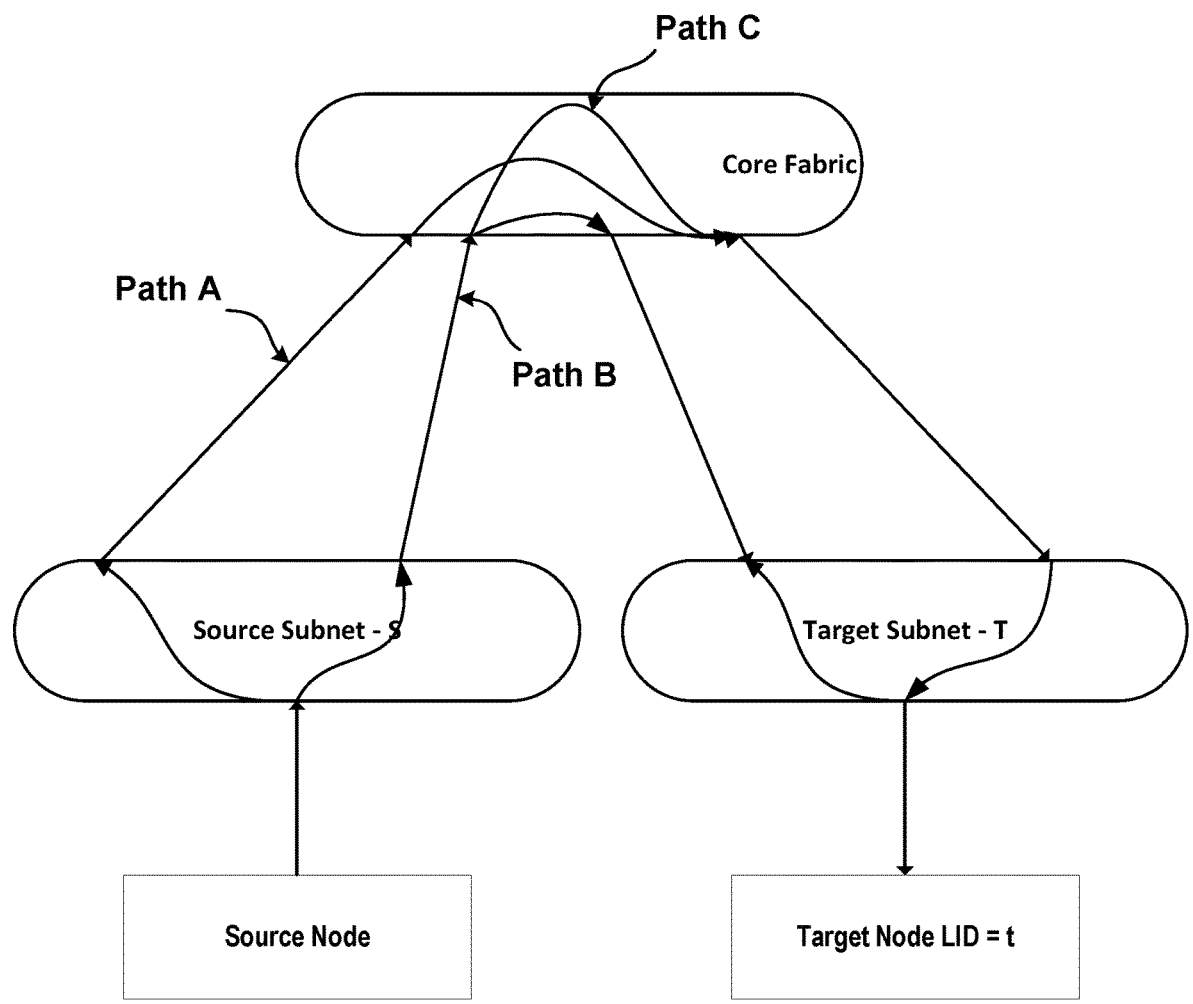
FIG. 18 shows an illustration of forwarding domains and forwarding paths in accordance with an embodiment.

FIG. 18 shows an illustration of forwarding domains and forwarding paths in accordance with an embodiment. By extending the ability to accept both the default subnet prefix as well as single assigned prefix value with the ability to totally ignore the subnet prefix value, a HCA implementation would be able to support both dynamic updates of the subnet prefix as well as the use of multiple prefix values to represent multiple paths through the fabric as well as dynamic updates of such paths without impacting existing data connections/flows.

This flexible scheme would depend on relevant router ports representing ingress paths to the local subnet to control that incoming subnet prefix values are acceptable for the local subnet.

The assignment of GUIDs to end-nodes in the various subnets could either have a subnet local scope, or it could be based on always using globally unique EUI-64 values. In the first (local scope) case, the uniqueness of a DGID would depend on that the subnet prefix values are not the same for two identical destination GUIDs, whereas in the second case, there would be no dependency on the prefix to uniquely identify the relevant destination port.

Figure 19:
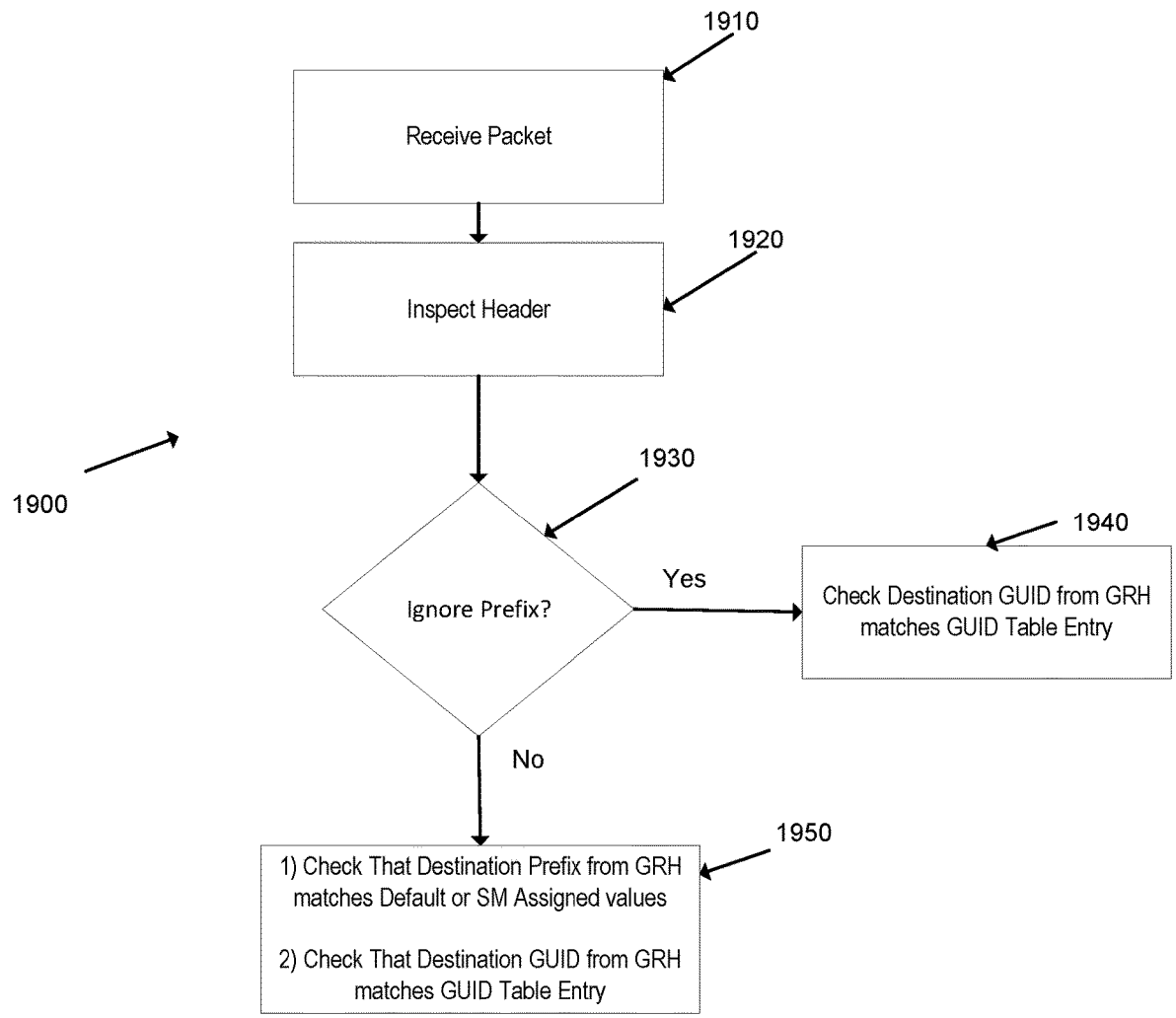
FIG. 19 is a flowchart for a method for allowing multiple GID subnet prefix values concurrently for incoming IB packets, in accordance with an embodiment.

FIG. 19 is a flowchart for a method 1900 for allowing multiple GID subnet prefix values concurrently for incoming IB packets, in accordance with an embodiment. A packet is received at step 1920 and the header is inspected at step 1920. The flag 1704 is inspected at step 1930. In accordance with a first logical state TRUE of the flag 1704, the destination prefix value contained in the packet header is ignored in step 1940. There, the method 1900 checks at step 1940 whether the destination GUID from the GRH matches any of the GUID table entries in the table 1710.

In accordance with a second logical state FALSE of the flag 1704, the destination prefix value contained in the packet header is not ignored in step 1950 but rather it is used. There, the method 1900 checks at step 1950 whether the destination prefix from the GRH matches one or both of a Default subnet prefix value or an Assigned prefix value such as might be assigned by a local Subnet Manager (SM) for example. The method 1900 further checks at step 1950 whether the destination GUID from the GRH matches any of the GUID table entries in the table 1710.

As described, therefore, a method 1900 uses multiple global identification subnet prefix values in a network HCA environment in a high performance computing environment. The method 1900 providing, at a computer environment including a network fabric, a first subnet, the first subnet comprising a first network HCA wherein the first network HCA comprises a plurality of ports operatively coupled with a plurality of associated end port GUID tables and a non-transient memory device storing a first flag and a first end port GUID table.

The method at step 1910 receives from the network fabric by the first network HCA a first packet comprising a header portion including a destination subnet prefix identifying a destination subnet of the network fabric. The packet header is inspected at step 1920. The logical state of the flag is determined at step 1930.

The first network HCA is allowed to receive the first packet from a first port of the first network HCA by, selectively in accordance with a first logical state of the first flag: ignoring the destination subnet prefix identifying the destination subnet of the network fabric; inspecting a Global Routing Header (GRH) portion of the first packet to determine a destination Global Unique Identifier (Dest GUID); comparing the Dest GUID with the plurality of GUID values stored in the port GUID table; and accepting the first packet depending on the existence of an entry in the port GUID table containing a GUID value matching the Dest GUID.

The first network HCA is allowed to receive the first packet from a first port of the first network HCA by, selectively in accordance with a second logical state of the first flag: inspecting the destination subnet prefix portion of the first packet to determine a correspondence between the destination subnet prefix and one or more of: a default subnet prefix value, and/or an assigned subnet prefix value, and selectively accepting the first packet based on the port of the first network HCA having an end port GUID table entry with a value matching the Dest GUID of the first packet.

Features of the example embodiments can be implemented in, using, or with the assistance of a computer program product which is a storage medium (media) or computer readable medium (media) having instructions stored thereon/in which can be used to program a processing system to perform any of the features presented herein. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

Stored on any one of the machine readable medium (media), features of the example embodiments can be incorporated in software and/or firmware for controlling the hardware of a processing system, and for enabling a processing system to interact with other mechanism utilizing the results of the example embodiments. Such software or firmware may include, but is not limited to, application code, device drivers, operating systems and execution environments/containers.

Features of the example embodiment may also be implemented in hardware using, for example, hardware components such as application specific integrated circuits (ASICs). Implementation of the hardware state machine so as to perform the functions described herein will be apparent to persons skilled in the relevant art.

Additionally, example embodiments may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

While various embodiments have been described above, it should be understood that they have been presented by way of example, and not limitation. It will be apparent to persons skilled in the relevant art that various changes in form and detail can be made therein without departing from the spirit and scope of the invention.

The example embodiments have been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the claimed invention.

The foregoing description of example embodiments have been provided for the purposes of illustration and description. It is not intended to be exhaustive or to limit the invention to the precise forms disclosed. The breadth and scope of the example embodiments should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the claimed invention and its practical application, thereby enabling others skilled in the art to understand the claimed invention for various embodiments and with various modifications that are suited to the particular use contemplated. It is intended that the scope of the claimed invention be defined by the following claims and their equivalents.

What is claimed is:

1. A method for using a global identification subnet prefix value in a network environment in a high performance computing environment, the method comprising:
   providing a first local subnet within a network fabric in the high performance computing environment, the first local subnet connected to a second subnet, the first and second subnets being different;
   receiving, at a switch of the first subnet, a packet, the received packet comprising a header comprising a local route header portion indicating a destination address;
   selectively routing, based on a condition of the local route leader portion of the received packet, the received packet to one of a node within the first subnet or a node of the second subnet, the selectively routing comprising:
   upon determining that the condition does not match a pre-determined value stored at the switch, routing the received packet to the node within the first subnet, and
   upon determining that the condition matches the pre-determined value stored at the switch, routing the received packet to the node of the second subnet.

2. The method of claim 1,
wherein routing the received packet to the node of the second subnet comprises:
   identifying, within a global route header portion of the header of the received packet, an identifier of the second subnet.

3. The method of claim 2,
wherein routing the received packet to the node of the second subnet further comprises:
   indexing a linear forwarding table of the switch of the first subnet by the identifier of the second subnet, and
   routing the received packet based upon the indexing of the linear forwarding table of the switch of the first subnet by the identifier of the second subnet.

4. The method of claim 3,
wherein the identifier of the second subnet comprises an Inter-Subnet-Route-Number of the second subnet stored in a global route header portion of the header of the received packet.

5. The method of claim 4,
wherein the received packet is routed to the second subnet via a special switch port, the special switch port representing a boundary condition of the first subnet.

6. The method of claim 1,
wherein routing the received packet to the node of the second subnet comprises:
   identifying, within a global route header portion of the header of the received packet, an globally unique identifier (GUID) of the node of the second subnet.

7. The method of claim 6,
wherein routing the received packet to the node of the second subnet further comprises:
   comparing the GUID of the node of the second subnet with table of a plurality of GUIDs stored at the switch of the first subnet; and
   upon finding the GUID of the node of the second subnet within the table of the plurality of GUIDs stored at switch of the first subnet, routing the received packet based upon the GUID of the node of the second subnet.

8. A system for using a global identification subnet prefix value in a network environment in a high-performance computing environment, comprising:
   a computer comprising one or more processors;
   a first local subnet within a network fabric in the high-performance computing environment, the first local subnet connected to a second subnet, the first and second subnets being different;

wherein a packet is received at a switch of the first subnet, the received packet comprising a header comprising a local route header portion indicating a destination address;

wherein the received packet is selectively routing, based on a condition of the local route leader portion of the received packet, to one of a node within the first subnet or a node of the second subnet, the selectively routing comprising:

upon determining that the condition does not match a pre-determined value stored at the switch, routing the received packet to the node within the first subnet, and upon determining that the condition matches the pre-determined value stored at the switch, routing the received packet to the node of the second subnet.

9. The system of claim 8,
wherein routing the received packet to the node of the second subnet comprises:
identifying, within a global route header portion of the header of the received packet, an identifier of the second subnet.

10. The system of claim 9,
wherein routing the received packet to the node of the second subnet further comprises:
indexing a linear forwarding table of the switch of the first subnet by the identifier of the second subnet, and
routing the received packet based upon the indexing of the linear forwarding table of the switch of the first subnet by the identifier of the second subnet.

11. The system of claim 10,
wherein the identifier of the second subnet comprises an Inter-Subnet-Route-Number of the second subnet stored in a global route header portion of the header of the received packet.

12. The system of claim 11,
wherein the received packet is routed to the second subnet via a special switch port, the special switch port representing a boundary condition of the first subnet.

13. The system of claim 8,
wherein routing the received packet to the node of the second subnet comprises:
identifying, within a global route header portion of the header of the received packet, an globally unique identifier (GUID) of the node of the second subnet.

14. The system of claim 13,
wherein routing the received packet to the node of the second subnet further comprises:
comparing the GUID of the node of the second subnet with table of a plurality of GUIDs stored at the switch of the first subnet; and
upon finding the GUID of the node of the second subnet within the table of the plurality of GUIDs stored at switch of the first subnet, routing the received packet based upon the GUID of the node of the second subnet.

15. A non-transitory computer readable storage medium having instructions thereon for using a global identification subnet prefix value in a network environment in a high performance computing environment, which when read and executed cause a computer to perform steps comprising:
providing a first local subnet within a network fabric in the high performance computing environment, the first local subnet connected to a second subnet, the first and second subnets being different;
receiving, at a switch of the first subnet, a packet, the received packet comprising a header comprising a local route header portion indicating a destination address;
selectively routing, based on a condition of the local route leader portion of the received packet, the received packet to one of a node within the first subnet or a node of the second subnet, the selectively routing comprising:
upon determining that the condition does not match a pre-determined value stored at the switch, routing the received packet to the node within the first subnet, and
upon determining that the condition matches the pre-determined value stored at the switch, routing the received packet to the node of the second subnet.

16. The non-transitory computer readable storage medium of claim 15,
wherein routing the received packet to the node of the second subnet comprises:
identifying, within a global route header portion of the header of the received packet, an identifier of the second subnet.

17. The non-transitory computer readable storage medium of claim 16,
wherein routing the received packet to the node of the second subnet further comprises:
indexing a linear forwarding table of the switch of the first subnet by the identifier of the second subnet, and
routing the received packet based upon the indexing of the linear forwarding table of the switch of the first subnet by the identifier of the second subnet.

18. The non-transitory computer readable storage medium of claim 17,
wherein the identifier of the second subnet comprises an Inter-Subnet-Route-Number of the second subnet stored in a global route header portion of the header of the received packet.

19. The non-transitory computer readable storage medium of claim 18,
wherein the received packet is routed to the second subnet via a special switch port, the special switch port representing a boundary condition of the first subnet.

20. The non-transitory computer readable storage medium of claim 15,
wherein routing the received packet to the node of the second subnet comprises:
identifying, within a global route header portion of the header of the received packet, an globally unique identifier (GUID) of the node of the second subnet;
comparing the GUID of the node of the second subnet with table of a plurality of GUIDs stored at the switch of the first subnet; and
upon finding the GUID of the node of the second subnet within the table of the plurality of GUIDs stored at switch of the first subnet, routing the received packet based upon the GUID of the node of the second subnet.

* * * * *

UNITED STATES PATENT AND TRADEMARK OFFICE
CERTIFICATE OF CORRECTION

PATENT NO. : 11,824,749 B2  
APPLICATION NO. : 17/520273  
DATED : November 21, 2023  
INVENTOR(S) : Johnsen et al.

Page 1 of 2

It is certified that error appears in the above-identified patent and that said Letters Patent is hereby corrected as shown below:

On the Title Page

On page 2, Column 2, item [56], Line 7, delete "Unkown," and insert -- Unknown, --, therefor.

In the Specification

In Column 1, Line 18, Delete "Jan. 13, 2020," and insert -- Jan. 31, 2020, --, therefor.

In Column 3, Line 37, Delete "embodiment" and insert -- embodiment. --, therefor.

In Column 17, Line 35, Delete "Manacled" and insert -- Manager) --, therefor.

In Column 20, Line 63, Delete "GUIDs" and insert -- GUIDs. --, therefor.

In Column 23, Line 37, Delete ""0x FF"" and insert -- "0xFF" --, therefor.

In Column 28, Line 34, Delete "i.e." and insert -- (i.e., --, therefor.

In Column 30, Line 35-36, Delete "DLI D." and insert -- DLID. --, therefor.

In Column 38, Line 53, Delete "P Key" and insert -- P_Key --, therefor.

In Column 39, Line 8, Delete "P Key" and insert -- P_Key --, therefor.

In Column 49, Line 5, Delete "the a" and insert -- a --, therefor.

In the Claims

In Column 52, Line 7, In Claim 1, delete "leader" and insert -- header --, therefor.

Signed and Sealed this  
Eleventh Day of June, 2024

Katherine Kelly Vidal  
*Director of the United States Patent and Trademark Office*

In Column 53, Line 6, In Claim 8, delete "leader" and insert -- header --, therefor.

In Column 54, Line 7, In Claim 15, delete "leader" and insert -- header --, therefor.